United States Patent
Fujiwara et al.

(10) Patent No.: US 8,230,292 B2
(45) Date of Patent: Jul. 24, 2012

(54) METHOD AND APPARATUS FOR CORRECTING AND DETECTING MULTIPLE SPOTTY-BYTE ERRORS WITHIN A BYTE OCCURRED IN A LIMITED NUMBER OF BYTES

(75) Inventors: Eiji Fujiwara, Tokyo (JP); Kazuyoshi Suzuki, Tokyo (JP); Toshihiko Kashiyama, Tokyo (JP); Satoshi Ichikawa, Ibaraki (JP)

(73) Assignees: Tokyo Institute of Technology, Tokyo (JP); Japan Aerospace Exploration Agency, Tokyo (JP)

( * ) Notice: Subject to any disclaimer, the term of this patent is extended or adjusted under 35 U.S.C. 154(b) by 1287 days.

(21) Appl. No.: 11/817,758

(22) PCT Filed: Dec. 16, 2005

(86) PCT No.: PCT/JP2005/023545
§ 371 (c)(1),
(2), (4) Date: Nov. 14, 2007

(87) PCT Pub. No.: WO2006/095489
PCT Pub. Date: Sep. 14, 2006

(65) Prior Publication Data
US 2009/0106633 A1  Apr. 23, 2009

(30) Foreign Application Priority Data
Mar. 4, 2005  (JP) .................................. 2005-060818

(51) Int. Cl.
*H03M 13/00* (2006.01)
(52) U.S. Cl. ........................................ 714/752; 714/758
(58) Field of Classification Search .................. 714/752, 714/758
See application file for complete search history.

(56) References Cited

FOREIGN PATENT DOCUMENTS

| | | |
|---|---|---|
| JP | 2002-374175 A | 12/2002 |
| JP | 2004-7217 A | 1/2004 |
| JP | 2005-176244 A | 6/2005 |

(Continued)

OTHER PUBLICATIONS

Umanesan et al. A class of random multiple bits in a byte error correcting and single byte error detecting (St/bEC-SbED) codes, Jul. 2003, IEEE transactions on computers, vol. 52, No. 7 pp. 835-847.*

(Continued)

*Primary Examiner* — Sam Rizk
(74) *Attorney, Agent, or Firm* — Sughrue Mion, PLLC

(57) ABSTRACT

An apparatus for correcting and detecting multiple spotty-byte errors within a byte occurred in a limited number of bytes and which has a function capable of controlling multiple spotty-byte errors within a byte occurred in the limited number of bytes, is provided.

The apparatus for correcting and detecting multiple spotty-byte errors within a byte occurred in a limited number of bytes, comprises an encoding means for generating a transmitted word based on input information data; and a decoding means for inputting the transmitted word where errors occurred in an information transmission channel as a received word and correcting and detecting the errors. The encoding means generates the transmitted word by adding check information generated based on a parity check matrix expressing a spotty-byte error control code and the input information data to the input information data. The decoding means comprises a syndrome generating means for generating a syndrome of the received word based on the parity check matrix; and an error correction means for correcting and detecting the errors in the received word based on the syndrome generated by the syndrome generating means.

18 Claims, 22 Drawing Sheets

FOREIGN PATENT DOCUMENTS

| | | |
|---|---|---|
| JP | 2006-60465 A | 3/2006 |
| JP | 2006-101429 A | 4/2006 |

OTHER PUBLICATIONS

Toshihiko Kashiyama et al., "Spotty Byte Error Control Codes", Sep. 2004, Dai 3 kai Forum on Information Technology (LC-006), p. 43-45.

Ganesan Umanesan et al., "A Class of Random Multiple Bits in a Byte Error Correcting (St/bEC) Codes for Semiconductor Memory Systems", Proceedings of the 2002 Pacific Rim International Symposium on Dependable Computing, Dec. 2002, p. 247-254.

Kazuyoshi Suzuki et al., "A Class of Error Control Codes for M-Spotty Byte Errors Occurred in a Limited Number of Bytes", Proceedings of the International Symposium on Information Theory 2005, Sep. 4, 2005, p. 246-254.

Se June Hong et al., "A General Class of Maximal Codes for Computer Applications", IEEE Transactions on Computers, Dec. 1972, p. 1322-1331, vol. c-21, No. 12.

Eiji Fujiwara et al., "Odd-Weight Column b-Adjacent Error Correcting Codes", The Transactions of the IECE of Japan, Oct. 10, 1978, p. 781-787, vol. E-61, No. 10.

Shigeo Kaneda et al., "Single Byte Error Correcting_Double Byte Error Detecting Codes for Memory Systems", IEEE Transactions on Computers, Jul. 1982, p. 596-602, vol. c-31, No. 7.

C.L. Chen et al., Fault Tolerant Memory Design in the IBM Application System/400, IEEE, 1991, p. 393-400.

Shigeo Kaneda, "A Class of Odd-Weight Column SEC-DED-SbED Codes for Memory System Applications", IEEE Transactions on Computers, Aug. 1984, p. 737-739, vol. c-33, No. 8.

Ganesan Umanesan et al., "A Class of Codes for Correcting Single Spotty Byte Errors", IEICE Trans. Fundamentals, Mar. 2003, p. 704-714, vol. E-86-A, No. 3.

Mitsuru Hamada et al., "A Class of Error Control Codes for Byte Organized Memory Systems—SbEC-(Sb+S)ED Codes", IEEE Transactions on Computers, Jan. 1997, p. 105-109, vol. 46, No. 1.

Ganesan Umanesan et al., "Random Double Bit Error Correcting—Single b-bit Byte Error Correcting (DEC-SbEC) Codes for Memory Systems", IEICE Trans. Fundamentals, Jan. 2002, p. 273-276, vol. E-85-A, No. 1.

Eiji Fujiwara et al., "Single b-bit Byte Error Correcting and Double Bit Error Detecting Codes for High-Speed Memory Systems", IEICE Trans. Fundamentals, Sep. 1993, vol. E-76-A, No. 9.

T.R.N. Rao et al., Error-Control Coding for Computer-Systems.

Stanislaw J. Piestrak, "The Minimal Test Set for Multioutput threshold Circuits Implemented as Sorting Networks", IEEE Transactions on Computers, Jun. 1993, p. 700-712, vol. 42, No. 6.

Stephen B. Wicker et al., "Reed-Solomon Codes and Their Applications", IEEE Press, 1994.

Hideki Imai et al., "A Construction Method for Simply-Decodable Error-Correcting Codes", UDC, 1979, p. 271-277, vol. J62-A, No. 5.

\* cited by examiner

FIG.3

FIG.19
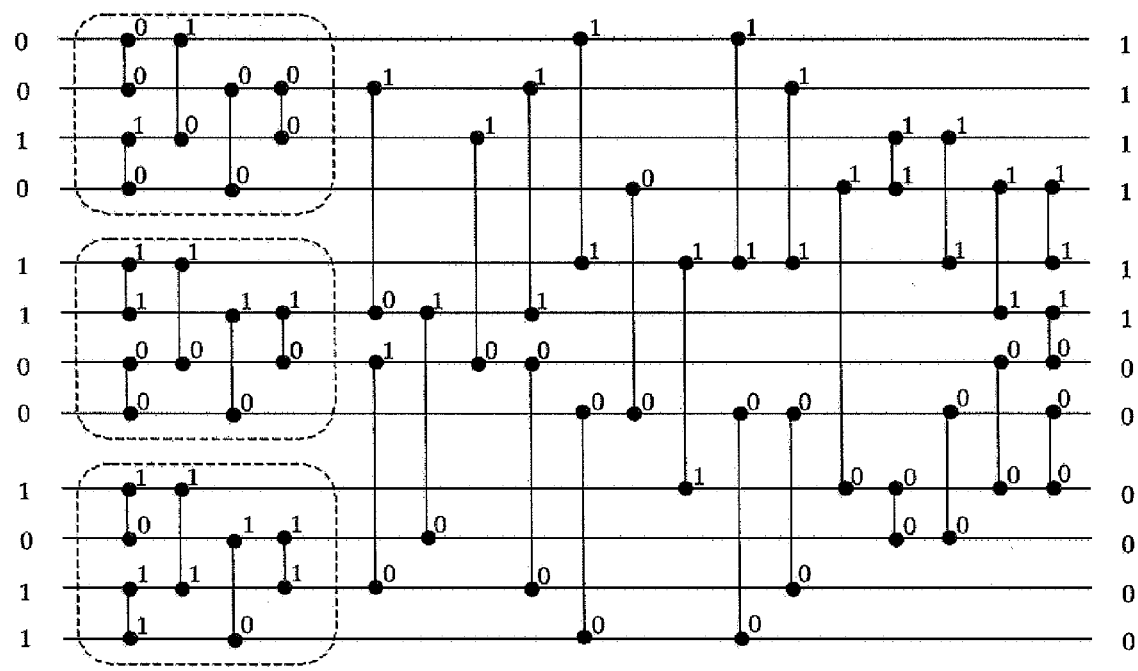
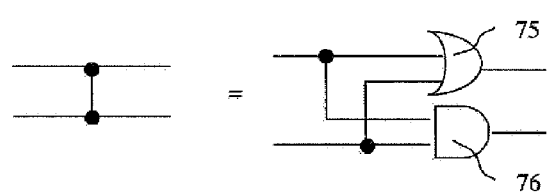

METHOD AND APPARATUS FOR CORRECTING AND DETECTING MULTIPLE SPOTTY-BYTE ERRORS WITHIN A BYTE OCCURRED IN A LIMITED NUMBER OF BYTES

TECHNICAL FIELD

The present invention relates to a method and an apparatus for correcting and detecting spotty-byte error. More specifically, the present invention relates to a method and an apparatus for correcting and detecting multiple spotty-byte errors within a byte occurred in a limited number of bytes and which are used suitably for detecting and correcting "multiple spotty-byte errors within a byte occurred in a limited number of bytes" in the case where a plurality of bits are called a byte, a plurality of bytes compose a word, and errors such that a plurality of spotty-byte errors occurred within a byte is called "multiple spotty-byte errors within a byte", and when the multiple spotty-byte errors within a byte occurred in a limited number of bytes, we call such errors as "multiple spotty-byte errors within a byte occurred in a limited number of bytes".

BACKGROUND TECHNIQUE

In recent years, as the information-intensive society is developed and the semiconductor technique makes advance, the improvement of reliability of digital data becomes more important. When digital data are tried to be transmitted or recorded accurately, transmission data are influenced by noises or the like in a transmission channel to be transmitted improperly, elements are failed, or recording media or the like are defected, and thus it is necessary to detect and correct errors which occurred due to them. In order to realize the detection and correction of the errors, various error correction and detection codes have been developed on the basis of the code theory.

As the conventional error correction codes, for example, a Hong-Patel code which is excellent as a code for correcting any error occurred within a byte ($S_b$EC code) (where, a mass of b bits is called a byte and b is an integer that is 2 or more.) is disclosed (for example, see Non-Patent Document 1).

Further, an odd number weight string byte error correction code including a single-bit error correction and double-bit error detection code, which is conventionally used the most frequently in high-speed semiconductor memory systems, is disclosed (for example, see Non-Patent Document 2).

A code for correcting single-byte error and detecting double-byte error ($S_b$EC-$D_b$ED code) is proposed as a Reed-Solomon code and as a code which is obtained by improving the Reed-Solomon code and is efficient, and it has been already utilized in main memory device of many computer systems or the like (for example, see Non-Patent Documents 3 and 4).

Moreover, as a code for detecting byte errors, a code for correcting single-bit error and detecting double-bit error and single-byte error (SEC-DED-$S_b$ED code) is made in public, and is currently applied to main memory device of many computer systems, (for example, see Non-Patent Document 5).

The concrete contents of the mutually related code research and development up to the late 1980s are pan optically described in Non-Patent Document 6.

Thereafter, as a code for high-speed semiconductor memory systems which is newly developed, a code for correcting single-byte error and detecting double-bit error ($S_b$EC-DED code) is disclosed in Non-Patent Document 7, and a code for correcting single-byte error and simultaneously detecting single-bit error and single-byte error ($S_b$EC-(S+$S_b$)ED code) is disclosed in Non-Patent Document 8. Further, a code for correcting single-byte error and also correcting double-bit error if occurred ($S_b$EC-DEC code) is disclosed in Non-Patent Document 9.

Particularly, as a code which is most related to the present invention, an invention relating to an $S_{t/b}$EC code for correcting single-spotty-byte error, and relating to an $S_{t/b}$EC-$S_b$ED code for correcting single-spotty-byte error and detecting single-byte error exceeding t bits within a byte is already disclosed (see Patent Document 1). Where, a "spotty-byte error" is a "t/b error", i.e. errors up to t bits (t≦b) within a byte composed of b bits. Particularly, the $S_{t/b}$EC code is disclosed in Non-Patent Document 10.

Further, an invention relating to an $S_{t/b}$EC-$D_{t/b}$ED code for correcting single-spotty-byte error and detecting double-spotty-byte error and relating to an $S_{t/b}$EC-$D_{t/b}$ED-$S_b$ED code for correcting single-spotty-byte and detecting both double-spotty-byte errors and single-byte errors exceeding t bits within a byte is already applied (see Patent Document 2).

In the case of considering a plurality of spotty-byte errors, an error in which only single-spotty-byte error occurred within a byte, is called "single spotty-byte error within a byte". An invention relating to a general constitution method in which a distance "d" is provided to the single spotty-byte error within a byte has been already filed (see Patent Document 3).

Further, an error in which a plurality of spotty-byte errors (namely, two or more spotty-byte errors) occurred within a byte is called "multiple spotty-byte errors within a byte". An invention relating to a general constitution method in which a distance "d" is provided to the multiple spotty-byte errors within a byte has been already filed (see Patent Document 4).

Since elements which have input-output of 1-bit data are mainly used as semiconductor memory elements until the mid-1980s, single-bit error correction and double-bit error detection code (SEC-DED code) for correcting an error of one element and detecting errors to two elements is used frequently. However, elements having input-output of 4-bit data start to be a mainstream from the mid-1980s according to high integration of memory elements, and thus the $S_4$EC-$D_4$ED code and the SEC-DED-$S_4$ED code whose byte width "b" is 4 bits (b=4) are mainly used. Further, semiconductor memory elements having input-output of 8-bit and 16-bit data start to be a mainstream from the mid-1990s.

However, when the byte width of 8 bits (b=8) or 16 bits (b=16) is applied to the byte width "b" of the conventional $S_b$EC-$D_b$ED code, the proportion of the number of check bits share to the total code length is about 30% to 40%, which is large, and the code rate is reduced, thereby arising a practically significantly important problem.

In memory device using these semiconductor memory elements (DRAM elements, herein after, also simply referred to as element), temporary fault occurs due to noises, alpha particles and the like, or the DRAM elements are deteriorated and are not operated, namely, permanent fault occurs. 80% or more of the recent devices using the DRAM elements temporarily faulted, and particularly in the DRAM elements having multi-bit data input-output of 8 or more bits, the most of bit errors are errors of comparatively small bits such as 1, 2 and 3 bit within a byte.

Among them, a temporary error due to electromagnetic noises and alpha particles with comparatively low-level energy and single-bit error due to the permanent fault of a memory cell are generated most frequently. Recently, since mobile devices loaded with the DRAM elements are used so frequently, the use in unsatisfactory electromagnetic environments should be taken into consideration. In the DRAM elements in electronic devices to be used for high-altitude aircrafts and fighting aircrafts, it is highly possible that the temporary fault having about double-bit error or triple-bit error occurs due to collision of neutron particles or the like of high energy level caused by cosmic ray. In the DRAM elements loaded onto space appliances to be used for satellite communication and space communication, it is necessary to consider the heavy damage due to the collision of particles of a high energy level, and in this case, 2 or more bits error should be taken into consideration.

Since the bit error occurrence is widely ranging as mentioned above, the $S_{t/b}EC$-$S_bED$ code which can be structured by giving any value to parameters t and b is a very practical code system, when this code is used for the memory device using the DRAM chips of 8 or more bits. That is, the $S_{t/b}EC$-$S_bED$ code is provided with the function capable of correcting spotty-byte error, i.e. one chip error up to t bits (t is smaller than the byte width b and the value of t can be arbitrarily determined by designer who conduct a search on tendency of error) and the function capable of detecting single-byte errors exceeding t-bit errors whose probability of occurrence is low. As a result, the $S_{t/b}EC$-$S_bED$ code can correct and detect error by using the significantly smaller number of check bits than that of a conventional error control code such as the Reed-Solomon code (RS code) with which errors are controlled by byte unit.

The $S_{t/b}EC$-$D_{t/b}ED$-$S_bED$ code is a very practical code system for an error to extend to two arbitrary chips (the two arbitrary chips is not limited to adjacent two chips), when this code is used in the memory device using the DRAM chips of 8 or more bits. That is, the $S_{t/b}EC$-$D_{t/b}ED$-$S_bED$ code is provided with the function capable of correcting one chip error up to t (t is smaller than the byte width b) bits (single-spotty-byte error correction, $S_{t/b}EC$), the function capable of detecting spotty-byte error to extend to two elements (double-spotty-byte error detection, $D_{t/b}ED$) and the function capable of detecting single-byte error exceeding t-bits though whose probability of occurrence is low (single-byte error detection, $S_bED$). As a result, the $S_{t/b}EC$-$D_{t/b}ED$-$S_bED$ code can correct and detect bit error by using the significantly smaller number of check bits than that of a conventional code system which correct and detect bit error by byte unit.

A spotty-byte error control code generally having a distanced over $GF(2^b)$ is constructed theoretically for the single spotty-byte error within a byte and the multiple spotty-byte errors within a byte, so that an error to extend to two or more chips can be corrected and detected.

However, an error to extend to a lot of chips seldom occurs at the same time. Generally, an error occurs in a limited number of elements, namely, in a limited number of bytes. In addition, the number of chips on which an error occurs is two or three at most.

The present invention is devised in view of the above circumstances, and it is an object of the present invention to provide a method and an apparatus for correcting and detecting multiple spotty-byte errors within a byte occurred in a limited number of bytes.

It is another object of the present invention to provide a method and an apparatus for correcting and detecting multiple spotty-byte errors within a byte occurred in a limited number of bytes with controlling random bit errors occurred in the limited number of bytes when t=1.

Further, it is still another object of the present invention to provide a method and an apparatus for correcting and detecting multiple spotty-byte errors within a byte occurred in a limited number of bytes with detecting single byte errors exceeding correction capability of multiple spotty-byte errors within a byte whose probability of occurrence is low.

DISCLOSURE OF THE INVENTION

The present invention relates to an apparatus for correcting and detecting multiple spotty-byte errors within a byte occurred in a limited number of bytes, comprising: an encoding means for generating a transmitted word based on input information data; and a decoding means for inputting said transmitted word where errors occurred in an information transmission channel as a received word and correcting and detecting said errors. The above object of the present invention is effectively achieved by that: said encoding means generates said transmitted word by adding check information generated based on a parity check matrix expressing a spotty-byte error control code and said input information data to said input information data, said decoding means comprises a syndrome generating means for generating a syndrome of said received word based on said parity check matrix; and an error correction means for correcting and detecting said errors of said received word based on said syndrome generated by said syndrome generating means, when said input information data is composed of multiple bytes, where b bits (b is an integer that is 2 or more.) is called a byte, errors up to t bits ($1 \leq t \leq b$) within a byte is called a spotty-byte error, and errors in which a plurality of said spotty-byte errors occurred within a byte is called multiple spotty-byte errors within a byte, said spotty-byte error control code expressed by said parity check matrix corrects $\mu_1$ spotty-byte errors occurred in $p_1$ bytes and detects $\mu_2$ spotty-byte errors occurred in $p_2$ bytes, said value t, said value b, said value $p_1$, said value $p_2$, said value $\mu_1$ and said value $\mu_2$ are arbitrarily set, where $p_1 \leq p_2$ and $\mu_1 \leq \mu_2$ hold. The above object of the present invention is also effectively achieved by that: said information transmission channel is an information communication system. The above object of the present invention is also effectively achieved by that: said information transmission channel is a memory system. The above object of the present invention is also effectively achieved by that: said information transmission channel is a bus line circuit.

Further, the above object of the present invention is also effectively achieved by that: said parity check matrix is the following matrix H having R rows and N columns which is used for an error control code for controlling multiple spotty-byte errors within a byte occurred in a limited number of bytes with a function of correcting $\mu_1$ spotty-byte errors occurred in $p_1$ bytes and detecting $\mu_2$ spotty-byte errors occurred in $p_2$ bytes ($[\mu_1 t/bEC]_{p_1}$-$[\mu_2 t/bED]_{p_2}$ code), $$H = \begin{bmatrix} H' & H' & \ldots & H' & \ldots & H' \\ \gamma^0 H'' & \gamma^1 H'' & \ldots & \gamma^j H'' & \ldots & \gamma^{n-1} H'' \\ \gamma^0 H'' & \gamma^2 H'' & \ldots & \gamma^{2j} H'' & \ldots & \gamma^{2(n-1)} H'' \\ \vdots & \vdots & \ddots & \vdots & \ddots & \vdots \\ \gamma^0 H'' & \gamma^{p_1+p_2-1} H'' & \ldots & \gamma^{(p_1+p_2-1)j} H'' & \ldots & \gamma^{(p_1+p_2-1)(n-1)} H'' \end{bmatrix}$$

where $R=q+(p_1+p_2-1)r$, $N=bn$, $0 \leq i \leq n-1$ and $n=2^r-1$ hold, said matrix H' is a binary matrix of q rows and b columns ($q \leq b$) composed of a q-dimension column vector $h_j'$ ($0 \leq j \leq b-1$) shown in $H'=[h_0', h_1', \ldots, h_{b-1}']$, plural columns whose number is larger than or equal to either smaller one of $(\mu_1+\mu_2)t$ and b are linearly independent, if $(\mu_1+\mu_2)t \geq b$, said matrix H' is a nonsingular matrix including an identity matrix, if $(\mu_1+\mu_2)t<b$, said matrix H' is equal to a check matrix of a code having a minimum Hamming distance $(\mu_1+\mu_2)t+1$, namely, a parity check matrix of a (b,b−q) code with a function of detecting $(\mu_1+\mu_2)t$ bits error, said matrix H'' is a binary matrix having r rows and b columns ($r \leq b$) composed of an q-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H'' is a nonsingular matrix including an identity matrix, if $\lfloor (\mu_1+\mu_2)/2 \rfloor t<b$, said matrix H'' is equal to a check matrix of a code having a minimum Hamming distance $\lfloor (\mu_1+\mu_2)/2 \rfloor t+1$, namely, a parity check matrix of a (b,b−r) code with a function of detecting $\lfloor (\mu_1+\mu_2)/2 \rfloor t$ bits error, γ is a primitive element of an r-th degree extension field $GF(2^r)$ of $GF(2)$, and $\gamma^i H''=[\gamma^i h_0'', \gamma^i h_1'', \ldots, \gamma^i h_{b-1}'']$ holds.

Further, the above object of the present invention is also effectively achieved by that: said parity check matrix is the following matrix H having R rows and N columns which is used for a lengthened error control code for controlling multiple spotty-byte errors within a byte occurred in a limited number of bytes with a function of correcting $\mu_1$ spotty-byte errors occurred in $p_1$ bytes and detecting $\mu_2$ spotty-byte errors occurred in $p_2$ bytes (lengthened $[\mu_1 t/bEC]_{p_1}-[\mu_2 t/bED]_{p_2}$ code), $$H = \begin{bmatrix} H' & H' & \ldots & H' & \ldots & H' & H' & O_{q \times r'} \\ \gamma^0 H'' & \gamma^1 H'' & \ldots & \gamma^i H'' & \ldots & \gamma^{n-1} H'' & O_{r' \times b} & O_{r' \times r'} \\ \gamma^0 H'' & \gamma^2 H'' & \ldots & \gamma^{2i} H'' & \ldots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' & O_{r' \times b} & I_{r'} \end{bmatrix}$$

where $r' \geq r$, $R=q+(p_1+p_2-1)r'$, $N=b(n+1)+r'$, $0 \leq i \leq n-1$ and $n=2^{r'}-1$ hold, $I_{r'}$ is an r' by r' identity matrix, O is a zero matrix, said matrix H' is a binary matrix of q rows and b columns ($q \leq b$) composed of a q-dimensional column vector $h_j'$ ($0 \leq j \leq b-1$) shown in $H'=[h_0', h_1', \ldots, h_{b-1}']$, plural columns whose number is larger than or equal to either smaller one of $(\mu_1+\mu_2)t$ and b are linearly independent, if $(\mu_1+\mu_2)t \geq b$, said matrix H' is a nonsingular matrix including an identity matrix, if $(\mu_1+\mu_2)t<b$, said matrix H' is equal to a check matrix of a code having a minimum Hamming distance $(\mu_1+\mu_2)t+1$, namely, a parity check matrix of a (b,b−q) code with a function of detecting $(\mu_1+\mu_2)t$ bits error, said matrix H'' is a binary matrix of r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H'' is a nonsingular matrix including an identity matrix, if $\lfloor (\mu_1+\mu_2)/2 \rfloor t<b$, said matrix H'' is equal to a check matrix of a code having a minimum Hamming distance $\lfloor (\mu_1+\mu_2)/2 \rfloor t+1$, namely, a parity check matrix of a (b,b−r) code with a function of detecting $\lfloor (\mu_1+\mu_2)/2 \rfloor t$ bits error, γ is a primitive element of an r'-th degree extension field $GF(2^{r'})$ of $GF(2)$, $\gamma^i H''=[\gamma^i \Phi(h_0''), \gamma^i \Phi(h_1''), \ldots, \gamma^i \Phi(h_{b-1}'')]$ holds, (Φ is an injective homomorphism from $GF(2^r)$ to $GF(2^{r'})$ under addition, namely, $\Phi: GF(2^r) \rightarrow GF(2^{r'})$).

Further, the above object of the present invention is also effectively achieved by that: said parity check matrix is the following matrix H having R rows and N columns which is used for an error control code for controlling multiple spotty-byte errors within a byte occurred in a limited number of bytes with a function of correcting $\mu_1$ spotty-byte errors occurred in $p_1$ bytes, and detecting $\mu_2$ spotty-byte errors occurred in $p_2$ bytes and single-byte error exceeding correction capability ($[\mu_1 t/bEC]_{p_1}-[\mu_2 t/bED]_{p_2}-S_b ED$ code), $$H = \begin{bmatrix} I_b & I_b & \ldots & I_b & \ldots & I_b \\ \gamma^0 H'' & \gamma^1 H'' & \ldots & \gamma^i H'' & \ldots & \gamma^{n-1} H'' \\ \gamma^0 H'' & \gamma^2 H'' & \ldots & \gamma^{2i} H'' & \ldots & \gamma^{2(n-1)} H'' \\ \vdots & \vdots & \ddots & \vdots & \ddots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' \end{bmatrix}$$

where $R=b+(p_1+p_2-1)r$, $N=bn$, $0 \leq i \leq n-1$ and $n=2^r-1$ hold, $I_b$ is a b by b identity matrix, said matrix H'' is a binary matrix of r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H'' is a nonsingular matrix including an identity matrix, if $\lfloor (\mu_1+\mu_2)/2 \rfloor t<b$, said matrix H'' is equal to a check matrix of a code having a minimum Hamming distance $\lfloor (\mu_1+\mu_2)/2 \rfloor t+1$, namely, a parity check matrix of a (b,b−r) code with a function of detecting $\lfloor (\mu_1+\mu_2)/2 \rfloor t$ bits error, γ is a primitive element of an r-th degree extension field $GF(2^r)$ of $GF(2)$, and $\gamma^i H''=[\gamma^i h_0'', \ldots, \gamma^i h_1'', \ldots, \gamma^i h_{b-1}'']$ holds.

Further, the above object of the present invention is also effectively achieved by that: said parity check matrix is the following matrix H having R rows and N columns which is used for a lengthened error control code for controlling multiple spotty-byte errors within a byte occurred in a limited number of bytes with a function of correcting $\mu_1$ spotty-byte errors occurred in $p_1$ bytes, and detecting $\mu_2$ spotty-byte errors occurred in $p_2$ bytes and single-byte error exceeding correction capability (lengthened $[\mu_1 t/bEC]_{p_1}-[\mu_2 t/bED]_{p_2}-S_b ED$ code)

$$H = \begin{bmatrix} I_b & I_b & \ldots & I_b & \ldots & I_b & I_b & O_{b \times r'} \\ \gamma^0 H'' & \gamma^1 H'' & \ldots & \gamma^i H'' & \ldots & \gamma^{n-1} H'' & O_{r' \times b} & O_{r' \times r'} \\ \gamma^0 H'' & \gamma^2 H'' & \ldots & \gamma^{2i} H'' & \ldots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' & O_{r' \times b} & I_{r'} \end{bmatrix}$$

where $r' \geq r$, $R=b+(p_1+p_2-1)r'$, $N=b(n+1)+r'$, $0 \leq i \leq n-1$ and $n=2^{r'}-1$ hold, $I_b$ is a b by b identity matrix, $I_{r'}$ is an r' by r' identity matrix, O is a zero matrix, said matrix H'' is a binary matrix of r rows and b columns ($r \leq b$) composed of an r-dimensional column vector $h_j''$ ($0 \leq j \leq b-1$) shown in H''=[$h_0''$, $h_1''$, ..., $h_{b-1}''$], plural columns whose number is larger than or equal to either smaller one of t and b are linearly independent, $\lfloor x \rfloor$ represents a maximum integer which does not exceed x, if $\lfloor (\mu_1+\mu_2)/2 \rfloor t \geq b$, said matrix H'' is a nonsingular matrix including an identity matrix, if $\lfloor (\mu_1+\mu_2)/2 \rfloor t < b$, said matrix H'' is equal to a check matrix of a code having a minimum Hamming distance $\lfloor (\mu_1+\mu_2)/2 \rfloor t + 1$, namely, a parity check matrix of a (b,b−r) code with a function of detecting $\lfloor (\mu_1+\mu_2)/2 \rfloor t$ bits error, γ is a primitive element of an r'-th degree extension field GF($2^{r'}$) of GF(2), $\gamma^i H'' = [\gamma^i \Phi(h_0'')$, $\gamma^i \Phi(h_1'')$, ..., $\gamma^i \Phi(h_{b-1}'')]$ holds, Φ is an injective homomorphism from GF($2^r$) to GF($2^{r'}$) under addition, namely, $\Phi: GF(2^r) \to GF(2^{r'})$.

Further, the above object of the present invention is also effectively achieved by that: said error control code for controlling multiple spotty-byte errors within a byte occurred in a limited number of bytes ($[\mu_1 t/bEC]_{p_1} - [\mu_2 t/bED]_{p_2}$ code), becomes an error control code for controlling random bit errors occurred in a limited number of bytes with a function of correcting $\mu_1$ random bit errors occurred in $p_1$ bytes and detecting $\mu_2$ random bit errors occurred in $p_2$ bytes, when said value t is set to 1 (t=1). The above object of the present invention is also effectively achieved by that: said lengthened error control code for controlling multiple spotty-byte errors within a byte occurred in a limited number of bytes (lengthened $[\mu_1 t/bEC]_{p_1} - [\mu_2 t/bED]_{p_2}$ code), becomes an error control code for controlling random bit errors occurred in a limited number of bytes with a function of correcting $\mu_1$ random bit errors occurred in $p_1$ bytes and detecting $\mu_2$ random bit errors occurred in $p_2$ bytes, when said value t is set to 1 (t=1). The above object of the present invention is also effectively achieved by that: said error control code for controlling multiple spotty-byte errors within a byte occurred in a limited number of bytes ($[\mu_1 t/bEC]_{p_1} - [\mu_2 t/bED]_{p_2} - S_b ED$ code), becomes an error control code for controlling random bit errors occurred in a limited number of bytes with a function of correcting $\mu_1$ random bit errors occurred in $p_1$ bytes, and detecting $\mu_2$ random bit errors occurred in $p_2$ bytes and single-byte error exceeding correction capability, when said value t is set to 1 (t=1). The above object of the present invention is also effectively achieved by that: said lengthened error control code for controlling multiple spotty-byte errors within a byte occurred in a limited number of bytes (lengthened $[\mu_1 t/bEC]_{p_1} - [\mu_2 t/bED]_{p_2} - S_b ED$ code), becomes an error control code for controlling random bit errors occurred in a limited number of bytes with a function of correcting $\mu_1$ random bit errors occurred in $p_1$ bytes, and detecting $\mu_2$ random bit errors occurred in $p_2$ bytes and single-byte error exceeding correction capability, when said value t is set to 1 (t=1).

Further, the above object of the present invention is also effectively achieved by that: if $t \geq b/\lfloor (\mu_1+\mu_2)/2 \rfloor$, said matrix H' and said matrix H'' become matrices where arbitrary b columns are linearly independent, and said parity check matrix (H) corresponds with a parity check matrix of an RS code having a function of correcting $p_1$ bytes error and detecting $p_2$ bytes error. The above object of the present invention is also effectively achieved by that: if $t \geq b/\lfloor (\mu_1+\mu_2)/2 \rfloor$, said matrix H' and said matrix H'' become matrices where arbitrary b columns are linearly independent, and said parity check matrix (H) corresponds with a parity check matrix of a doubly lengthened RS code having a function of correcting $p_1$ bytes error and detecting $p_2$ bytes error. The above object of the present invention is also effectively achieved by that: if $t \geq b/\lfloor (\mu_1+\mu_2)/2 \rfloor$, said matrix H'' becomes a matrix where arbitrary b columns are linearly independent, and said parity check matrix (H) corresponds with a parity check matrix of an RS code having a function of correcting $p_1$ bytes error and detecting $p_2$ bytes error. The above object of the present invention is also effectively achieved by that: if $t \geq b/\lfloor (\mu_1+\mu_2)/2 \rfloor$, said matrix H'' becomes a matrix where arbitrary b columns are linearly independent, and said parity check matrix (H) corresponds with a parity check matrix of a doubly lengthened RS code having a function of correcting $p_1$ bytes error and detecting $p_2$ bytes error.

Further, the above object of the present invention is also effectively achieved by that: said error correction means generates a bit-error pointer for detecting which bit of said received word has an error based on said syndrome, and corrects said error of said received word by inverting bit value of said received word corresponding to erroneous bits based on said generated bit-error pointer, and when detecting that bit error of said received word cannot be corrected, said error correction means outputs an uncorrectable error detection signal, said error correction means comprises an H' decoding means; an H'' multiplication means; a parallel decoding means over GF($2^r$); an error vector generating means over GF($2^b$); and an inverting means. The above object of the present invention is also effectively achieved by that: said H' decoding means generates a byte-by-byte sum of errors ($e_A$) based on upper q bits on said syndrome generated by said syndrome generating means, said H'' multiplication means generates a product of said byte-by-byte sum of errors ($e_A$) and a transposed matrix of H'' based on said byte-by-byte sum of errors ($e_A$) generated by said H' decoding means, said parallel decoding means over GF($2^r$) generates a bit-error pointer over GF($2^r$) and a first uncorrectable error detection signal which is output when error correction is regarded as impossible in parallel decoding over GF($2^r$), based on said product of said byte-by-byte sum of errors ($e_A$) and a transposed matrix of H'' which is generated by said H'' multiplication means, and residual lower bits excluding said upper q bits on said syndrome generated by said syndrome generating means, said error vector generating means over GF($2^b$) generates a bit-error pointer over ($2^b$) and a second uncorrectable error detection signal which is output when error correction is regarded as impossible, based on said byte-by-byte sum of errors ($e_A$) generated by said H' decoding means and said bit-error pointer over GF($2^r$) generated by said parallel decoding means over GF($2^r$), said inverting means corrects said error in said received word by inverting bit value of said received word corresponding to said bit-error pointer over GF($2^b$) based on said bit-error pointer over GF($2^b$) generated by said error vector generating means over GF($2^b$). The above object of the present invention is also effectively achieved by that: said error correction means outputs a third uncorrectable error detection signal representing that an error exceeding correction capability is detected by obtaining logical OR of said first uncorrectable error detection signal generated by said parallel decoding means over GF($2^r$) and said second uncorrectable error detection signal generated by said error vector generating means over GF($2^b$).

Further, the above object of the present invention is also effectively achieved by that: said error vector generating means over GF($2^b$) comprises a plurality of t-bit error correction decoding means, a multi-input sorting means and a plurality of miscorrection determining means in i-th byte, said plurality of t-bit error correction decoding means outputs a detection signal in i-th byte and 1 byte of bit-error pointer (ê) produced by the decoder from 1 byte of said bit-error pointer (e') over GF($2^r$), said multi-input sorting means outputs 1 from upper bits of outputs continuously only as for the number of weights of said plural detection signals in i-th byte which were input, said miscorrection determining means in i-th byte carries out a miscorrection determination and outputs 1 byte of said bit-error pointer (e) over GF($2^b$). The above object of the present invention is also effectively achieved by that: said error vector generating means over GF($2^b$) comprises a plurality of t-bit error correction decoding means, a multi-input sorting means and a plurality of miscorrection determining means in i-th byte, said t-bit error correction decoding means is a means which inputs predetermined 1 byte of said bit-error pointer (e') over GF($2^r$) and outputs 1 byte of bit-error pointer (ê) produced by the decoder corresponding to said predetermined 1 byte to said miscorrection determining means in i-th byte, and outputs a detection signal in i-th byte that is a signal for detecting an error exceeding correction capability to said multi-input sorting means and said miscorrection determining means in i-th byte, said multi-input sorting means is a means which counts the number of weights (the number of "1") of said plural detection signals in i-th byte which were input and outputs 1 from upper bits of outputs continuously only as for the number of weights, said miscorrection determining means in i-th byte is a means which inputs said bit-error pointer (ê) produced by the decoder that were output from said t-bit error correction decoding means of all bytes, said detection signal in i-th byte and said byte-by-byte sum of errors ($e_A$), carries out a miscorrection determination and outputs 1 byte of said bit-error pointer (e) over GF($2^b$). The above object of the present invention is also effectively achieved by that: said error vector generating means over GF(2) outputs an upper second bit signal of signals output from said multi-input sorting means as said second uncorrectable error detection signal, and collects signals output from said miscorrection determining means in i-th byte and outputs said bit-error pointer over GF($2^b$) having the number of bits of code length.

Further, the above object of the present invention is also effectively achieved by that: said miscorrection determining means in i-th byte carries out said miscorrection determination by the following miscorrection determination expression, $$w_M(\hat{e}_x + e_A) \leq \mu_1 - w_M(\hat{e}_x)$$

where $w_M(e)$ is defined by $$w_M(e) = \sum_{i=0}^{n-1} \left\lceil \frac{w_H(e_i)}{t} \right\rceil$$

and represents the number of spotty-byte errors, and $w_H(e_i)$ represents a Hamming weight over a Galois field GF(2) of a vector $e_i$, when said miscorrection determination expression holds, $e_x = \hat{e}_x$ and thus a determination is made that miscorrection is not carried out, and when said miscorrection determination expression does not hold, $e_x \neq \hat{e}_x$ and thus a determination is made that miscorrection is carried out. The above object of the present invention is also effectively achieved by that: with respect to said $[\mu_1 t/bEC]_{p_1} - [\mu_2 t/bED]_{p_2} - S_b ED$ code and said lengthened $[\mu_1 t/bEC]_{p_1} - [\mu_2 t/bED]_{p_2} - S_b ED$ code, said decoding means is constituted by that a syndrome other than $S_I$ is newly input into said H" multiplication means, and when $S_{I \neq 0}$ and said syndrome other than $S_I$ is 0, a detection signal is output, $S_I$ is newly input into said error vector generating means over GF($2^b$), said error vector generating means over GF($2^b$) checks whether the number of erroneous bytes is 1 in the error e' over GF($2^r$) or not, and said multi-input sorting means checks whether Hamming weight of $S_I$ is larger than $\mu_1 t$ or not.

Furthermore, the present invention relates to a method for correcting and detecting multiple spotty-byte errors within a byte occurred in a limited number of bytes, comprising: an encoding processing step of generating a transmitted word based on input information data; and a decoding processing step of inputting said transmitted word where errors occurred in an information transmission channel as a received word and correcting and detecting said errors. The above object of the present invention is effectively achieved by that: in said encoding processing step, said transmitted word is generated by adding check information generated based on a parity check matrix expressing a spotty-byte error control code and said input information data to said input information data, said decoding processing step comprises a syndrome generating processing step of generating a syndrome of said received word based on said parity check matrix; and an error correction processing step of correcting and detecting said errors in said received word based on said syndrome generated by said syndrome generating processing step, when said input information data is composed of multiple bytes, where b bits (b is an integer that is 2 or more.) is called a byte, errors up to t bits ($1 \leq t \leq b$) within a byte is called a spotty-byte error, and errors in which a plurality of said spotty-byte errors occurred within a byte is called multiple spotty-byte errors within a byte, said spotty-byte error control code expressed by said parity check matrix corrects $\mu_1$ spotty-byte errors occurred in $p_1$ bytes and detects 2 spotty-byte errors occurred in $p_2$ bytes, said value t, said value b, said value $p_1$, said value $p_2$, said value $\mu_1$ and said value $\mu_2$ are arbitrarily set, where $p_1 \leq p_2$ and $\mu_1 \leq \mu_2$ hold, said information transmission channel is any one of an information communication system, a memory system and a bus line circuit.

Further, the above object of the present invention is also effectively achieved by that: in said error correction processing step, a bit-error pointer for detecting which bit of said received word has an error, is generated based on said syndrome, and said error in said received word is corrected by inverting bit value of said received word corresponding to erroneous bits based on said generated bit-error pointer, and when detecting that bit error of said received word cannot be corrected, an uncorrectable error detection signal is output. The above object of the present invention is also effectively achieved by that: said error correction processing step comprises an H' decoding processing step; an H" multiplication processing step; a parallel decoding processing step over $GF(2^r)$; an error vector generating processing step over $GF(2^b)$; and an inverting processing step. The above object of the present invention is also effectively achieved by that: in said H' decoding processing step, a byte-by-byte sum of errors ($e_A$) is generated based on upper q bits on said syndrome generated by said syndrome generating processing step, in said H" multiplication processing step, a product of said byte-by-byte sum of errors ($e_A$) and a transposed matrix of H" is generated based on said byte-by-byte sum of errors ($e_A$) generated by said H' decoding processing step, in said parallel decoding processing step over $GF(2^r)$, a bit-error pointer over $GF(2^r)$ and a first uncorrectable error detection signal which is output when error correction is regarded as impossible in parallel decoding over $GF(2^r)$, are generated based on said product of said byte-by-byte sum of errors ($e_A$) and a transposed matrix of H" which is generated by said H" multiplication processing step, and residual lower bits excluding said upper q bits on said syndrome generated by said syndrome generating processing step, in said error vector generating processing step over $GF(2^b)$, a bit-error pointer over $GF(2^b)$ and a second uncorrectable error detection signal which is output when error correction is regarded as impossible, are generated based on said byte-by-byte sum of errors ($e_A$) generated by said H' decoding processing step and said bit-error pointer over $GF(2^r)$ generated by said parallel decoding processing step over $GF(2^r)$, in said inverting processing step, said error in said received word is corrected by inverting bit value of said received word corresponding to said bit-error pointer over $GF(2^b)$ based on said bit-error pointer over $GF(2^b)$ generated by said error vector generating processing step over $GF(2^b)$. The above object of the present invention is also effectively achieved by that: in said error correction processing step, a third uncorrectable error detection signal representing that an error exceeding correction capability is detected, is output by obtaining logical OR of said first uncorrectable error detection signal generated by said parallel decoding processing step over $GF(2^r)$ and said second uncorrectable error detection signal generated by said error vector generating processing step over $GF(2^b)$.

Further, the above object of the present invention is also effectively achieved by that: said error vector generating processing step over $GF(2^b)$ comprises a plurality of t-bit error correction decoding processing steps, a multi-input sorting processing step and a plurality of miscorrection determining processing steps in i-th byte, in said t-bit error correction decoding processing step, a detection signal in i-th byte and 1 byte of bit-error pointer (ê) produced by the decoder are output from 1 byte of said bit-error pointer (e') over $GF(2^r)$, in said multi-input sorting processing step, 1 is output from upper bits of outputs continuously only as for the number of weights of said plural detection signals in i-th byte which were input, in said miscorrection determining processing step in i-th byte, a miscorrection determination is carried out and 1 byte of said bit-error pointer (e) over $GF(2^b)$ is output. The above object of the present invention is also effectively achieved by that: said error vector generating processing step over $GF(2^b)$ comprises a plurality of t-bit error correction decoding processing steps, a multi-input sorting processing step and a plurality of miscorrection determining processing steps in i-th byte, in said t-bit error correction decoding processing step, predetermined 1 byte of said bit-error pointer (e') over $GF(2^r)$ is input, and 1 byte of bit-error pointer (ê) produced by the decoder corresponding to said predetermined 1 byte is output to said miscorrection determining processing step in i-th byte, and a detection signal in i-th byte that is a signal for detecting an error exceeding correction capability is output to said multi-input sorting processing step and said miscorrection determining processing step in i-th byte, in said multi-input sorting processing step, the number of weights (the number of "1") of said plural detection signals in i-th byte which were input, is counted, and 1 is output from upper bits of outputs continuously only as for the number of weights, in said miscorrection determining processing step in i-th byte, said bit-error pointer (ê) produced by the decoder that were output from said t-bit error correction decoding processing step of all bytes, said detection signal in i-th byte and said byte-by-byte sum of errors ($e_A$) are input, a miscorrection determination is carried out and 1 byte of said bit-error pointer (e) over $GF(2^b)$ is output. The above object of the present invention is also effectively achieved by that: in said error vector generating processing step over $GF(2)$, an upper second bit signal of signals output from said multi-input sorting processing step is output as said second uncorrectable error detection signal, and signals output from said miscorrection determining processing step in i-th byte are collected, and said bit-error pointer over $GF(2^b)$ having the number of bits of code length is output.

Further, the above object of the present invention is also effectively achieved by that: in said miscorrection determining processing step in i-th byte, said miscorrection determination is carried out by the following miscorrection determination expression, $$w_M(\hat{e}_x + e_A) \leq \mu_1 - w_M(\hat{e}_x)$$

where $w_M(e)$ is defined by $$w_M(e) = \sum_{i=0}^{n-1} \left\lceil \frac{w_H(e_i)}{t} \right\rceil$$

and represents the number of spotty-byte errors, and $w_H(e_i)$ represents a Hamming weight over a Galois field $GF(2)$ of a vector $e_i$, when said miscorrection determination expression holds, $e_x = \hat{e}_x$ and thus a determination is made that miscorrection is not carried out, and when said miscorrection determination expression does not hold, $e_x \neq \hat{e}_x$ and thus a determination is made that miscorrection is carried out. The above object of the present invention is also effectively achieved by that: with respect to said $[\mu_1 t/bEC]_{P_1} - [\mu_2 t/bED]_{P_2} - S_b ED$ code and said lengthened $[\mu_1 t/bEC]_{P_1} - [\mu_2 t/bED]_{P_2} - S_b ED$ code, said decoding processing is carried out by that a syndrome other than $S_I$ is newly input into said H" multiplication processing step, and when $S_I \neq 0$ and said syndrome other than $S_I$ is 0, a detection signal is output, $S_I$ is newly input into said error vector generating processing step over $GF(2^b)$, said error vector generating processing step over $GF(2^b)$ checks whether the number of erroneous bytes is 1 in the error e' over $GF(2^r)$ or not, and said multi-input sorting processing step checks whether Hamming weight of $S_I$ is larger than $\mu_1 t$ or not.

BRIEF DESCRIPTION OF THE DRAWINGS

FIG. 3 is a diagram illustrating one example of parity check matrix according to the present invention, i.e. a parity check matrix of a shortened (90,64) $[4_{1/8}EC]_2$ code having code parameters such that code-length N=90 bits, information-length K=64 bits, check-length R=26 bits, byte-length b=8 bits, the number of correctable bits within a byte t=1 bit, the number of correctable spotty byte errors is equal to that of detectable spotty byte errors, that is, $\mu_1=\mu_2=4$, and the maximum number of erroneous bytes $p_1=p_2=2$;

FIG. 19 is a configuration diagram illustrating a 12-inputs sorting circuit in the error vector generating circuit over $GF(2^b)$ shown in FIG. 15;

DESCRIPTION OF REFERENCE NUMERALS

Figure 1:
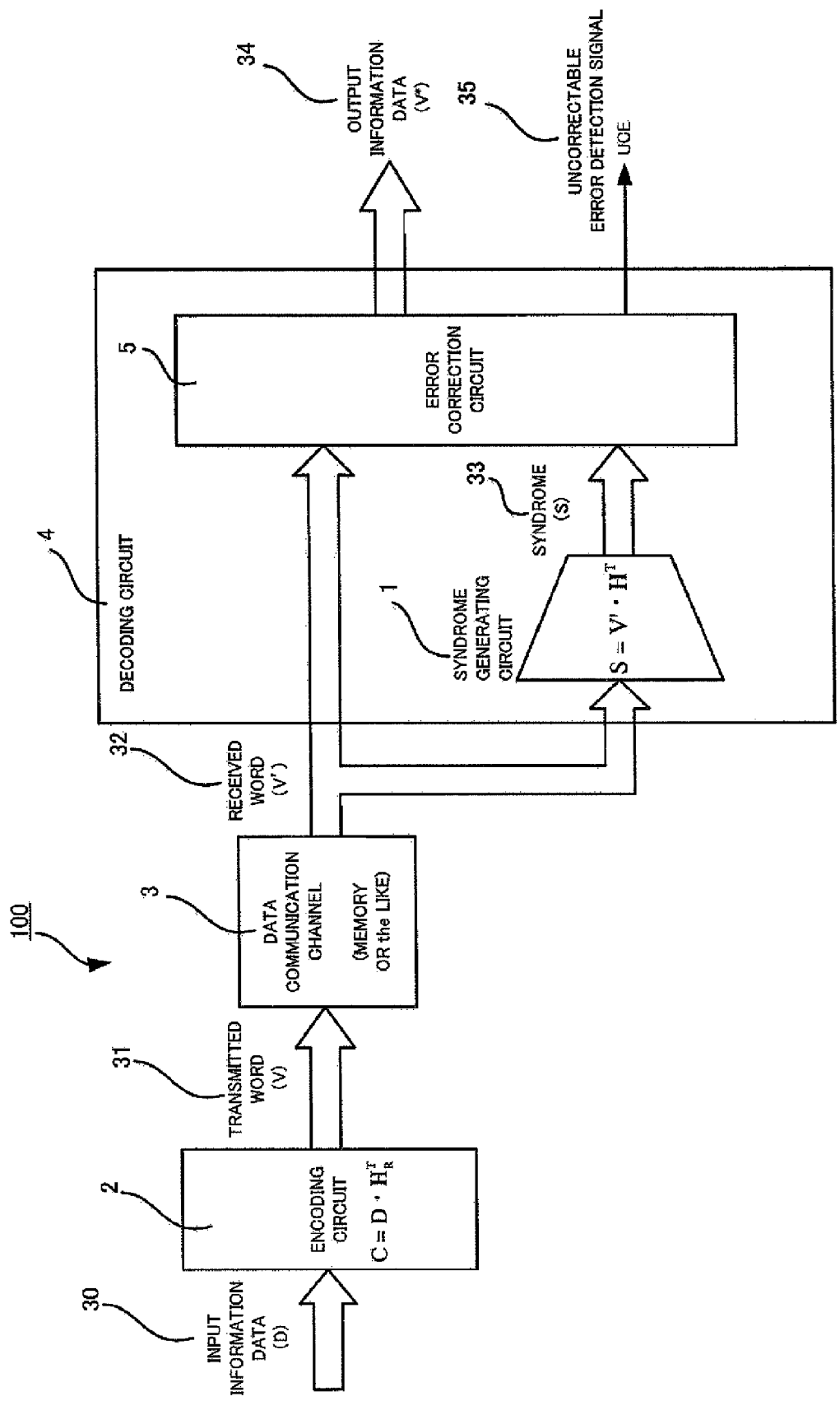
FIG. 1 is a block diagram illustrating a schematic constitution of an apparatus for correcting and detecting multiple spotty-byte errors within a byte occurred in a limited number of bytes according to a preferred embodiment of the present invention.

1 Syndrome generating circuit
2 Encoding circuit
3 Circuit (data communication channel such as memory or the like)
4 Decoding circuit
5 Error correction circuit
6 H' decoding circuit
7 H" multiplication circuit
8 Parallel decoding circuit over $GF(2^r)$
9 Error vector generating circuit over $GF(2^b)$
10 Inverting circuit
20 Multi-input parity check circuit
21 Multi-input parity check circuit
22 2-input exclusive logical sum circuit
23 3-input parity check circuit
30 Input information data
31 Transmitted word
32 Received word
33 Syndrome(S)
34 Output information data
35 Uncorrectable error detection signal (UCE)
36 Upper q bits ($S_I$) on syndrome (S) 33
37 Lower 3r bits ($S_{II}S_{III}S_{IV}$) on syndrome (S) 33
38 Byte-by-byte sum of errors ($e_A$)
39 Product ($S'_I$) of upper q bits $S_I$ 36 on syndrome (S) 33 and transposed matrix ($H''^T$) of matrix H"
40 Bit-error pointer over $GF(2^r)$
41 Uncorrectable error detection signal (DS(0))
42 Bit-error pointer over $GF(2^b)$
43 Uncorrectable error detection signal (DS(1))
44 2-input AND gate circuit
50 Error vector generating circuit for (i,j)
51 Error vector calculating circuit over $GF(2^r)$
52 Error for (i,j)
53 Correctable signal for (i,j)
54 24-input OR gate circuit
55 66-input NOR gate circuit 56 2-input AND gate circuit
60 $S' \cdot \tilde{H}_i^{\dagger T}$ calculating circuit
61 $S' \cdot \tilde{H}_j^{\dagger T}$ calculating circuit
62 $S' \cdot B_{(i,j)}^{\dagger T}$ calculating circuit
63 Multi-input parity check circuit
64 Multi-input parity check circuit
65 Multi-input parity check circuit
66 12-input NOR gate circuit
67 2-input AND gate circuit
68 Bit-by-bit OR arithmetic circuit
69 11-input OR gate circuit
70 t-bit error correction decoding circuit
71 Bit-error pointer (ê) produced by the decoder
72 Detection signal in i-th byte
73 12-input sorting circuit
74 Miscorrection determining circuit in i-th byte
75 2-input OR gate circuit
76 2-input AND gate circuit
80 NOT gate circuit
81 3-input AND gate circuit
82 4-input AND gate circuit
83 5-input AND gate circuit
84 5-input OR gate circuit
85 6-input OR gate circuit
86 15-input OR gate circuit
90 Bit-by-bit exclusive logical sum circuit
91 16-input sorting circuit
92 4-input OR gate circuit
93 12-input NOR gate circuit
94 NOT gate circuit
95 3-input AND gate circuit
96 Bit-by-bit selection circuit
97 Multi-input parity check circuit
98 2-input multiplexer circuit
99 2-input exclusive logical sum circuit
100 apparatus for correcting and detecting multiple spotty-byte errors within a byte occurred in a limited number of bytes

THE BEST MODE FOR CARRYING OUT THE INVENTION

The best mode for carrying out the present invention is explained in detail below with reference to the drawings.

Terms for explaining the present invention are defined as follows. In the embodiment of the present invention, intended digital data are signals in which 0 and 1 are combined (binary codes), and "occurrence of bit error" means that any bit within a code word is changed from 0 into 1 or from 1 into 0. "occurrence of spotty-byte error" means that t bits within a byte composed of b bits (t≦b) is changed from 0 into 1 or from 1 into 0.

In the embodiment, "error" includes all "bit error" and "spotty-byte error" unless otherwise specified. An error such that a plurality of spotty-byte errors occurred within a byte (namely, two or more spotty-byte errors) is called "multiple spotty-byte errors within a byte". Further, when the multiple spotty-byte errors within a byte occurred in a limited number of bytes, we call such errors as "multiple spotty-byte errors within a byte occurred in a limited number of bytes".

Here, we first explain the whole constitution of an apparatus for correcting and detecting multiple spotty-byte errors within a byte occurred in a limited number of bytes 100 according to the present invention. FIG. 1 is a block diagram illustrating a schematic constitution of the apparatus for correcting and detecting multiple spotty-byte errors within a byte occurred in a limited number of bytes 100 according to the present invention (herein after, abbreviated as the spotty-byte error correction and detection apparatus 100). As shown in FIG. 1, the spotty-byte error correction and detection apparatus 100 comprises an encoding circuit 2, a circuit 3, a decoding circuit 4 and the like.

The encoding circuit 2 generates check information for intended digital data (herein after, referred to as input information data 30). The check information executes correction and detection of errors and is composed of any number of check bits.

The circuit 3 corresponds to a data communication channel such as a memory or the like, and in this embodiment, there is a possibility that data through the circuit 3 includes errors. That is, an error does not occur in the data which is output from the encoding circuit 2 and input into the circuit 3, while an error occasionally occurs in the data which is output from the circuit 3.

The decoding circuit 4 comprises a syndrome generating circuit 1 and an error correction circuit 5. The decoding circuit 4 detects whether a received word 32 includes an error, and identifies the error location to correct it. The concrete configuration of the decoding circuit 4 is explained in a decoding process, mentioned later.

In an encoding process and the decoding process, mentioned later, since matrix operation is performed based on the theory concerning to Galois field, the respective data in the encoding circuit 2, the decoding circuit 4 and the data communication channel is expressed by matrix of alphabetical character or vector. Concretely, for example, these data are expressed as input information data D, code (parity check matrix) H, check information C, transmitted word V, received word V' and syndrome S.

Figure 2:
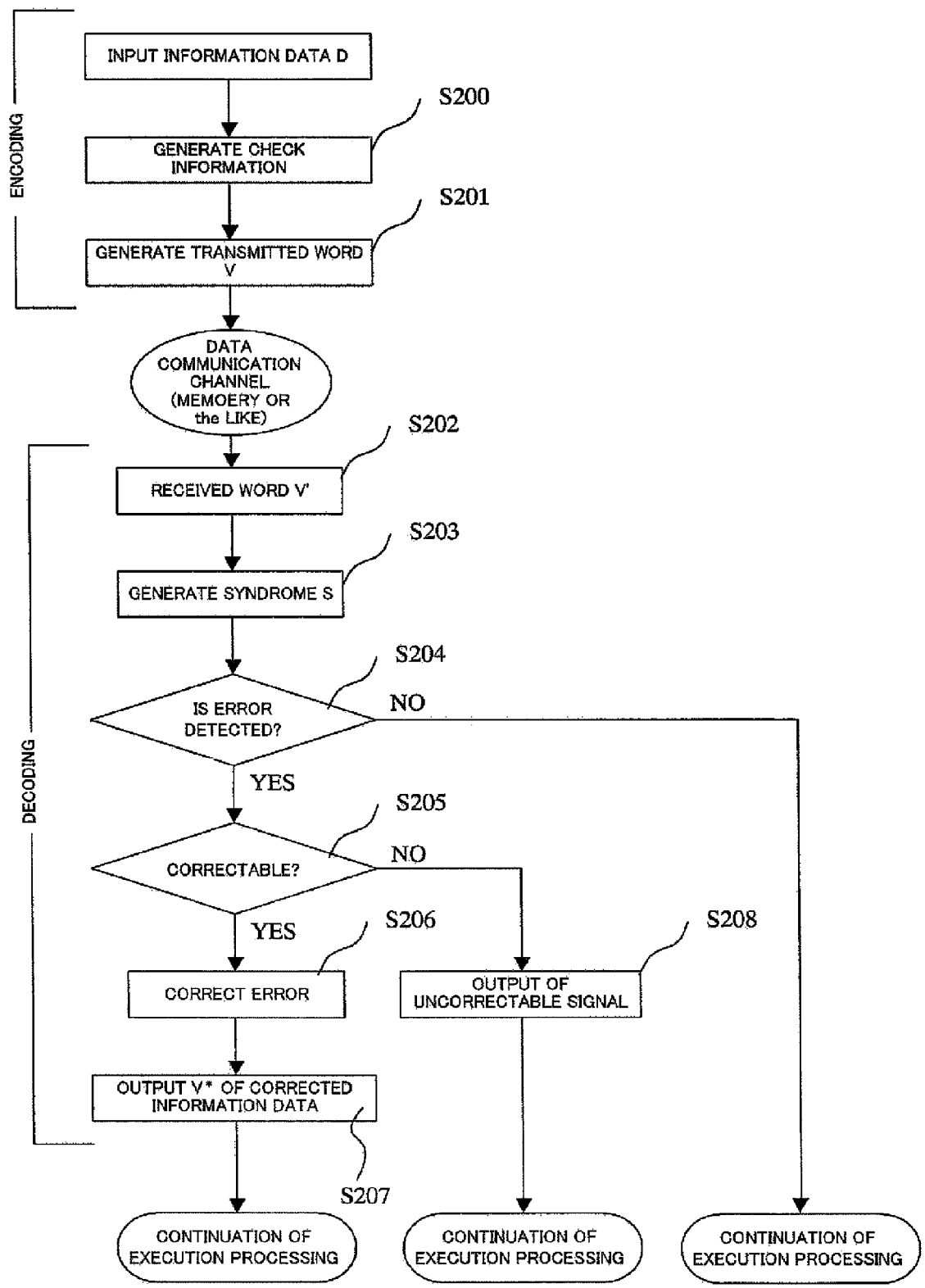
FIG. 2 is a flowchart illustrating processing procedure of entire operation in the apparatus for correcting and detecting multiple spotty-byte errors within a byte occurred in a limited number of bytes according to the present invention shown in FIG. 1.

Next, the entire operation of the spotty-byte error correction and detection apparatus 100 of the present invention is explained below. FIG. 2 is a flowchart illustrating processing procedure of the entire operation of the spotty-byte error correction and detection apparatus 100 according to the present invention shown in FIG. 1.

As shown in FIG. 2, when the input information data (D) 30 is input into the encoding circuit 2, the encoding circuit 2 generates check information (C) using a parity check matrix (H), mentioned in detail later (step S200). Then, the encoding circuit 2 adds the check information (C) to the input information data (D) 30, and transmits it as a transmitted word (V) 31 to the circuit 3 as the data communication channel such as a memory or the like (step S201). A received word (V') 32 through the circuit 3, which possibly includes an error, is input into the decoding circuit 4 (step S202).

Next, the decoding circuit 4 checks whether an error occurred in the input received word (V') 32 by using the parity check matrix (H) which is used in the encoding circuit 2. Concretely, the syndrome generating circuit 1 of the decoding circuit 4 generates a syndrome (S) by multiplying the received word (V') 32 by a transposed matrix (HT) obtained by transposing the parity check matrix (H) expressing code (Step S203). Since the value of the syndrome (S) 33 changes depending on the received word (V') 32, it is possible to determine whether the received word (V') 32 includes an error.

The error correction circuit 5 of the decoding circuit 4 detects existence or nonexistence of an error based on the value of the syndrome (S) 33 (step S204), and determines whether the error can be corrected in the case of detecting an error (step S205). When the error can be detected as a result of the determination, the error correction circuit 5 corrects the error (step S206). Then, when the error correction circuit 5 gives a correction process of spotty-byte error to the received word V', it outputs the corrected received word V' as received word output information data (V*) 34 (step S207). On the contrary, as a result of the determination at step S205, when an uncorrectable spotty-byte error or the like is detected, the error correction circuit 5 outputs an UCE (Uncorrectable Error) signal 35 as an uncorrectable error detection signal (step S208).

The constitution of the parity check matrix (H) to be used in the encoding circuit 2 and the decoding circuit 4 is explained in detail below. The parity check matrix H of the present invention (herein after, also referred to as H matrix, code matrix or simply check matrix) is a code with a function of correcting and detecting multiple spotty-byte errors occurred in a limited number of bytes.

This embodiment describes general code structuring method capable of structuring for any $p_1$, $p_2$ ($p_1 \leq p_2$), $\mu_1$, $\mu_2$ ($\mu_1 \leq \mu_2$), t (t is an integer that is 1 or more but not exceeding b) and b (b is an integer that is 2 or more), a method of capable of actually correcting and detecting errors using the codes, the encoding circuit and the decoding circuit to be used in the method, and that the encoding circuit and the decoding circuit can correct and detect errors concretely.

Concretely, the following shows that $\mu_1$ spotty-byte errors occurred in $p_1$ bytes can be corrected, and 2 spotty-byte errors occurred in $p_2$ bytes can be detected.

"An error control code for controlling multiple spotty-byte errors within a byte occurred in a limited number of bytes" with a function of correcting $\mu_1$ spotty-byte errors occurred in $P_1$ bytes and detecting $\mu_2$ spotty-byte errors occurred in $p_2$ bytes, is expressed as $[\mu_1 t/bEC]_{p_1} - [\mu_2 t/bED]_{p_2}$ code. For example, in the case of a code for correcting 3 spotty-byte errors occurred in 2 bytes, the code is expressed as $[T_{t/b}EC]2$ code, and $\mu_1 = \mu_2 = 3$, $p_1 = p_2 = 2$.

Further, in the code structuring method of the present invention, if t=b, as will herein after be described in detail, namely, if $t \geq b/\lfloor (\mu_1+\mu_2)/2 \rfloor$, the code constructed by the present invention corresponds with the Reed-Solomon code (RS code) that is a conventional byte error control code.

When the check information (C) of R bits is added to the input information data (D) 30 of K bits and thus a transmitted word (V) (row vector of N bits) with a length of N=K+R bits for satisfying a certain function can be constructed, a relationship $V \cdot H^T = 0$ holds between the transmitted word (V) and a binary parity check matrix (H) of R rows and N columns for defining the error control code. Where, $H^T$ is a transposed matrix obtained by transposing row and column of the parity check matrix (H). 0 on the right-hand side of the relationship $V \cdot H^T = 0$, represents an all 0 row vector of R bits.

In this embodiment, the parity check matrix (H) of R rows and N columns which is used for the error control code for controlling multiple spotty-byte errors within a byte occurred in a limited number of bytes with a function of correcting $\mu_1$ spotty-byte errors occurred in $p_1$ bytes and detecting $\mu_2$ spotty-byte errors occurred in $p_2$ bytes ($[\mu_1 t/bEC]_{p_1} - [\mu_2 t/bED]_{p_2}$ code), has a constitution as expressed by the following Expression 1.

where $R = q + (p_1 + p_2 - 1)r$, $N = bn$, $0 \leq i \leq n-1$ and $n = 2^r - 1$ hold.

The matrix H' constituting the Expression 1 is a binary matrix of q rows and b columns ($q \leq b$) composed of q-dimensional column vector $h_j'$ ($0 \leq j \leq b-1$) shown in the following Expression 2, and plural columns whose number is larger than or equal to either smaller one of $(\mu_1+\mu_2)t$ and b are linearly independent.

$$H' = [h_0', h_1', \ldots, h_{b-1}'] \quad \text{[Expression 2]}$$

if $(\mu_1+\mu_2)t \geq b$, the matrix H' is a nonsingular matrix including an identity matrix, and if $(\mu_1+\mu_2)t < b$, the matrix H' is equal to a check matrix of a code having a minimum Hamming distance $(\mu_1+\mu_2)t+1$, namely, a parity check matrix of a (b,b−q) code with a function of detecting $(\mu_1+\mu_2)t$ bits error.

The matrix H'' constituting the Expression 1 is a binary matrix having r rows and b columns ($r \leq b$) composed of r-dimensional column vector $h_j''$ ($0 \leq j \leq b-1$) shown in the following Expression 3, and plural columns whose number is larger than or equal to either smaller one of $\lfloor (\mu_1+\mu_2)/2 \rfloor t$ and b are linearly independent. $\lfloor x \rfloor$ represents a maximum integer which does not exceed x.

$$H'' = [h_0'', h_1'', \ldots, h_{b-1}''] \quad \text{[Expression 3]}$$

if $\lfloor (\mu_1+\mu_2)/2 \rfloor t \geq b$, the matrix H'' is a nonsingular matrix including an identity matrix, and if $\lfloor (\mu_1+\mu_2)/2 \rfloor t < b$, the matrix H'' is equal to a check matrix of a code having a minimum Hamming distance $\lfloor (\mu_1+\mu_2)/2 \rfloor t+1$, namely, a parity check matrix of a (b,b−r) code with a function of detecting $\lfloor (\mu_1+\mu_2)/2 \rfloor t$ bits error.

When γ is a primitive element of an r-th degree extension field $GF(2^r)$ of GF(2), $\gamma^i H''$ can be defined by the following Expression 4.

$$\gamma^i H'' = [\gamma^i h_0'', \gamma^i h_1'', \ldots, \gamma^i h_{b-1}''] \quad \text{[Expression 4]}$$

In this case, a maximum code length N is $N = b(2^r - 1)$

In the case of parameter $t \geq b/\lfloor (\mu_1+\mu_2)/2 \rfloor$, since H' and H'' become matrices where any b columns are linearly independent, the parity check matrix (H) shown in the Expression 1 corresponds with a parity check matrix of a conventional $p_1$ correction $p_2$ detection RS code with a function of correcting $p_1$ bytes error and detecting $p_2$ bytes error.

In this embodiment, a lengthened code of $[\mu_1 t/bEC]_{p_1} - [\mu_2 t/bED]_{p_2}$ code can be defined. A parity check matrix (H) of R rows and N columns which is used for a lengthened error control code for controlling multiple spotty-byte errors within a byte occurred in a limited number bytes with a function of correcting $\mu_1$ spotty-byte errors occurred in $p_1$ bytes and detecting $\mu_2$ spotty-byte errors occurred in $p_2$ bytes (lengthened $[\mu_1 t/bEC]_{p_1} - [\mu_2 t/bED]_{p_2}$ code) can be constituted as shown in the following Expression 5.

$$H = \begin{bmatrix} H' & H' & \cdots & H' & \cdots & H' \\ \gamma^0 H'' & \gamma^1 H'' & \cdots & \gamma^i H'' & \cdots & \gamma^{n-1} H'' \\ \gamma^0 H'' & \gamma^2 H'' & \cdots & \gamma^{2i} H'' & \cdots & \gamma^{2(n-1)} H'' \\ \vdots & \vdots & \ddots & \vdots & \ddots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' \end{bmatrix} \quad \text{[Expression 1]}$$

$$H = \begin{bmatrix} H' & H' & \ldots & H' & \ldots & H' & H' & O_{q \times r'} \\ \gamma^0 H'' & \gamma^1 H'' & \ldots & \gamma^i H'' & \ldots & \gamma^{n-1} H'' & O_{r' \times b} & O_{r' \times r'} \\ \gamma^0 H'' & \gamma^2 H'' & \ldots & \gamma^{2i} H'' & \ldots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' & O_{r' \times b} & I_{r'} \end{bmatrix}$$ [Expression 5]

where $r' \geq r$, $R = q + (p_1 + p_2 - 1)r'$, $N = b(n+1) + r'$, $0 \leq i \leq n-1$ and $n = 2^{r'} - 1$ hold. $I_{r'}$ is a r' by r' identity matrix, and O is a zero matrix.

The matrix H' constituting the Expression 5 is a binary matrix of q rows and b columns ($q \leq b$) composed of q-dimensional column vector $h_j'$ ($0 \leq j \leq b-1$) shown in the following Expression 6, and plural columns whose number is larger than or equal to either smaller one of $(\mu_1 + \mu_2)$ t and b are linearly independent.

$$H' = [h_0', h_1', \ldots, h_{b-1}']$$ [Expression 6]

if $(\mu_1 + \mu_2)t \geq b$, the matrix H' is a nonsingular matrix including an identity matrix, and if $(\mu_1 + \mu_2)t < b$, the matrix H' is equal to a check matrix of a code having a minimum Hamming distance $(\mu_1 + \mu_2)$ t+1, namely, a parity check matrix of a (b,b-q) code with a function of detecting $(\mu_1 + \mu_2)$t bits error.

The matrix H" constituting the Expression 5 is a binary matrix of r rows and b columns ($r \leq b$) composed of r-dimensional column vector $h_j''$ ($0 \leq j \leq b-1$) shown in the following Expression 7, and plural columns whose number is larger than or equal to either smaller one of $\lfloor (\mu_1 + \mu_2)/2 \rfloor$t and b are linearly independent. $\lfloor x \rfloor$ represents a maximum integer which does not exceed x.

$$H'' = [h_0'', h_1'', \ldots, h_{b-1}'']$$ [Expression 7]

if $\lfloor (\mu_1 + \mu_2)/2 \rfloor t \geq b$, the matrix H" is a nonsingular matrix including an identity matrix, and $\lfloor (\mu_1 + \mu_2)/2 \rfloor t < b$, the matrix H" is equal to a check matrix of a code having a minimum Hamming distance $\lfloor (\mu_1 + \mu_2)/2 \rfloor t + 1$, namely, a parity check matrix of a (b,b-r) code with a function of detecting $\lfloor (\mu_1 + \mu_2)/2 \rfloor t$ bits error.

When γ is a primitive element of an r'-th degree extension field $GF(2^{r'})$ of GF(2), $\gamma^i H''$ can be defined by the following Expression 8.

$$\gamma^i H'' = [\gamma^i \Phi(h_0''), \gamma^i \Phi(h_1''), \ldots, \gamma^i \Phi(h_{b-1}'')]$$ [Expression 8]

Where, Φ is an injective homomorphism from $GF(2^r)$ to $GF(2^{r'})$ under addition, namely, Φ is achieved effectively by $GF(2^r) \to GF(2^{r'})$. In this case, the maximum code length N is $b \cdot 2^{r'} + r'$. Attention should be paid to that the number of rows r' of H" to be used for the second and lower rows of H shown in the Expression 5 can obtain a value larger than r, and the code expressed by the Expression 5 can be constructed for an arbitrary code length by increasing the number of check bits by $(\mu_1 + \mu_2 - 1)$ bits.

In the case of parameter $t \geq b/\lfloor (\mu_1 + \mu_2)/2 \rfloor$, since H' and H" become matrices where any b columns are linearly independent, the parity check matrix (H) shown in the Expression 5 corresponds with a parity check matrix of a conventional $p_1$ correction $p_2$ detection doubly lengthened RS code with a function of correcting $p_1$ bytes error and detecting $p_2$ bytes error.

The following concretely shows that the code expressed by the parity check matrix (H) shown in the Expression 1 corrects $\mu_1$ spotty-byte errors occurred in $p_1$ bytes and detects $\mu_2$ spotty-byte errors occurred in $p_2$ bytes. In general, the parity check matrix $H = [H_0, H_1, \ldots, H_{n-1}]$ should satisfy the following necessary and sufficient conditions. Where, $H_i$ is an R×b submatrix.

$$e_{i_1} \cdot H_{i_1}^T + \ldots + e_{i_{v_1}} \cdot H_{i_{v_1}}^T +$$ [Expression 9]
$$e_{i_{v_1+1}} \cdot H_{i_{v_1+1}}^T + \ldots + e_{i_{v_1+v_2}} \cdot H_{i_{v_1+v_2}}^T + \ldots +$$
$$e_{i_{v_1+v_2+\ldots+v_{\lambda-1}+1}} \cdot H_{i_{v_1+v_2+\ldots+v_{\lambda-1}+1}}^T + \ldots +$$
$$e_{i_{v_1+v_2+\ldots+v_\lambda}} \cdot H_{i_{v_1+v_2+\ldots+v_\lambda}}^T \neq 0$$

$$0 < \sum_{x=1}^{v_1+\ldots+v_\lambda} w_M(e_{i_x}) \leq \mu_1 + \mu_2, \ 0 < \sum_{x=1}^{\lambda} v_x \leq p_1 + p_2$$

$$0 \leq v_1 \leq p_1 + p_2,$$
$$0 \leq v_2 \leq \min(\lfloor (\mu_1 + \mu_2)/2 \rfloor, p_1 + p_2), \ldots,$$
$$0 \leq v_\lambda \leq \min(\lfloor (\mu_1 + \mu_2)/\lambda \rfloor, p_1 + p_2)$$

Where, $e_{i_x}$ represents the $i_x$-th byte in an error vector e, $\lambda = \lceil b/t \rceil$, $\lfloor y \rfloor$ represents a maximum integer which is y or less, and $\lceil z \rceil$ represents a minimum integer which is z or more.

Further, $i_1, i_2, \ldots, i_{v_1+v_2+\ldots+v_\lambda}$ ($0 \leq i_1, i_2, \ldots, i_{v_1+v_2+\ldots+v_\lambda} \leq n-1$) are all different from one another, and $w_M(e)$ is defined by the following Expression 10 and represents the number of spotty-byte error. $w_H(e_i)$ is a Hamming weight over Galois field GF(2) in a vector $e_i$.

$$w_M(e) = \sum_{i=0}^{n-1} \left\lceil \frac{w_H(e_i)}{t} \right\rceil$$ [Expression 10]

The spotty-byte errors correcting and detecting are executed by using the syndrome (S) 33 generated by the syndrome generating circuit 1. The relationship between the syndrome (S) 33 and the parity check matrix (H) is expressed by $S = V' \cdot H^T$. When the received word (V') 32 includes an error (E) for original transmitted word (V) 31 and the received word (V') is expressed by V'=V+E, the syndrome (S) 33 becomes $S = V' \cdot H^T = (V+E) H^T = V \cdot H^T + E \cdot H^T$.

Since the relationship $V \cdot H^T = 0$ holds as mentioned above, in the end, the syndrome S satisfies a relationship $S = E \cdot H^T$. That is, since the syndrome (S) 33 is determined only by the error (E) without being influenced by the transmitted word (V) 31, a determination on whether the spotty-byte error can be corrected based on the syndrome (S) 33, can be made in accordance with the value of E·HT calculated from the parity check matrix (H) and the error (E).

The necessary and sufficient condition expressed by the Expression 9 shows that the syndrome of all correctable and detectable multiple spotty-byte errors within a byte is different from the syndrome of all other correctable multiple spotty-byte errors within a byte with respect to the correcting-number $\mu_1$ and the detecting-number $\mu_2$ of the spotty-byte errors.

That is, the syndrome of the multiple spotty-byte errors within a byte whose number is $\mu_2$ or less and which occurred in $p_2$ or less bytes should be different from the syndrome of the other multiple spotty-byte errors within a byte whose number is $\mu_1$ or less and which occurred in $p_1$ or less bytes.

A set of $l_1$ ($l_1 \leq \mu_1$) spotty-byte errors occurred in $\rho_1$ ($\rho_1 \leq p_1$) bytes is designated as $$\Omega_i = \{e_{i_1}, e_{i_2}, \ldots, e_{i_{\rho_1}}\}.$$

Where, $w_M(e_{i_x}) \leq \lambda$ and $$\sum_{x=1}^{\rho_1} w_M(e_{i_x}) = l_1$$

Further, a set of $l_2$ ($l_2 \leq \mu_2$) spotty-byte errors occurred in $\rho_2$ ($\rho_2 \leq p_2$) bytes is designated as $$\Omega_j = \{e_{j_1}, e_{j_2}, \ldots, e_{j_{\rho_2}}\}.$$

Where, $w_M(e_{j_x}) \leq \lambda$ and $$\sum_{x=1}^{\rho_2} w_M(e_{j_x}) = l_2$$

In this case, $[\mu_1 t/bEC]_{p_1} - [\mu_2 t/bED]_{p_2}$ code satisfies the relationship expressed by the following Expression 11 in error pattern of $\Omega_i$ and $\Omega_j$.

$$e_{i_1} \cdot H_{i_1}^T + e_{i_2} \cdot H_{i_2}^T + \ldots + e_{i_{\rho_1}} \cdot H_{i_{\rho_1}}^T \neq \quad \text{[Expression 11]}$$
$$e_{j_1} \cdot H_{j_1}^T + e_{j_2} \cdot H_{j_2}^T + \ldots + e_{j_{\rho_2}} \cdot H_{j_{\rho_2}}^T$$

Some of spotty-byte errors of $\Omega_i$ and $\Omega_j$ occurred in the same byte. In V ($0 \leq V \leq p_1$) bytes, If errors occurred in the same byte, the following Expression 12 can be obtained.

$$e_{i_1} \cdot H_{i_1}^T + e_{i_2} \cdot H_{i_2}^T + \ldots + \quad \text{[Expression 12]}$$
$$e_{i_V} \cdot H_{i_V}^T + e_{i_{V+1}} \cdot H_{i_{V+1}}^T + \ldots + e_{i_{\rho_1}} \cdot H_{i_{\rho_1}}^T \neq$$
$$e_{j_1} \cdot H_{j_1}^T + e_{j_2} \cdot H_{j_2}^T + \ldots + + e_{j_V} \cdot H_{j_V}^T +$$
$$e_{j_{V+1}} \cdot H_{j_{V+1}}^T + \ldots + e_{j_{\rho_2}} \cdot H_{j_{\rho_2}}^T$$

Therefore, the following Expression 13 can be obtained from the Expression 12.

$$(e_{i_1} + e_{j_1}) \cdot H_{i_1}^T + (e_{i_2} + e_{j_2}) \cdot H_{i_2}^T + \ldots + \quad \text{[Expression 13]}$$
$$(e_{i_V} + e_{j_V}) \cdot H_{i_V}^T + e_{i_{V+1}} \cdot H_{i_{V+1}}^T + \ldots + e_{i_{\rho_1}} \cdot H_{i_{\rho_1}}^T +$$
$$e_{j_V} \cdot H_{j_V}^T + e_{j_{V+1}} \cdot H_{j_{V+1}}^T + \ldots + e_{j_{\rho_2}} \cdot H_{j_{\rho_2}}^T \neq 0$$

Where, $w_M(e_{i_x} + e_{j_x}) \leq \lambda$ holds with respect to $x = 1, 2, \ldots, V$. In the Expression 13, when $(e_{i_x} + e_{j_x})$ is replaced by $e_{i_x}$ and $\rho_1 + \rho_2 - V = v_1 + v_1 + \ldots + v_\lambda$ is premised, the necessary and sufficient condition shown in the Expression 9 holds.

Therefore, the code expressed by the parity check matrix shown in the Expression 1 satisfies the necessary and sufficient condition shown in the Expression 9, so that $\mu_1$ spotty-byte errors occurred in $p_1$ bytes are corrected and $\mu_2$ spotty-byte errors occurred in $p_2$ bytes are detected. This is concretely explained below.

It is premised that the relationship expressed by the following Expression 14 holds as the syndrome S.

$$e_{i_1} \cdot \begin{bmatrix} H' \\ \gamma^{i_1} H'' \\ \gamma^{2i_1} H'' \\ \vdots \\ \gamma^{(p_1+p_2-1)i_1} H'' \end{bmatrix}^T + \ldots + \quad \text{[Expression 14]}$$

$$e_{i_{v_1+1}} \cdot \begin{bmatrix} H' \\ \gamma^{i_{v_1+1}} H'' \\ \gamma^{2i_{v_1+1}} H'' \\ \vdots \\ \gamma^{(p_1+p_2-1)i_{v_1+1}} H'' \end{bmatrix}^T + \ldots e_{i_{v_1+v_2+\ldots+v_\lambda}} \cdot$$

$$\begin{bmatrix} H' \\ \gamma^{i_{v_1+v_2+\ldots+v_\lambda}} H'' \\ \gamma^{2i_{v_1+v_2+\ldots+v_\lambda}} H'' \\ \vdots \\ \gamma^{(p_1+p_2-1)i_{v_1+v_2+\ldots+v_\lambda}} H'' \end{bmatrix}^T = \begin{bmatrix} 0 \\ 0 \\ 0 \\ \vdots \\ 0 \\ 0 \end{bmatrix}^T$$

In $$\left( \sum_{y=1}^{v_1+v_2+\ldots+v_\lambda} e_{i_y} \right) \cdot H'^T = 0$$

of the Expression 14, since H' is a matrix where any $\text{Min}((\mu_1 + \mu_2)t, b)$ columns are linearly independent, the following Expression 15 can be obtained.

$$\sum_{y=1}^{v_1+v_2+\ldots+v_\lambda} e_{i_y} = 0 \quad \text{[Expression 15]}$$

In the Expression 15, when the both sides are multiplied by $H''^T$ from the right, the following Expression 16 can be obtained.

$$\left( \sum_{y=1}^{v_1+v_2+\ldots+v_\lambda} e_{i_y} \right) \cdot H''^T = 0 \quad \text{[Expression 16]}$$

In the Expression 14 and the Expression 16, when $e_{i_1} \cdot H''^T$, $$e_{i_2} \cdot H''^T, \ldots, e_{i_{v_1+v_2+\ldots+v_\lambda}} \cdot H''^T$$

$\cdot H''^T$ are designated as $x_1, x_2, \ldots, x_{v_1+v_2+\ldots+v_\lambda}$ respectively, the following Expression 17 can be obtained. Since H'' is a matrix where any $\text{Min}(\lfloor(\mu_1+\mu_2)/2\rfloor t, b)$ columns are linearly independent, then $x_1 \neq 0, x_2 \neq 0, \ldots,$ or $$x_{v_1+v_2+\ldots+v_{\lfloor(\mu_1+\mu_2)/2\rfloor}} \neq 0$$

holds.

[Expression 17]

$$\begin{cases} x_1 + x_2 + \ldots + x_{v_1+v_2+\ldots+v_\lambda} = 0 \\ \gamma^{i_1} x_1 + \gamma^{i_2} x_2 + \ldots + \gamma^{i_{v_1+v_2+\ldots+v_\lambda}} x_{v_1+v_2+\ldots+v_\lambda} = 0 \\ \gamma^{2i_1} x_1 + \gamma^{2i_2} x_2 + \ldots + \gamma^{2i_{v_1+v_2+\ldots+v_\lambda}} x_{v_1+v_2+\ldots+v_\lambda} = 0 \\ \ldots \\ \gamma^{(p_1+p_2-1)i_1} x_1 + \gamma^{(p_1+p_2-1)i_2} x_2 + \ldots + \gamma^{(p_1+p_2-1)i_{v_1+v_2+\ldots+v_\lambda}} x_{v_1+v_2+\ldots+v_\lambda} = 0 \end{cases}$$

In the Expression 17, when $v_1+v_2+\ldots+v_\lambda$ ($\leq p_1+p_2$) expressions from top are expressed by matrix, the following Expression 18 is obtained.

[Expression 18]

$$\begin{bmatrix} 1 & 1 & \ldots & 1 \\ \gamma^{i_1} & \gamma^{i_2} & \ldots & \gamma^{i_{v_1+v_2+\ldots+v_\lambda}} \\ \gamma^{2i_1} & \gamma^{2i_2} & \ldots & \gamma^{2i_{v_1+v_2+\ldots+v_\lambda}} \\ \vdots & \vdots & \ddots & \vdots \\ \gamma^{(v_1+v_2+\ldots+v_\lambda-1)i_1} & \gamma^{(v_1+v_2+\ldots+v_\lambda-1)i_2} & \ldots & \gamma^{(v_1+v_2+\ldots+v_\lambda-1)i_{v_1+v_2+\ldots+v_\lambda}} \end{bmatrix} \begin{bmatrix} x_1 \\ x_2 \\ x_3 \\ \vdots \\ x_{v_1+v_2+\ldots+v_\lambda} \end{bmatrix} = \begin{bmatrix} 0 \\ 0 \\ 0 \\ \vdots \\ 0 \end{bmatrix}$$

Since the matrix of $v_1+v_2+\ldots+v_\lambda$ rows and $v_1+v_2+\ldots+v_\lambda$ columns shown in the Expression 18 is a Vandermonde matrix, it is a nonsingular matrix. Therefore, both-hand sides of the Expression 18 are multiplied by an inverse matrix of this matrix from left, the following Expression 19 is obtained.

[Expression 19]

$$\begin{bmatrix} x_1 \\ x_2 \\ x_3 \\ \vdots \\ x_{v_1+v_2+\ldots+v_\lambda} \end{bmatrix} = \begin{bmatrix} 0 \\ 0 \\ 0 \\ \vdots \\ 0 \end{bmatrix}$$

In the Expression 19, $x_1=0, x_2=0, \ldots, x_{v_1+v_2+\ldots+v_\lambda}=0$ holds, and thus the Expression 19 contradicts $x_1 \neq 0, x_2 \neq 0, \ldots,$ $$x_{v_1+v_2+\ldots+v_{\lfloor(\mu_1+\mu_2)/2\rfloor}} \neq 0$$

which is a premise. Therefore, the code expressed by the Expression 1 satisfies the necessary and sufficient condition expressed by the Expression 9.

Therefore, from the result of the proof that mentioned above, it is proved that the parity check matrix (H) expressed by the Expression 1 has the function of correcting $\mu_1$ spotty-byte errors occurred in $p_1$ bytes which is included in the received word (V') 32 and detecting $\mu_2$ spotty-byte errors occurred in $p_2$ bytes which is included in the received word (V') 32.

Similarly, the lengthened code expressed by the parity check matrix (H) shown in the Expression 5 also satisfies the necessary and sufficient condition shown in the Expression 9, thereby correcting $\mu_1$ spotty-byte errors occurred in $p_1$ bytes and detecting $\mu_2$ spotty-byte errors occurred in $p_2$ bytes.

The parity check matrix (H) shown in the Expression 1 can be constructed by giving the specific code parameters. This parity check matrix (H) is merely an example, and thus it goes without saying that the present invention is not limited to this.

In a memory system using the memory chip having 8 bits as reading/writing data width, the parameters such that b=8, t=1, $\mu_1=\mu_2=4$ and $p_1=p_2=2$ are given and single-bit error within a byte is assumed as the spotty-byte error, so that the parity check matrix (H) of $[4_{1/8}/EC]_2$ code with the function of correcting 4 or fewer multiple spotty-byte errors within a byte (in this example, bit error) occurred in one or two bytes, is constructed.

In this case, according to $\text{Min}((\mu_1+\mu_2)t,b)=\text{Min}(8,8)=8$, a matrix where any 8 columns are linearly independent should be constructed as the matrix H'. As this example, 8×8 (8 rows and 8 columns) identity matrix shown in the following Expression 20 should be constructed.

$$H' = I_8 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$ [Expression 20]

According to $\text{Min}(\lfloor(\mu_1+\mu_2)/2\rfloor t, b) = \text{Min}(4,8) = 4$, a check matrix of quadruple-bit error detection code where any 4 columns are linearly independent should be constructed as the matrix H''. As this example, 6×8 matrix expressed by the following Expression 21 is shown.

$$H'' = \begin{bmatrix} 1 & 0 & 0 & 0 & 0 & 0 & 1 & 0 \\ 0 & 1 & 0 & 0 & 0 & 0 & 1 & 0 \\ 0 & 0 & 1 & 0 & 0 & 0 & 1 & 1 \\ 0 & 0 & 0 & 1 & 0 & 0 & 1 & 1 \\ 0 & 0 & 0 & 0 & 1 & 0 & 0 & 1 \\ 0 & 0 & 0 & 0 & 0 & 1 & 0 & 1 \end{bmatrix}$$ [Expression 21]

If $\gamma$ is a root of 6-th degree primitive polynominal $g(x) = x^6 + x + 1$ over $GF(2)$, $\gamma$ can be expressed as 6-dimensional column vector $\gamma = (010000)^T$.

That is, the correspondence between exponential representation $\gamma^i$ of $\gamma$ and vector representation of $\gamma$ is shown as follows.
$\gamma^0 = (1000000)^T$, $\gamma^1 = (010000)^T$, $\gamma^2 = (001000)^T$, $\gamma^3 = (000100)^T$, $\gamma^4 = (000010)^T$, $\gamma^5 = (000001)^T$, $\gamma^6 = (110000)^T$, $\gamma^7 = (011000)^T$, $\gamma^8 = (001100)^T$, $\gamma^9 = (000110)^T$, $\gamma^{10} = (000011)^T$, $\gamma^{11} = (110001)^T$, $\gamma^{12} = (101000)^T$, $\gamma^{13} = (010100)^T$, $\gamma^{14} = (001010)^T$, $\gamma^{15} = (000101)^T$, $\gamma^{16} = (110010)^T$, $\gamma^{17} = (011001)^T$, $\gamma^{18} = (111100)^T$, $\gamma^{19} = (011110)^T$, $\gamma^{20} = (001111)^T$, $\gamma^{21} = (110111)^T$, $\gamma^{22} = (101011)^T$, $\gamma^{23} = (100101)^T$, $\gamma^{24} = (100010)^T$, $\gamma^{25} = (010001)^T$, $\gamma^{26} = (111000)^T$, $\gamma^{27} = (011100)^T$, $\gamma^{28} = (001110)^T$, $\gamma^{29} = (000111)^T$, $\gamma^{30} = (110011)^T$, $\gamma^{31} = (101001)^T$, $\gamma^{32} = (100100)^T$, $\gamma^{33} = (010010)^T$, $\gamma^{34} = (001001)^T$, $\gamma^{35} = (110100)^T$, $\gamma^{36} = (011010)^T$, $\gamma^{37} = (001101)^T$, $\gamma^{38} = (110110)^T$, $\gamma^{39} = (011011)^T$, $\gamma^{40} = (111101)^T$, $\gamma^{41} = (101110)^T$, $\gamma^{42} = (010111)^T$, $\gamma^{43} = (111011)^T$, $\gamma^{44} = (101101)^T$, $\gamma^{45} = (100110)^T$, $\gamma^{46} = (010011)^T$, $\gamma^{47} = (111001)^T$, $\gamma^{48} = (101100)^T$, $\gamma^{49} = (010110)^T$, $\gamma^{50} = (001011)^T$, $\gamma^{51} = (110101)^T$, $\gamma^{52} = (101010)^T$, $\gamma^{53} = (010101)^T$, $\gamma^{54} = (111010)^T$, $\gamma^{55} = (011101)^T$, $\gamma^{56} = (111110)^T$, $\gamma^{57} = (011111)^T$, $\gamma^{58} = (111111)^T$, $\gamma^{59} = (101111)^T$, $\gamma^{60} = (100111)^T$, $\gamma^{61} = (100011)^T$, $\gamma^{62} = (100001)^T$, As a result, the matrix H'' shown in the Expression 21 can be expressed as $H'' = [\gamma^0 \gamma^1 \gamma^2 \gamma^3 \gamma^4 \gamma^5 \gamma^{18} \gamma^{20}]$. Therefore, as to the parity check matrix (H) shown in the Expression 1, a specific (504, 478) $[4_{1/8}EC]_2$ code can be constructed by using H' and H''. The check matrix of a (90, 64) $[4_{1/8}EC]_2$ code obtained by deleting 414 columns from the right most of the (504, 478) $[4_{1/8}EC]_2$ code is shown in FIG. 3.

Figure 3:
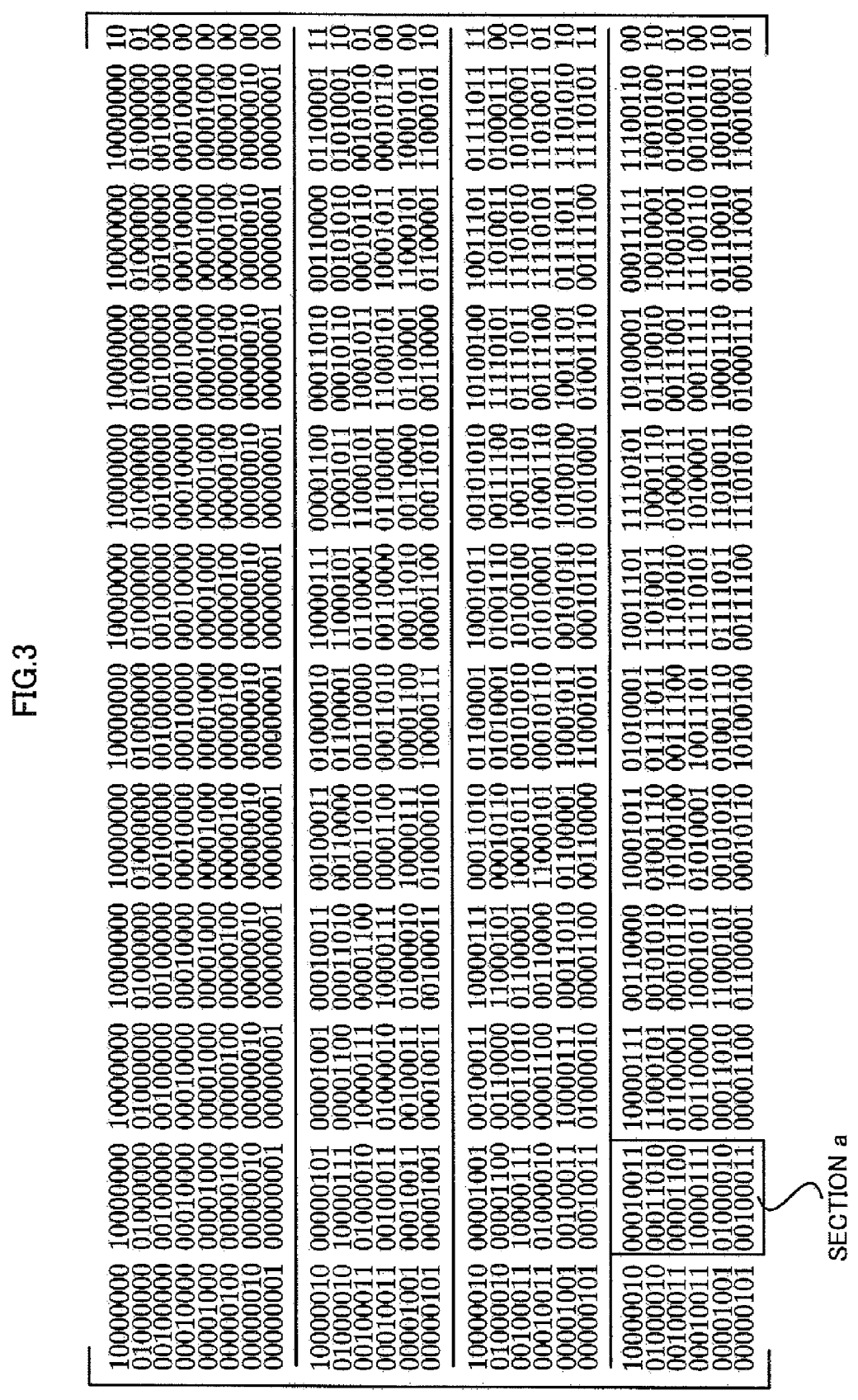

As shown in FIG. 3, in order to clarify the location of each row corresponding to H' and H'' of the parity check matrix (H), the boundary there between is shown by drawing a solid line.

A check is concretely made whether $\gamma^3 H''$ as the component of the parity check matrix (H) is corresponding to the actual bit value shown in FIG. 3. As mentioned above, according to $H'' = [\gamma^0 \gamma^1 \gamma^2 \gamma^3 \gamma^4 \gamma^5 \gamma^{18} \gamma^{20}]$, $\gamma^3 H'' = \gamma^3 [\gamma^0 \gamma^1 \gamma^2 \gamma^3 \gamma^4 \gamma^5 \gamma^{18} \gamma^{20}] = [\gamma^3 \gamma^4 \gamma^5 \gamma^6 \gamma^7 \gamma^8 \gamma^{21} \gamma^{23}]$ can hold. This exponential representation is converted into vector representation (for example, $\gamma^0 = (100000)^T$ or the like), the exponential representation corresponds to a section "a" shown in FIG. 3, and this section "a" is clearly the section $\gamma^3 H''$ of the parity check matrix (H). Similarly, when the other component of the parity check matrix (H) is converted into the vector representation, as a whole, it becomes a constitution of 26 rows and 90 columns expressed by bits shown in FIG. 3.

As to $\mu_1 = \mu_2 = 3$, according to $\text{Min}((\mu_1+\mu_2)t, b) = \text{Min}(6,8) = 6$, a check matrix of 6-bit error detection code where any 6 columns are linearly independent should be constructed as the matrix H'. As this example, 7×8 matrix expressed by the following Expression 22 is shown.

$$H' = \begin{bmatrix} 1 & 0 & 0 & 0 & 0 & 0 & 0 & 1 \\ 0 & 1 & 0 & 0 & 0 & 0 & 0 & 1 \\ 0 & 0 & 1 & 0 & 0 & 0 & 0 & 1 \\ 0 & 0 & 0 & 1 & 0 & 0 & 0 & 1 \\ 0 & 0 & 0 & 0 & 1 & 0 & 0 & 1 \\ 0 & 0 & 0 & 0 & 0 & 1 & 0 & 1 \\ 0 & 0 & 0 & 0 & 0 & 0 & 1 & 1 \end{bmatrix}$$ [Expression 22]

According to $\text{Min}(\lfloor(\mu_1+\mu_2)/2\rfloor t, b) = \text{Min}(3,8) = 3$, a check matrix of triple-bit error detection code where any 3 columns are linearly independent should be constructed as the matrix H''. As this example, 4×8 matrix expressed by the following Expression 23 is shown.

$$H'' = \begin{bmatrix} 1 & 1 & 1 & 1 & 1 & 1 & 1 & 1 \\ 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{bmatrix}$$ [Expression 23]

As to $t = 2$, for example, in a $[T_2/EC]_2$ code having parameters such that $\mu_1 = \mu_2 = 3$ and $p_1 = p_2 = 2$, according to $\text{Min}((\mu_1+\mu_2)t, b) = \text{Min}(12, 8) = 8$, a matrix where any 8 columns are linearly independent should be constructed as the matrix H'. As this example, 8×8 (8 rows and 8 columns) identity matrix shown in the Expression 20 should be constructed.

According to $\text{Min}(\lfloor(\mu_1+\mu_2)/2\rfloor t, b) = \text{Min}(6,8) = 6$, a check matrix of 6-bit error detection code where any 6 columns are linearly independent should be constructed as the matrix H''. As this example, 7×8 matrix expressed by the following Expression 24 is shown.

$$H'' = \begin{bmatrix} 1 & 0 & 0 & 0 & 0 & 0 & 0 & 1 \\ 0 & 1 & 0 & 0 & 0 & 0 & 0 & 1 \\ 0 & 0 & 1 & 0 & 0 & 0 & 0 & 1 \\ 0 & 0 & 0 & 1 & 0 & 0 & 0 & 1 \\ 0 & 0 & 0 & 0 & 1 & 0 & 0 & 1 \\ 0 & 0 & 0 & 0 & 0 & 1 & 0 & 1 \\ 0 & 0 & 0 & 0 & 0 & 0 & 1 & 1 \end{bmatrix}$$ [Expression 24]

The above explains one example of the parity check matrix H (code) for the semiconductor memory chip having input/output with byte width b of 8 bits which is used the most frequently. It is apparent that the parity check matrix H of the error control code for controlling multiple spotty-byte errors within a byte occurred in a limited number of bytes according to the present invention can be constructed also for the other multi-bit input/output chip to be used frequently such as chip or the like having input/output with byte width b of 16 bits. Further, it is also apparent that the parity check matrix H of the error control code for controlling multiple spotty-byte errors within a byte occurred in a limited number of bytes according to the present can be constructed also for any integer t with a value of 1 or more and for any $p_1$, $p_2$, $\mu_1$ and $\mu_2$.

The above shows the parity check matrix (H) of the error control code for controlling multiple spotty-byte errors within a byte occurred in a limited number of bytes. However, it is possible that the error control code for controlling multiple spotty-byte errors within a byte occurred in a limited number of bytes with a function of detecting single-byte error exceeding correction capability of multiple spotty-byte errors within a byte can be constructed by H' is constructed by b by b identity matrix.

That is, an error control code for controlling multiple spotty-byte errors within a byte occurred in a limited number of bytes with byte error detection function is a code with a function of correcting $\mu_1$ spotty-byte errors occurred in $p_1$ bytes, and detecting $\mu_2$ spotty-byte errors occurred in $p_2$ bytes and byte error occurred in one byte. This code expressed as $[\mu_1 t/bEC]_{p_1}-[\mu_2 t/bED]_{p_2}-S_b ED$ code.

In this embodiment, the parity check matrix (H) of R rows and N columns which is used for the $[\mu_1 t/bEC]_{p_1}-[\mu_2 t/bED]_{p_2}-S_b ED$ code, has a constitution as expressed by the following Expression 25.

$$H = \begin{bmatrix} I_b & I_b & \cdots & I_b & \cdots & I_b \\ \gamma^0 H'' & \gamma^1 H'' & \cdots & \gamma^i H'' & \cdots & \gamma^{n-1} H'' \\ \gamma^0 H'' & \gamma^2 H'' & \cdots & \gamma^{2i} H'' & \cdots & \gamma^{2(n-1)} H'' \\ \vdots & \vdots & \ddots & \vdots & \ddots & \vdots \\ \gamma^0 H'' & \gamma^{p_1+p_2-1} H'' & \cdots & \gamma^{(p_1+p_2-1)i} H'' & \cdots & \gamma^{(p_1-p_2-1)(n-1)} H'' \end{bmatrix}$$ [Expression 25]

where $R=b+(p_1+p_2-1)r$, $N=bn$, $0 \leq i \leq n-1$ and $n=2^r-1$ hold. $I_b$ is a b by b identity matrix.

The matrix H'' constituting the Expression 25 is a binary matrix having r rows and b columns ($r \leq b$) composed of r-dimensional column vector $h_j''$ ($0 \leq j \leq b-1$) shown in the following Expression 26, and plural columns whose number is larger than or equal to either smaller one of $\lfloor(\mu_1+\mu_2)/2\rfloor t$ and b are linearly independent. $\lfloor x \rfloor$ represents a maximum integer which does not exceed x.

$$H''=[h_0'', h_1'', \ldots, h_{b-1}'']$$ [Expression 26]

if $\lfloor(\mu_1+\mu_2)/2\rfloor \geq b$, the matrix H'' is a nonsingular matrix including an identity matrix, and if $\lfloor(\mu_1+\mu_2)/2\rfloor t<b$, the matrix H'' is equal to a check matrix of a code having a minimum Hamming distance $\lfloor(\mu_1+\mu_2)/2\rfloor t+1$, namely, a parity check matrix of a (b, b−r) code with a function of detecting $\lfloor(\mu_1+\mu_2)/2\rfloor t$ bits error.

When $\gamma$ is a primitive element of an r-th degree extension field $GF(2^r)$ of GF(2), $\gamma^i H''$ can be defined by the following Expression 27.

$$\gamma^i H''=[\gamma^i h_0'', \gamma^i h_1'', \ldots, \gamma^i h_{b-1}'']$$ [Expression 27]

In this case, the maximum code length N is $b(2^r-1)$.

In the case of parameter $t \geq b/\lfloor(\mu_1+\mu_2)/2\rfloor$, since H'' becomes matrix where any b columns are linearly independent, the parity check matrix (H) shown in the Expression 25 corresponds with a parity check matrix of a conventional $p_1$ correction $p_2$ detection RS code with a function of correcting $p_1$ bytes error and detecting $p_2$ bytes error.

In this embodiment, a lengthened code of the $[\mu_1 t/bEC]_{p_1}-[\mu_2 t/bED]_{p_2}-S_b ED$ code can be defined. The parity check matrix (H) of R rows and N columns which is used for the lengthened $[\mu_1 t/bEC]_{p_1}-[\mu_2 t/bED]_{p_2}-S_b ED$ code can be constituted as shown in the following Expression 28.

$$H = \begin{bmatrix} I_b & I_b & \cdots & I_b & \cdots & I_b & I_b & O_{b \times r'} \\ \gamma^0 H'' & \gamma^1 H'' & \cdots & \gamma^i H'' & \cdots & \gamma^{n-1} H'' & O_{r' \times b} & O_{r' \times r'} \\ \gamma^0 H'' & \gamma^2 H'' & \cdots & \gamma^{2i} H'' & \cdots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \cdots & \gamma^{(p_1+p_2-1)i} H'' & \cdots & \gamma^{(p_1-p_2-1)(n-1)} H'' & O_{r' \times b} & I_{r'} \end{bmatrix}$$ [Expression 28]

where $r' \geq r$, $R=b+(p_1+p_2-1)r'$, $N=b(n+1)+r'$, $0 \leq i \leq n-1$ and $n=2^{r'}-1$ hold. $I_b$ is a b by b identity matrix and $I_{r'}$ is a r' by r' identity matrix. Further, O is a zero matrix.

The matrix H'' constituting the Expression 28 is a binary matrix having r rows and b columns ($r \leq b$) composed of r-dimensional column vector $h_j''$ ($0 \leq j \leq b-1$) shown in the following Expression 29, and plural columns whose number is larger than or equal to either smaller one of $\lfloor(\mu_1+\mu_2)/2\rfloor t$ and b are linearly independent. $\lfloor x \rfloor$ represents a maximum integer which does not exceed x.

$$H''=[h_0'', h_1'', \ldots, h_{b-1}'']$$ [Expression 29]

if $\lfloor(\mu_1+\mu_2)/2\rfloor t \geq b$, the matrix H'' is a nonsingular matrix including an identity matrix, and if $\lfloor(\mu_1+\mu_2)/2\rfloor t<b$, the matrix H'' is equal to a check matrix of a code having a minimum Hamming distance $\lfloor(\mu_1+\mu_2)/2\rfloor t+1$, namely, a parity check matrix of a (b, b−r) code with a function of detecting $\lfloor(\mu_1+\mu_2)/2\rfloor t$ bits error.

When $\gamma$ is a primitive element of an r'-th degree extension field $GF(2^{r'})$ of GF(2), $\gamma^i H''$ can be defined by the following Expression 30.

$$\gamma^i H''=[\gamma^i \Phi(h_0''), \gamma^i \Phi(h_1''), \ldots, \gamma^i \Phi(h_{b-1}'')]$$ [Expression 30]

Where, $\Phi$ is an injective homomorphism from $GF(2^r)$ to $GF(2^{r'})$ under addition, namely, $\Phi$ is achieved effectively by $GF(2^r) \rightarrow GF(2^{r'})$. In this case, the maximum code length N is $b \cdot 2^{r'} + r'$. Attention should be paid to that the number of rows r' of H'' to be used for the second and lower rows of H shown in the Expression 28 can obtain a value larger than r, and the code expressed by the Expression 28 can be constructed for an arbitrary code length by increasing the number of check bits by $(\mu_1+\mu_2-1)$ bits.

In the case of parameter $t \geq b/\lfloor(\mu_1+\mu_2)/2\rfloor$, since H″ becomes matrix where any b columns are linearly independent, the parity check matrix (H) shown in the Expression 28 corresponds with a parity check matrix of a conventional $p_1$ correction $p_2$ detection doubly lengthened RS code with a function of correcting $p_1$ bytes error and detecting $p_2$ bytes error.

The following concretely shows that the code expressed by the parity check matrix (H) shown in the Expression 25 corrects $\mu_1$ spotty-byte errors occurred in $p_1$ bytes, and detects $\mu_2$ spotty-byte errors occurred in $p_2$ bytes and byte error occurred in one byte. The parity check matrix $H=[H_0, H_1, \ldots, H_{n-1}]$ should satisfy the necessary and sufficient conditions shown in the Expressions 9 and the following Expression 31. Where, $H_i$ is an R×b submatrix.

$$e_{i_b} \cdot H_{i_b}^T + e_{i_1} \cdot H_{i_1}^T + \ldots + e_{i_{v_1}} \cdot H_{i_{v_1}}^T +$$
$$e_{i_{v_1+1}} + H_{i_{v_1+1}}^T + \ldots + e_{i_{v_1+v_2}} \cdot H_{i_{v_1+v_2}}^T +$$
$$\ldots + e_{i_{v_1+v_2+\ldots+v_{\lambda-1}+1}} \cdot H_{i_{v_1+v_2+\ldots+v_{\lambda-1}+1}}^T +$$
$$\ldots + e_{i_{v_1+v_2+\ldots+v_\lambda}} \cdot H_{i_{v_1+v_2+\ldots+v_\lambda}}^T \neq 0$$
$$0 < \sum_{x=1}^{v_1+\ldots+v_\lambda} w_M(e_{i_x}) \leq \mu_1, \quad 0 < \sum_{x=1}^{\lambda} v_x \leq p_1$$
$$0 \leq v_1 \leq p_1, \; 0 \leq v_2 \leq \min(\lfloor(\mu_1+\mu_2)/2\rfloor, p_1), \ldots,$$
$$0 \leq v_\lambda \leq \min(\lfloor(\mu_1+\mu_2)/\lambda\rfloor, p_1)$$

[Expression 31]

Where, $e_{i_b}$ represents a byte error occurred in the $i_b$-th byte in an error vector e, $e_{i_x}$ represents the $i_x$-th byte in the error vector e, $\lambda = \lceil b/t \rceil$, $\lfloor y \rfloor$ represents a maximum integer which is y or less, and $\lceil z \rceil$ represents a minimum integer which is z or more.

Further, $i_b, i_1, i_2, \ldots, i_{v_1+v_2+\ldots+v_\lambda}$ ($0 \leq i_b, i_1, i_2, \ldots, i_{v_1+v_2+\ldots+v_\lambda} \leq n-1$) are all different from one another, and $w_M(e)$ is defined by the Expression 10 and represents the number of spotty-byte error.

Similarly to the necessary and sufficient condition shown in the Expression 9, it can show that the conditions shown in the Expression 9 and the Expression 31 are satisfied.

Likewise, it can also show that the lengthened code expressed by the parity check matrix (H) shown in the Expression 28 satisfies the necessary and sufficient conditions shown in the Expression 9 and the Expression 31.

The above explains some examples of the method for constituting the parity check matrix (H) of the error control code for controlling multiple spotty-byte errors within a byte occurred in a limited number of bytes and the parity check matrix (H) of the error control code for controlling multiple spotty-byte errors within a byte occurred in a limited number of bytes having the byte error detection function. Next, the concrete methods and circuit configurations of the encoding process and the decoding process to be executed by using the parity check matrix (H) of the present invention are explained by exemplifying the error control code ($[\mu_1 t/bEC]_{p_1}$-$[\mu_2 t/bED]_{p_2}$ code) for controlling multiple spotty-byte errors within a byte occurred in a limited number of bytes which is expressed by the parity check matrix (H) shown in the Expression 1.

<A> The Encoding Method and the Configuration of the Circuit for Realizing the Encoding Method First, the concrete method of the encoding process to be executed by the encoding circuit 2 shown in FIG. 1 is explained.

The encoding circuit 2 generates check information C (row vector) by using input information data D (row vector) 30 and an information section $H_R$ of the parity check matrix (H) obtained by applying the elementary row operation of the parity check matrix (H) shown in FIG. 3. The check information (C) can be generated by the following Expression 32.

$$C = D \cdot H_R^T$$ [Expression 32]

Figure 4:
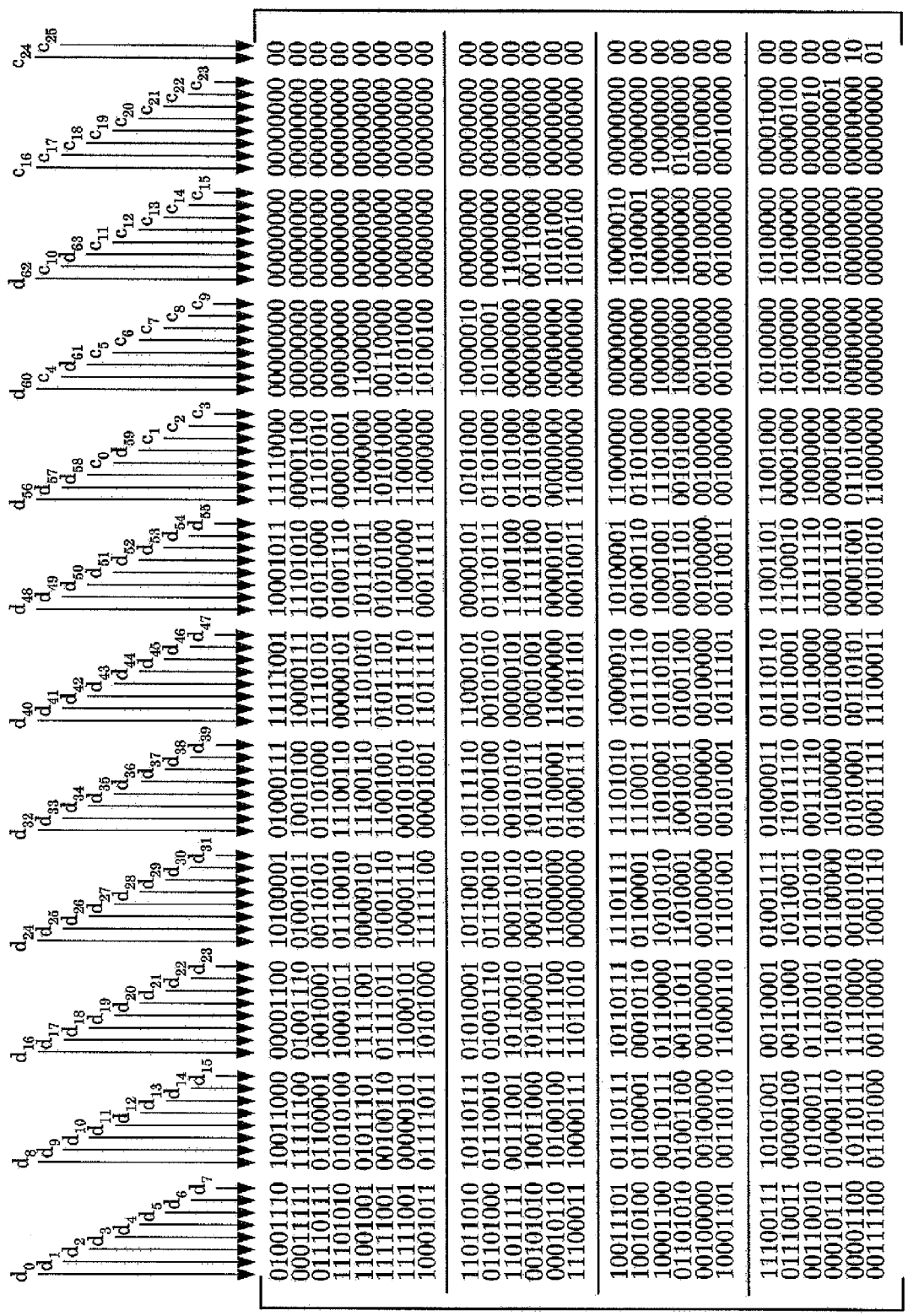
FIG. 4 is a diagram illustrating a parity check matrix of an encoding (90,64) $[4_{1/8}EC]_2$ systematic code which is obtained by applying the elementary row operation of the parity check matrix shown in FIG. 3.

Concretely, the encoding circuit 2 constitutes a (504, 478) $[4_{1/8}EC]_2$ code as the parity check matrix H on the basis of 64 bits of the information bit length and 26 bits of the check bit length in the input information data (D) 30, and thereafter constitutes the (90,64) $[4_{1/8}EC]_2$ code shown in FIG. 3 having 90 bits of code length and 64 bits of the information length by deleting 414 columns of the column vector corresponding to the latter 414 bits. When the elementary row operation in the parity check matrix H of this code is applied, the parity check matrix H as a systematic code can be constructed. FIG. 4 shows the parity check matrix of the (90,64)$[4_{1/8}EC]_2$ systematic code.

In the parity check matrix of the (90,64)$[4_{1/8}EC]_2$ systematic code shown in FIG. 4, $d_0$ to $d_{63}$ correspond to the information bit, and $c_0$ to $c_{25}$ correspond to the check bit. In the parity check matrix of the (90,64) $[4_{1/8}EC]_2$ systematic code shown in FIG. 4, a matrix composed of column vectors of $d_0$ to $d_{63}$ corresponding to information bit becomes the information section $H_R$ of the parity check matrix.

The parity check matrix shown in FIG. 4 is used for the encoding, and the parity check matrix shown in FIG. 3 is used for the decoding. Since the matrix obtained by applying the elementary row operation is equivalent to the original matrix, the property of the code expressed by the parity check matrix shown in FIG. 4 is not different from property of the code expressed by the parity check matrix shown in FIG. 3 at all. Therefore, the parity check matrix shown in FIG. 4 is used for the encoding.

Next, the encoding circuit 2 generates 26-bit check information (C) based on the Expression 32. As is clear from $C = D \cdot H_R^T$ shown in the Expression 32, for example, in order to generate the check bit $c_0$ of the check information (C), in the first row of the matrix of the (90, 64) $[4_{1/8}EC]_2$ systematic code for the encoding shown in FIG. 4, an operation for obtaining the sum of bits corresponding to locations where "1" exists excluding bit corresponding to $c_0$ over GF(2) (namely, the sum modulo 2: mod 2) should be performed.

For example, in the case of obtaining the check bit $c_0$, bits corresponding to locations where "1" exists excluding bit corresponding to $c_0$ are $d_1, d_4, d_5, d_6, d_8, d_{11}, d_{12}, d_{20}, d_{21}, d_{24}, d_{26}, d_{31}, d_{33}, d_{37}, d_{38}, d_{39}, d_{40}, d_{41}, d_{42}, d_{43}, d_{44}, d_{47}, d_{48}, d_{52}, d_{54}, d_{55}, d_{56}, d_{57}, d_{58}$ and the sum modulo 2 (mod 2) should be operated for these 29 bits.

Figure 5:
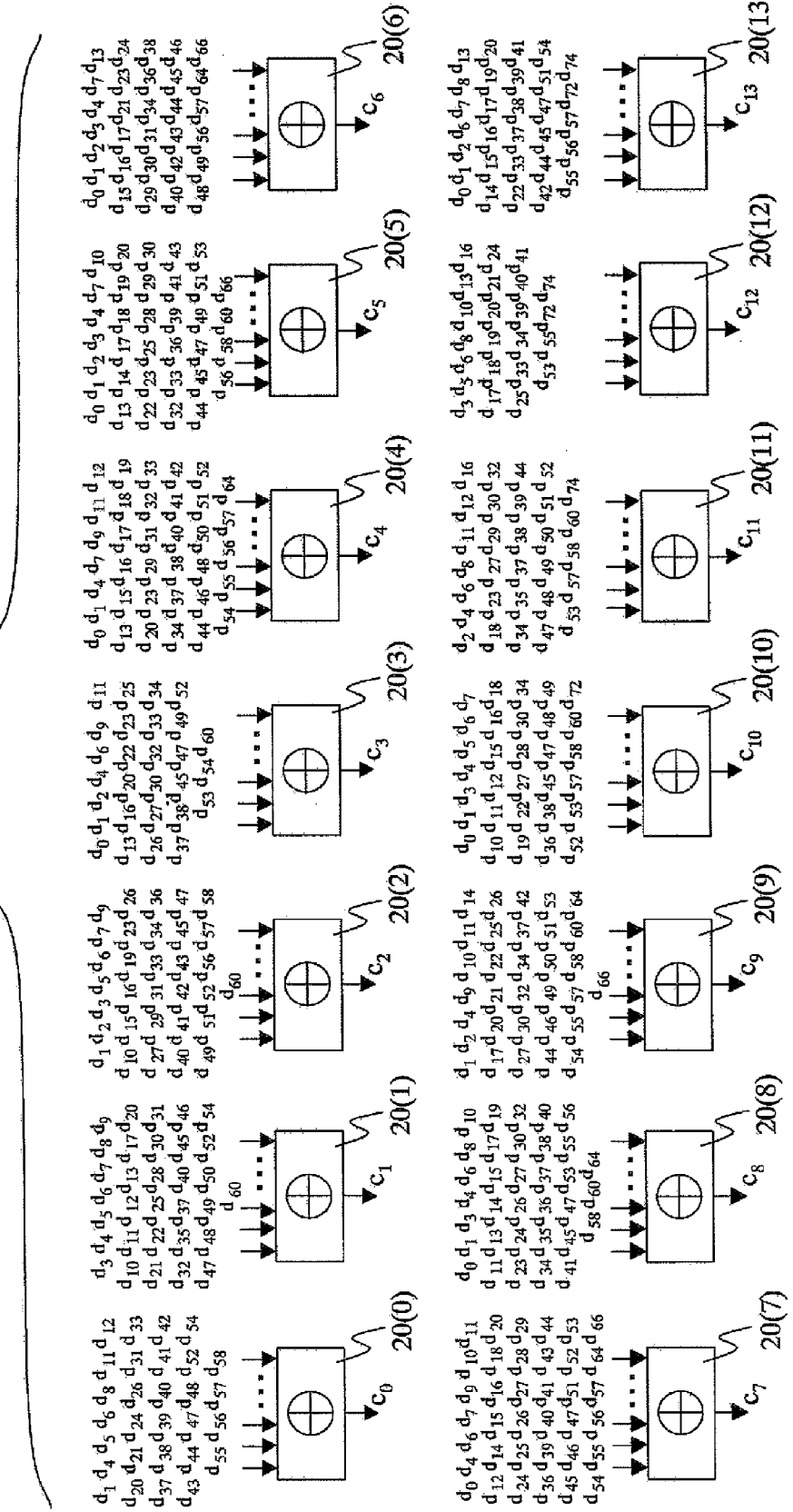
FIG. 5 is a conceptual diagram illustrating a circuit for generating check information of 26 bits from input information data whose K is 64 bits by means of the parity check matrix as a concrete example of an encoding circuit (upper 14 bits) configured based on the encoding (90,64) $[4_{1/8}EC]_2$ systematic code shown in FIG. 4.

In order to realize this, as shown in FIG. 5, the input of the multi-input parity check circuit 20(0) is these 29 bits, and the output of the multi-input parity check circuit 20(0) is the check bit $c_0$. The other check bits $c_1$ to $c_{25}$ can be generated similarly to the check bit $c_0$. The configuration of upper 14 bits of the encoding circuit 2 (composed of the multi-input parity check circuits 20(0) to 20(25)) for generating the check bits $c_0$ to $c_{25}$ of 26 bits in parallel is shown in FIG. 5, and the configuration of the lower 12 bits of the encoding circuit 2

Figure 6:
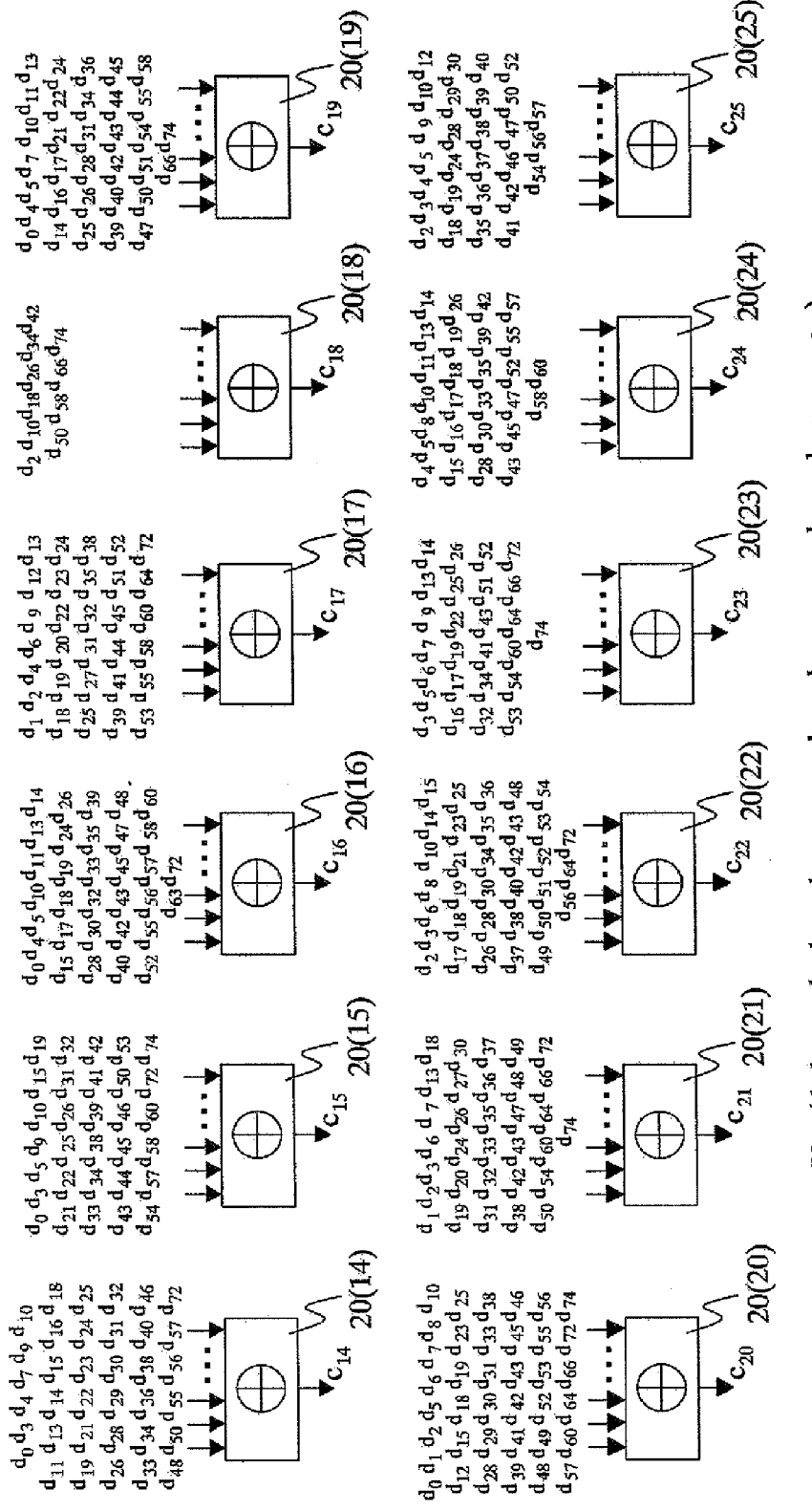
FIG. 6 is a conceptual diagram illustrating a circuit for generating check information of 26 bits from input information data whose K is 64 bits by means of the parity check matrix as a concrete example of an encoding circuit (lower 12 bits) configured based on the encoding (90,64) $[4_{1/8}EC]_2$ systematic code shown in FIG. 4.

(composed of the multi-input parity check circuits 20(0) to 20(25)) for generating the check bits $c_0$ to $c_{25}$ of 26 bits in parallel is shown in FIG. 6.

The codeword generated by adding the check information (C) generated by the encoding circuit 2 to the input information data (D) 30 is shown in the Expression 33. This codeword becomes the transmitted word (V) (vector of 90 bits) which is transmitted to the circuit 3.

$$V=[d_0, d_1, \ldots, d_{57}, d_{58}, c_0, d_{59}, c_1, \ldots, c_3, d_{60}, c_4, d_{61}, c_5, \ldots, c_9, d_{62}, c_{10}, d_{63}, c_{11}, \ldots, c_{25}]$$ [Expression 33]

<B> The Decoding Method and the Configuration of the Circuit for Realizing the Decoding Method As explained below, when errors occurred in the transmitted word (V) 31 (namely, when the received word 32 includes the errors), the correcting and detecting process for the errors can be executed based on the value of a syndrome (S) 33 generated by using the (90,64) $[4_{1/8}EC]_2$ code shown in FIG. 3.

Since $p_1 = p_2 = 2$ in the check matrix of the (90,64) $[4_{1/8}EC]_2$ code shown in FIG. 3, as shown in the Expression 1, the check matrix has a 4-tiered structure composed of the parity check matrices H' and H". As a result, a syndrome where q=8 bits obtained from the first tier is designated as $S_I$, a syndrome where r=6 bits obtained from the second tier is designated as $S_{II}$, a syndrome where r=6 bits obtained from the third tier is designated as $S_{III}$, and a syndrome where r=6 bits obtained from the fourth tier is designated as $S_{IV}$.

The errors are corrected and detected by using these pieces of information as follows. The syndrome (S) 33 can be obtained from the received word (V') 32 and the parity check matrix (H) according to the following Expression 34.

$$V' \cdot H^T = S = [S_I S_{II} S_{III} S_{IV}]$$ [Expression 34]

Where $S_I \in GF(2^q)$ is a q-dimensional row vector. $S_{II}$, $S_{III}$, $S_{IV} \in GF(2^r)$ is a r-dimensional row vector respectively.

In the case of the lengthened code shown in the Expression 5, $S_I \in GF(2^q)$ is a q-dimensional row vector. $S_{II}$, $S_{III}$, $S_{IV} \in GF(2^{r'})$ is a r'-dimensional row vector respectively.

For example, when error $e_I$ occurred in the $i_I$-th byte and error $e_{II}$ ($w_M(e_I) + w_M(e_{II}) \leq \mu_1 + \mu_2$) occurred in the $i_{II}$-th byte, the syndrome (S) 33 is expressed by the following Expression 35.

$$S = [e_I \cdot H^{'T} + e_{II} \cdot H^{'T}, \gamma^i e_I \cdot H^{"T} + \gamma^j e_{II} \cdot H^{"T}, \gamma^{2i} e_I \cdot H^{"T} + \gamma^{2j} e_{II} \cdot H^{"T}, \gamma^{3i} e_I \cdot H^{"T} + \gamma^{3j} e_{II} \cdot H^{"T}]$$ [Expression 35]

When attention is paid to $S_I$, the following Expression 36 holds. In the Expression 36, since H' is a matrix where arbitrary Min(($\mu_1+\mu_2$)t, b) columns are linearly independent, $e_I + e_{II} (= e_A)$ can be obtained. In the case of the (90,64) $[4_{1/8}EC]_2$ code shown in FIG. 3, since H' is the identity matrix, $e_A = e_I + e_{II} = S_I$.

$$(e_I + e_{II}) \cdot H^{'T} = S_I$$ [Expression 36]

Next, $e_I + e_{II}$ is multiplied by $H^{"T}$ on the right side, and the multiplied result is $S'_I \in GF(2^r)$. That is, a relationship shown in the following Expression 37 holds.

$$S'_I = (e_I + e_{II}) \cdot H^{"T}$$ [Expression 37]

When $e_I \cdot H^{"T}$ and $e_{II} \cdot H^{"T}$ ($\in GF(2^r)$) are errors $e'_I$ and $e''_{II}$ over $GF(2^r)$, and $S' = [S'_I S_{II} S_{III} S_{IV}]$, a relationship shown in the following Expression 38 holds.

$$S' = [S'_I S_{II} S_{III} S_{IV}] = [e'_I + e'_{II}, \gamma^i e'_I + \gamma^j e'_{II}, \gamma^{2i} e'_I + \gamma^{2j} e'_{II}, \gamma^{3i} e'_I + \gamma^{3j} e'_{II}]$$ [Expression 38]

S' shown in the Expression 38 corresponds to the expression of the syndrome of errors $e'_I$ and $e'_{II}$ in a double-byte error correction RS code (distance d=5). Therefore, it is possible to obtain error positions $i_I$, $i_{II}$ and the errors $e'_I$, $e'_{II}$ over $GF(2^r)$ by using decoding method of the RS code over $GF(2^r)$ having distance d of 5. When an error position is not obtained, an error is detected as uncorrectable error.

Errors $e_I$ and $e_{II}$ over $GF(2^b)$ are obtained from the errors $e'_I$ and $e'_{II}$ over $GF(2^r)$. That is, $e_I$ and $e_{II}$ are obtained according to the relationships: $e_I \cdot H^{"T} = e'_I$ and $e_{II} \cdot H^{"T} = e'_{II}$. The obtained results are $\hat{e}_I$ and $\hat{e}_{II}$.

Since H" is a matrix where any Min(2t,b) columns are linearly independent, when a t-bit or more error occurred within a byte, the error is miscorrected (that is, $e_x \neq \hat{e}_x$) or is detected as an out-of-control-ability error. However, since the number of bytes where a t-bit or more error occurred, is one at most, so the number of bytes where $e_x \neq \hat{e}_x$ is also one at most.

It is possible to determine whether miscorrection is carried out or not according to the following Expression 39. That is, it is possible to determine whether $e_x = \hat{e}_x$ holds or not according to the following Expression 39. In other words, when the following Expression 39 holds, $e_x = \hat{e}_x$, and thus the determination is made that miscorrection is not carried out. In contrast, when the following Expression 39 does not hold, $e_x \neq \hat{e}_x$, and thus the determination is made that miscorrection is carried out.

$$w_M(\hat{e}_x + e_A) \leq \mu_1 - w_M(\hat{e}_x)$$ [Expression 39]

The relationship shown in the Expression 39 holds when $w_M(e)$ satisfies the triangle inequality. Further, a determination of miscorrection with respect to the Hamming distance over GF(2) is disclosed in detail in Non-Patent Document 11.

Finally, in byte that is miscorrected (namely, $e_x \neq \hat{e}_x$) or byte that is detected as an out-of-control-ability error, it is possible to restore the error pattern of byte that is miscorrected by obtaining exclusive logical sum of error pattern that is corrected definitely and $e_A$.

In addition, for any $p_1$, $p_2$, $\mu_1$ and $\mu_2$, it is clear that it is possible to determine whether miscorrection is carried out or not according to the above Expression 39 same as the example mentioned above, and restore error pattern of erroneous byte that is one at most basing on error pattern that is corrected definitely and $e_A$.

The decoding of the RS code can be realized by using a parallel decoding method for codes in which the number of erroneous bytes, $P_1$, including correctable spotty byte errors, is small. A general construction of this parallel decoding method is disclosed in "BURST ERROR PATTERN GENERATION METHOD, AND BURST AND BYTE ERROR DETECTION CORRECTION APPARATUS" (see Patent Document 5).

The parallel decoding method disclosed in Patent Document 5, however, enables high-speed decoding, but when the number of erroneous bytes, $p_1$, including correctable spotty byte errors of code, becomes large, a problem that the amount of circuits becomes large occurs. Although a sequential decoding method such as a Berlekamp-Massey method can be used for the codes in which the number of erroneous bytes, $p_1$, including correctable spotty byte errors, is large, since the decoding by means of the sequential decoding method, is carried out sequentially (i.e. serially), so a problem that the decoding is slow occurs. The construction of the decoding circuit for the RS code using the Berlekamp-Massey method is disclosed in Non-Patent Document 12.

According to the parallel decoding method disclosed in Patent Document 5, for example, the codes where $p_1 = p_2 = 2$ is decoded according to the following procedure.

First, a matrix $\tilde{H}_{(i,j)} = [\tilde{H}_i \tilde{H}_j]$ of $4r \times 2r$ is constructed for the parity check matrix $\tilde{H} = [\tilde{H}_0 \tilde{H}_1 \ldots \tilde{H}_{n-1}]$ of the RS code over $GF(2^r)$ having $4r \times nr$. Where $\tilde{H}_i$ is a $4r \times r$ submatrix.

Next, A matrix $B_{(i,j)}$ of 4r×2r is added to the matrix $\tilde{H}_{(i,j)}$, so that a nonsingular matrix $A_{(i,j)}=[\tilde{H}_{(i,j)} \ B_{(i,j)}]$ of 4r×4r is constructed.

When an inverse matrix $A_{(i,j)}^{-1}$ of $A_{(i,j)}$ is obtained, the relationship of the following Expression 40 holds.

$$A_{(i,j)}^{-1} = \begin{bmatrix} \tilde{H}_{(i,j)}^\dagger \\ B_{(i,j)}^\dagger \end{bmatrix} = \begin{bmatrix} \tilde{H}_i^\dagger \\ \tilde{H}_j^\dagger \\ B_{(i,j)}^\dagger \end{bmatrix}$$ [Expression 40]

Where, $\tilde{H}_i^\dagger$ is a matrix of r×4r, and $\tilde{H}_i^\dagger \cdot \tilde{H}_i = I_r$. $I_r$ is an identity matrix of r×r. $\tilde{H}_j^\dagger$ is a matrix of r×4r, and $\tilde{H}_j^\dagger \cdot \tilde{H}_j = I_r$. Further, $B_{(i,j)}^\dagger$ is a matrix of 2r×4r, and $B_{(i,j)}^\dagger \cdot B_{(i,j)} = I_{2r}$. $I_{2r}$ is an identity matrix of 2r×2r. $\tilde{H}_{(i,j)}^\dagger$ is a matrix of 2r×4r, and $\tilde{H}_{(i,j)}^\dagger \cdot \tilde{H}_{(i,j)} = I_{2r}$.

Byte positions i and j where $S' \cdot B_{(i,j)}^T = 0$ for $\tilde{H}_i^\dagger$, $\tilde{H}_j^\dagger$, $B_{(i,j)}^\dagger$ become error positions $i_I$ and $i_{II}$, and $S' \cdot B_{(i,j)}^{\dagger T}$ and $S' \cdot \tilde{H}_j^{\dagger T}$ become error sizes $e'_I$ and $e'_{II}$. The errors occurred in two bytes can be corrected by using them. When the byte positions i and j where $S' \cdot B_{(i,j)}^T = 0$ are nonexistent, the errors are detected as uncorrectable error.

Figure 7:
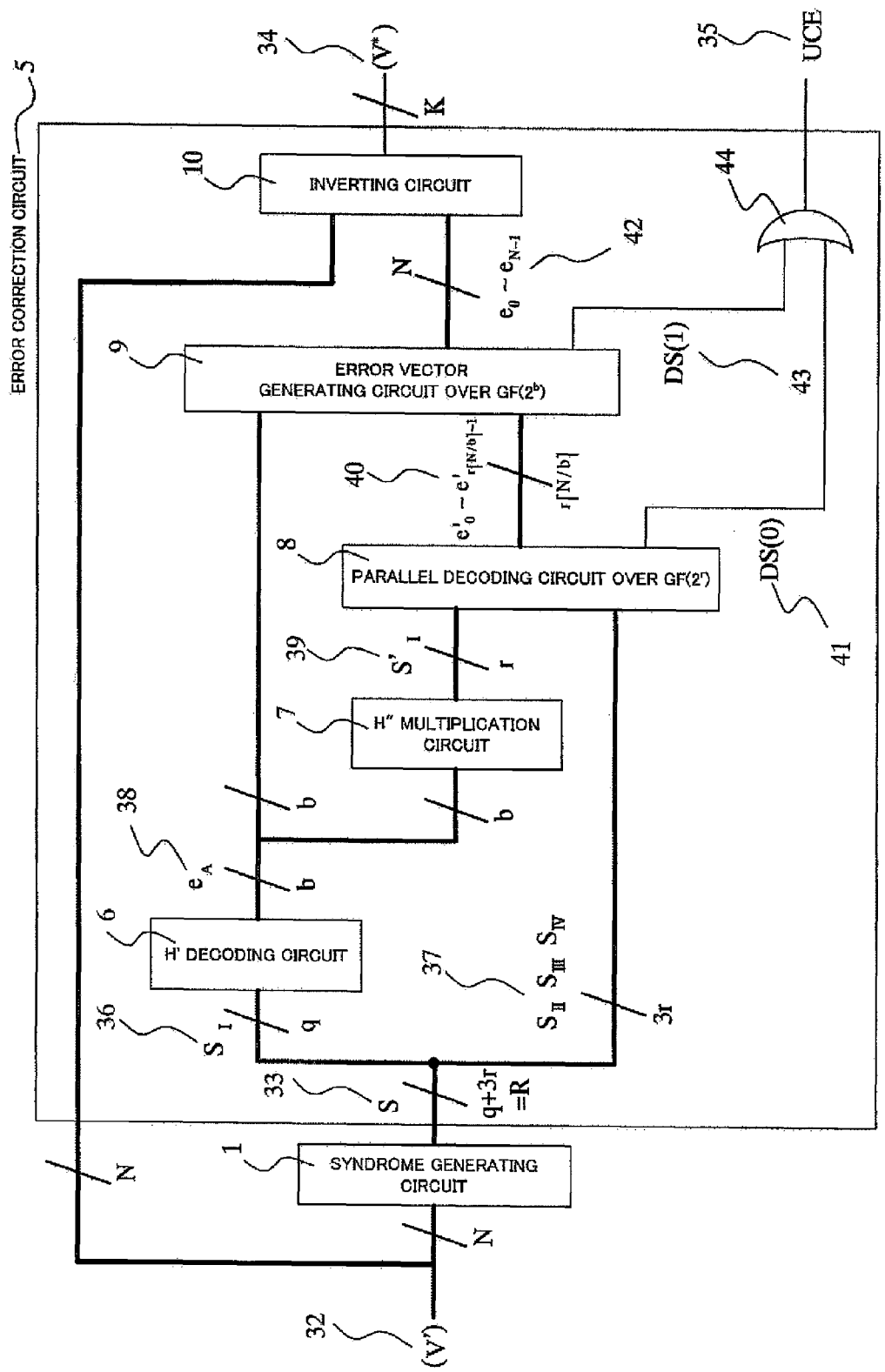
FIG. 7 is a block diagram illustrating a schematic configuration of a decoding circuit for codes having functions disclosed in the present invention.

In the present invention, the schematic configuration of the decoding circuit 4 for realizing the parallel decoding method for the code where $p_1 = p_2 = 2$ is shown in FIG. 7.

As shown in FIG. 1, the decoding circuit 4 comprises the syndrome generating circuit 1 and the error correction circuit 5.

As shown in FIG. 7, the error correction circuit 5 comprises an H' decoding circuit 6, an H" multiplication circuit 7, a parallel decoding circuit 8 over $GF(2^r)$, an error vector generating circuit 9 over $GF(2^b)$ and an inverting circuit 10.

The H' decoding circuit 6 generates a byte-by-byte sum of errors ($e_A$) 38 based on the upper q bits $S_I$ 36 on the syndrome (S) 33.

The H" multiplication circuit 7 generates a product ($S'_I$) 39 of the upper q bits $S_I$ 36 on the syndrome (S) 33 and transposed matrix ($H''^T$) of matrix H" based on the byte-by-byte sum of errors ($e_A$) 38.

The parallel decoding circuit 8 over $GF(2^r)$ generates bit-error pointer (e') 40 over $GF(2^r)$ and a DS(0) (Detection Signal) 41 to be output when an error cannot be corrected in the parallel decoding over $GF(2^r)$ based on the product ($S'_I$) 39 of the upper q bits $S_I$ 36 on the syndrome (S) 33 and the transposed matrix ($H''^T$) of matrix H", and lower 3r bits $S_{II}S_{III}S_{IV}$ 37 on the syndrome (S) 33.

The error vector generating circuit 9 over $GF(2^b)$ converts the error over $GF(2^r)$ into an error over $GF(2^b)$ based on the byte-by-byte sum of errors ($e_A$) 38 and the bit-error pointer (e') 40 over $GF(2^r)$, and outputs a bit-error pointer (e) 42 over $GF(2^b)$ and a DS(1) (Detection Signal) 43 to be output when the error correction is regarded as uncorrectable.

At the end, the inverting circuit 10 inverts a bit value of the received word (V') 32 corresponding to the error bit based on the bit-error pointer (e) 42 over $GF(2^b)$, thereby correcting the error in the received word (V') 32.

The schematic operating procedure to be performed by the decoding circuit 4 shown in FIG. 7 is explained below.

First, when the received word (V') 32 composed of N bits is input into the syndrome generating circuit 1, the syndrome generating circuit 1 generates the syndrome (S) 33 of R bits.

Next, the generated syndrome (S) 33 of R bits is divided into an upper q bits $S_I$ 36 and a lower 3r bits $S_{II}S_{III}S_{IV}$ 37. The upper q bits $S_I$ 36 on the syndrome (S) 33 are input into the H' decoding circuit 6. The lower 3r bits $S_{II}S_{III}S_{IV}$ 37 on the syndrome (S) 33 are input into the parallel decoding circuit 8 over $GF(2^r)$.

The H' decoding circuit 6, as detailed later, outputs the byte-by-byte sum of errors ($e_A$) 38 of b bits based on the upper q bits $S_I$ 36 on the syndrome (S) 33 generated by the syndrome generating circuit 1.

The H" multiplication circuit 7, as detailed later, outputs the product ($S'_I$) 39 of the upper q bits $S_I$ 36 on the syndrome (S) 33 and the transposed matrix ($H''^T$) of matrix H" based on the byte-by-byte sum of errors ($e_A$) 38 generated by the H' decoding circuit 6.

The parallel decoding circuit 8 over $GF(2^r)$, as detailed later, generates a bit-error pointer $e' = (e'_0, e'_1, \ldots, e'_{r\lceil N/b \rceil - 1})$ 40 over $GF(2^r)$ of $r\lceil N/b \rceil$ bits indicating an error over $GF(2^r)$ based on the product ($S'_I$) 39 of the upper q bits $S_I$ 36 on the syndrome (S) 33 and the transposed matrix ($H''^T$) of matrix H" that is generated by the H" multiplication circuit 7, and the lower 3r bits $S_{II}S_{III}S_{IV}$ 37 on the syndrome (S) 33 that is generated by the syndrome generating circuit 1. Where, FYI represents a minimum integer which exceeds y. When the error correction is regarded as impossible in the parallel decoding over $GF(2^r)$, the parallel decoding circuit 8 over $GF(2^r)$ outputs an uncorrectable error detection signal (DS(0)) 41.

The error vector generating circuit 9 over $GF(2^b)$, as detailed later, generates a bit-error pointer $e = (e_0, e_1, \ldots, e_{N-1})$ 42 over $GF(2^b)$ of N bits indicating the error over $GF(2^b)$ based on the byte-by-byte sum of errors ($e_A$) 38 generated by the H' decoding circuit 6 and the bit-error-pointer (e') 40 over $GF(2^r)$ generated by the parallel decoding circuit 8 over $GF(2^r)$. The error vector generating circuit 9 over $GF(2^b)$ outputs an uncorrectable error detection signal (DS(1)) 43 when the error is regarded as uncorrectable.

Next, the inverting circuit 10 inverts bits of the received word (V') 32 corresponding to the bit-error pointer (e) 42 over $GF(2^b)$ based on the bit-error pointer (e) 42 over $GF(2^b)$ of N bits generated by the error vector generating circuit 9 over $GF(2^b)$ and the received word (V') 32.

Finally, the inverting circuit 10 takes out the information word D* of K bits from the received word V* of N bits whose error is corrected, and outputs it as the output information data 34.

Logical sum of the uncorrectable error detection signal (DS(0)) 41 generated by the parallel decoding circuit 8 over $GF(2^r)$ and the uncorrectable error detection signal (DS(1)) 43 generated by the error vector generating circuit 9 over $GF(2^b)$ is obtained, so that a value of an uncorrectable error detection signal UCE (Uncorrectable Error) 35 is output. For example, when the value of the uncorrectable error detection signal UCE 35 is "1", "1" means that an error, which exceeds the correction capability, is detected.

As to also the lengthened code expressed by the parity check matrix (H) shown in the Expression 5 (lengthened $[\mu_1 t/bEC]_{p_1} - [\mu_2 t/bED]_{p_2}$ code), the error control code for controlling multiple spotty-byte errors within a byte occurred in a limited number of bytes with byte error detection function which is expressed by the parity check matrix (H) shown in the Expression 25, and the lengthened code expressed by the parity check matrix (H) shown in the Expression 28 (lengthened $[\mu_1 t/bEC]_{p_1} - [\mu_2 t/bED]_{p_2} - S_b ED$ code), their decoding method and the circuit constitutions are basically the same as the above-mentioned decoding method and circuit constitution.

The concrete constitutional examples of the syndrome generating circuit 1, the H' decoding circuit 6, the H" multiplication circuit 7, the parallel decoding circuit 8 over $GF(2^r)$, the error vector generating circuit over $GF(2^b)$, and the inverting circuit 10 are explained below by using the (90,64) $[4_{1/8}EC]_2$ code shown in FIG. 3.

<a> The Constitution of the Syndrome Generating Circuit 1

The constitution of the syndrome generating circuit 1 is explained in detail here.

When the received word (V') 32 composed of N=90 (=64+26) bits is expressed as shown in the following Expression 41, the syndrome generating circuit inputs the received word (V') 32 and generates the syndrome (S) 33 of R=26 bits composed of $S_0, S_1, \ldots$, and $S_{25}$ shown in the following Expression 42.

Since the parity check matrix of the $[4_{1/8}EC]_2$ code shown in FIG. 3 has a 4-tiered structure, the syndrome (S) 33 is also divided into four sections accordingly, and $S_I = (S_0 S_1 S_2 S_3 S_4 S_5 S_6 S_7)$, $S_{II} = (S_8 S_9 S_{10} S_{11} S_{12} S_{13})$, $S_{III} = (S_{14} S_{15} S_{16} S_{17} S_{18} S_{19})$] $S_{IV} = (S_{20} S_{21} S_{22} S_{23} S_{24} S_{25})$.

$$V' = (v_0', v_1', \ldots, v_{89}') \quad \text{[Expression 41]}$$

$$S = (S_I | S_{II} | S_{III} | S_{IV}) =$$
$$(S_0 S_1 S_2 S_3 S_4 S_5 S_6 S_7 | S_8 S_9 S_{10} S_{11} S_{12} S_{13} | S_{14} S_{15} S_{16} S_{17} S_{18} S_{19} | S_{20} S_{21} S_{22} S_{23} S_{24} S_{25}) \quad \text{[Expression 42]}$$

As shown in the Expression 34, according to the syndrome $S = V' \cdot H^T$, each row of the transposed parity check matrix ($H^T$) corresponds to information to be input, and for example, the 0th row of the matrix ($H^T$) corresponds to $v_0'$ of input information.

In order to generate each bit of the syndrome (S) 33, therefore, the received information of the received word (V') 32 corresponding to the bit having "1" may be added to each column direction of the parity check matrix ($H^T$) as the code over GF(2) (calculation of mod 2).

Figure 8:
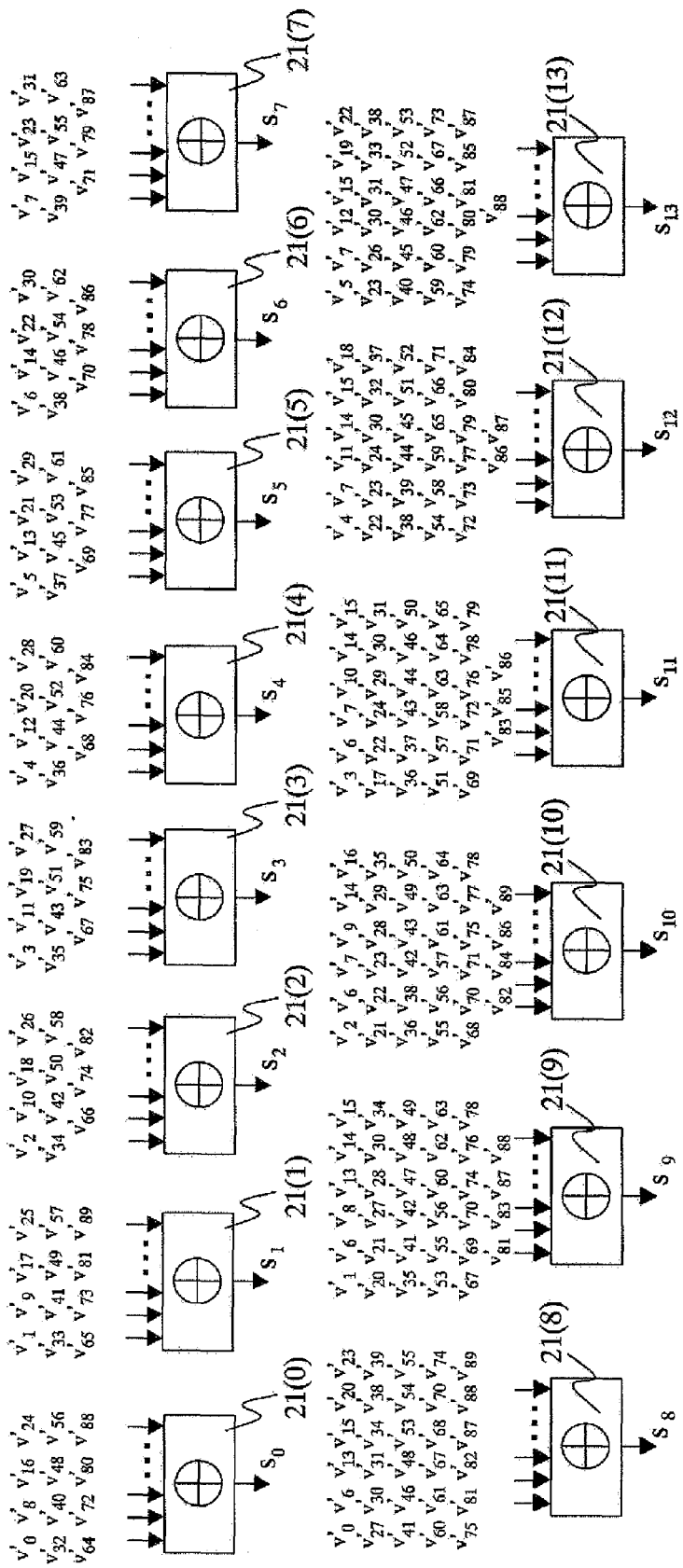
FIG. 8 is a conceptual diagram for explaining a syndrome generating circuit (upper 14 bits) configured concretely based on the (90,64) $[4_{1/8}EC]_2$ code shown in FIG. 3.
Figure 9:
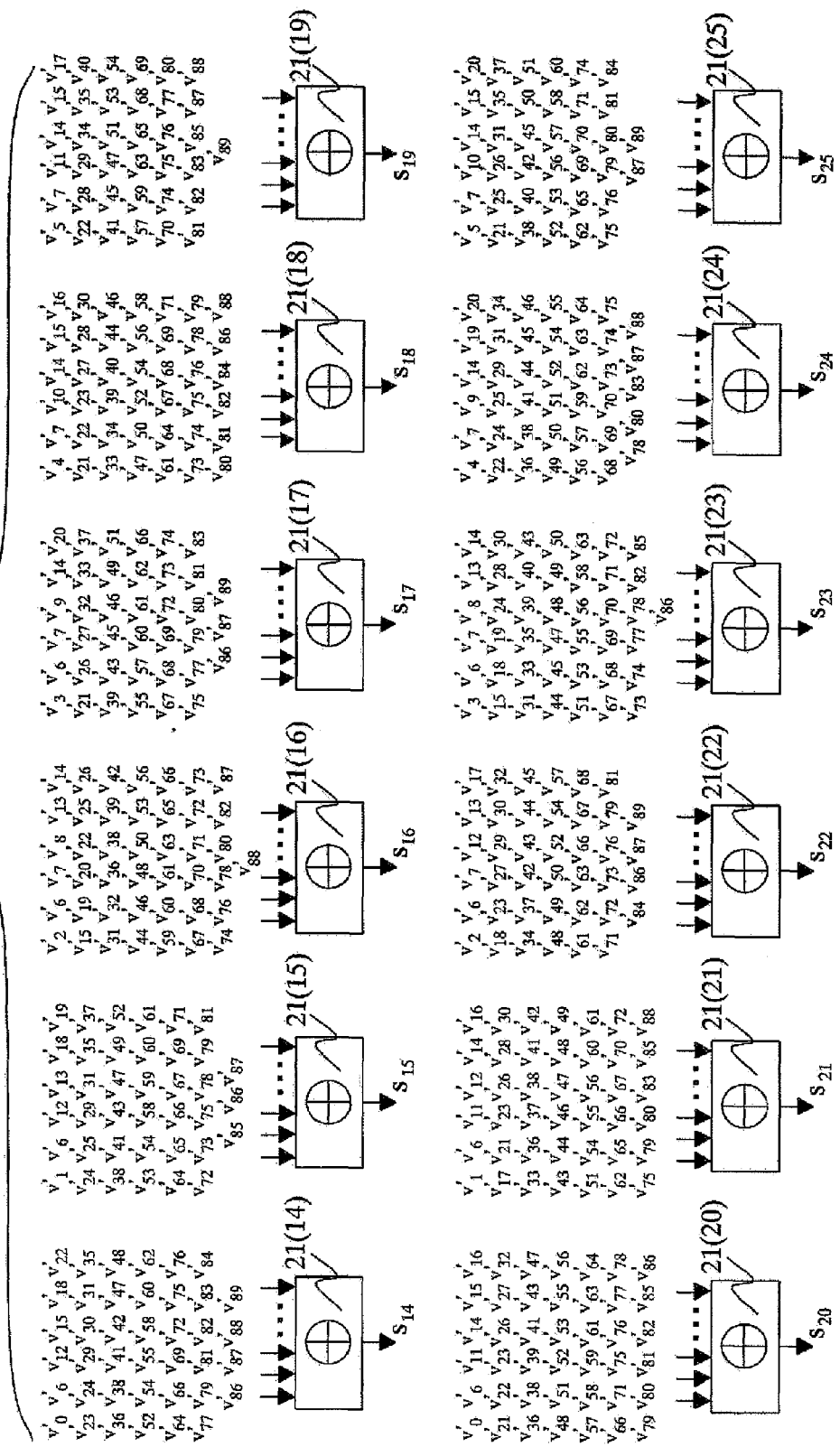
FIG. 9 is a conceptual diagram for explaining a syndrome generating circuit (lower 12 bits) configured concretely based on the (90,64) $[4_{1/8}EC]_2$ code shown in FIG. 3.

FIGS. 8 and 9 are diagrams illustrating the syndrome generating circuit 1 which is constituted based on the parity check matrix of the (90,64) $[4_{1/8}EC]_2$ code shown in FIG. 3. In FIG. 8, upper 14 bits of the syndrome (S) 33 such as $S_0, S_1, \ldots, S_{13}$ are generated, and in FIG. 9, lower 12 bits of the syndrome (S) 33 such as $S_{14}, S_{15}, \ldots, S_{25}$ are generated.

As shown in FIGS. 8 and 9, in this embodiment, in the syndrome generating circuit 1, first, received information $(v_q')$, $(q=0, 1, \ldots, 89)$ having the bit "1" of each corresponding row of the parity check matrix of the (90,64) $[4_{1/8}EC]_2$ code shown in FIG. 3 is input into 26 multi-input parity check circuits 21(p), (p=0, 1, \ldots, 25).

Next, in each multi-input parity check circuits 21(p), (p=0, 1, \ldots, 25), the sum (mod 2) of modulo 2 is calculated for the input received information $(v_q')$, and its result is $S_p$.

Concretely, for example, in order to generate the bit $S_0$ of the syndrome (S) 33, the sum (mod 2) of modulo 2 may be obtained for 12 bits $v_0', v_8', v_{16}', v_{24}', v_{32}', v_{40}', v_4', v_{56}', v_{64}', v_{72}', v_{80}', v_{88}'$ corresponding to the locations where "1" exists on the 0th row of the parity check matrix shown in FIG. 3, among the received word $v_0', v_1', \ldots$, and $v_{89}'$ of 90 bits. The multi-input parity check circuit 21(0) of FIG. 8 inputs the received information of 12 bits and outputs the value $S_0$. This is applied also to the other bits $S_p$, (p=1, \ldots, 25) of the syndrome (S) 33.

<b> The constitution of the H' Decoding Circuit 6

The H' decoding circuit 6 is explained below.

Figure 10:
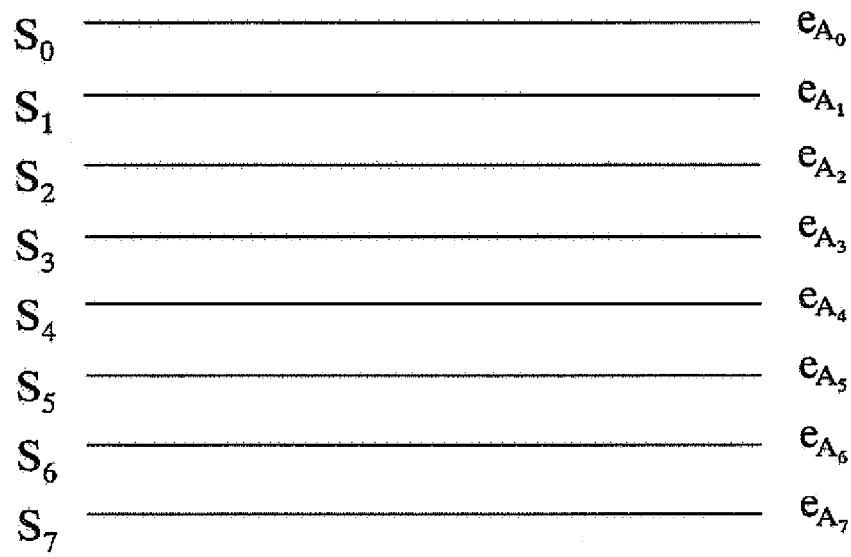
FIG. 10 is a configuration diagram of an H' decoding circuit configured concretely based on the (90,64) $[4_{1/8}EC]_2$ code shown in FIG. 3.

The H' decoding circuit 6 is shown in FIG. 10. In $(e_I + e_{II}) \cdot H'^T = S_I$ shown in the Expression 36, since H' is a matrix where any $\text{Min}((\mu_1 + \mu_2), b)$ columns are linearly independent, $e_I + e_{II}$ ($= e_A$) can be obtained. Therefore, logic synthesis is carried out so that the H' decoding circuit can be realized by combined circuits.

In the case of the (90,64) $[4_{1/8}EC]_2$ code shown in FIG. 3, since H' is the identity matrix, $e_A = e_I + e_{II} = S_I$. That is, with respect to $e_A = (e_{A_0} e_{A_1} e_{A_2} e_{A_3} e_{A_4} e_{A_5} e_{A_6} e_{A_7})$, $S_I = (S_0 S_1 S_2 S_3 S_4 S_5 S_6 S_7)$, as shown in FIG. 10, $e_{A_0} = S_0$, $e_{A_1} = S_1$, $e_{A_2} = S_2$, $e_{A_3} = S_3$, $e_{A_4} = S_4$, $e_{A_5} = S_5$, $e_{A_6} = S_6$, $e_{A_7} = S_7$.

On the other hand, when H' is not the identity matrix, a method, mentioned later in <e> is used.

<c> The Constitution of the H" Multiplication Circuit 7

The H" multiplication circuit 7 is explained below.

Figure 11:
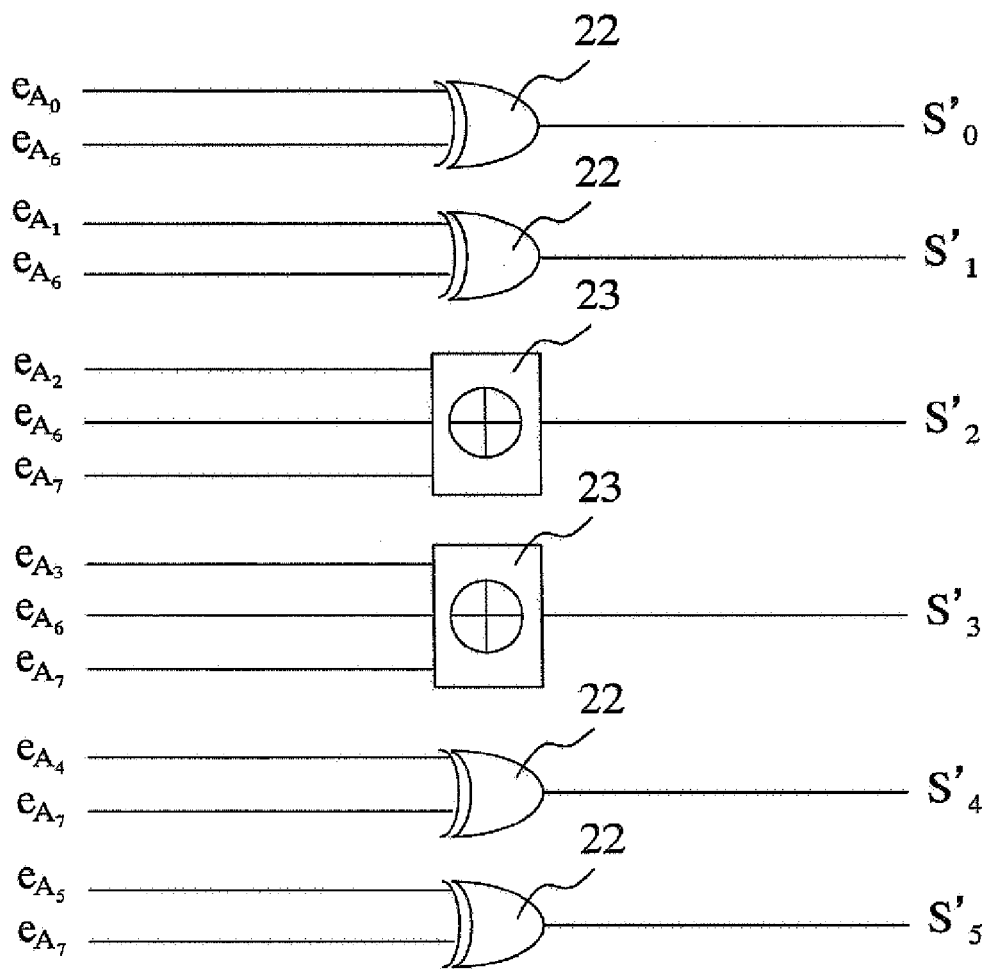
FIG. 11 is a configuration diagram of an H" multiplication circuit configured concretely based on the (90,64) $[4_{1/8}EC]_2$ code shown in FIG. 3.

The H" multiplication circuit 7 is shown in FIG. 11. A calculation such that $S_I' = (e_I + e_{II}) \cdot H''^T = e_A \cdot H''^T$ shown in the Expression 37 is carried out. The information $e_A$ having bit "1" of each corresponding row in H" shown in the following Expression 43 is input into the H" multiplication circuit 7. The H" multiplication circuit 7 performs the calculation of S'p (p=0, 1, \ldots, 5) modulo 2 for the input information $e_A$, and then outputs this.

$$H'' = \begin{bmatrix} 1 & 0 & 0 & 0 & 0 & 0 & 1 & 0 \\ 0 & 1 & 0 & 0 & 0 & 0 & 1 & 0 \\ 0 & 0 & 1 & 0 & 0 & 0 & 1 & 1 \\ 0 & 0 & 0 & 1 & 0 & 0 & 1 & 1 \\ 0 & 0 & 0 & 0 & 1 & 0 & 0 & 1 \\ 0 & 0 & 0 & 0 & 0 & 1 & 0 & 1 \end{bmatrix} \quad \text{[Expression 43]}$$

Concretely, for example, in order to generate the bit $S'_0$ of the product ($S'_I$) 39 of the upper q bits $S_I$ 36 on the syndrome (S) 33 and the transposed matrix ($H''^T$) of matrix H", the sum modulo 2 (mod 2) may be obtained for the values of 2 bits $e_{A_0}$, $e_{A_6}$ corresponding to the location where "1" exists on the 0th row of the parity check matrix H" shown in the Expression 43, among $e_A = (e_{A_0} e_{A_1} e_{A_2} e_{A_3} e_{A_4} e_{A_5} e_{A_6} e_{A_7})$ 38 with 8 bits.

In FIG. 11, the exclusive logical sum circuit 22 inputs the information $e_A$ of 2 bits (namely, the values of 2 bits $e_{A_0}$, $e_{A_6}$), and outputs the value $S'_0$.

The exclusive logical sum circuit 22 and a 3-inputs parity check circuit 23 can be used similarly for the other bits $S'_p$ of the product ($S'_I$) 39 of the upper q bits $S_I$ 36 on the syndrome (S) 33 and the transposed matrix ($H''^T$) of matrix H".

Here, S' has the constitution shown in the following Expression 44.

$$S' = \quad \text{[Expression 44]}$$
$$(S'_I | S_{II} | S_{III} | S_{IV}) = (S'_0 S'_1 S'_2 S'_3 S'_4 S'_5 | S_8 S_9 S_{10} S_{11} S_{12} S_{13} |$$
$$S_{14} S_{15} S_{16} S_{17} S_{18} S_{19} | S_{20} S_{21} S_{22} S_{23} S_{24} S_{25}) =$$
$$(S'_0 S'_1 S'_2 S'_3 S'_4 S'_5 | S'_6 S'_7 S'_8 S'_9 S'_{10} S'_{11} |$$
$$S'_{12} S'_{13} S'_{14} S'_{15} S'_{16} S'_{17} | S'_{18} S'_{19} S'_{20} S'_{21} S'_{22} S'_{23})$$

<d> The Constitution of the Parallel Decoding Circuit 8 Over $GF(2^6)$

The parallel decoding circuit 8 over $GF(2^6)$ is explained below.

In order to obtain the bit-error pointer 40 over $GF(2^6)$, the parallel decoding method is used. The entire constitution of the parallel decoding circuit 8 over $GF(2^6)$ is shown in FIG. 12.

Figure 12:
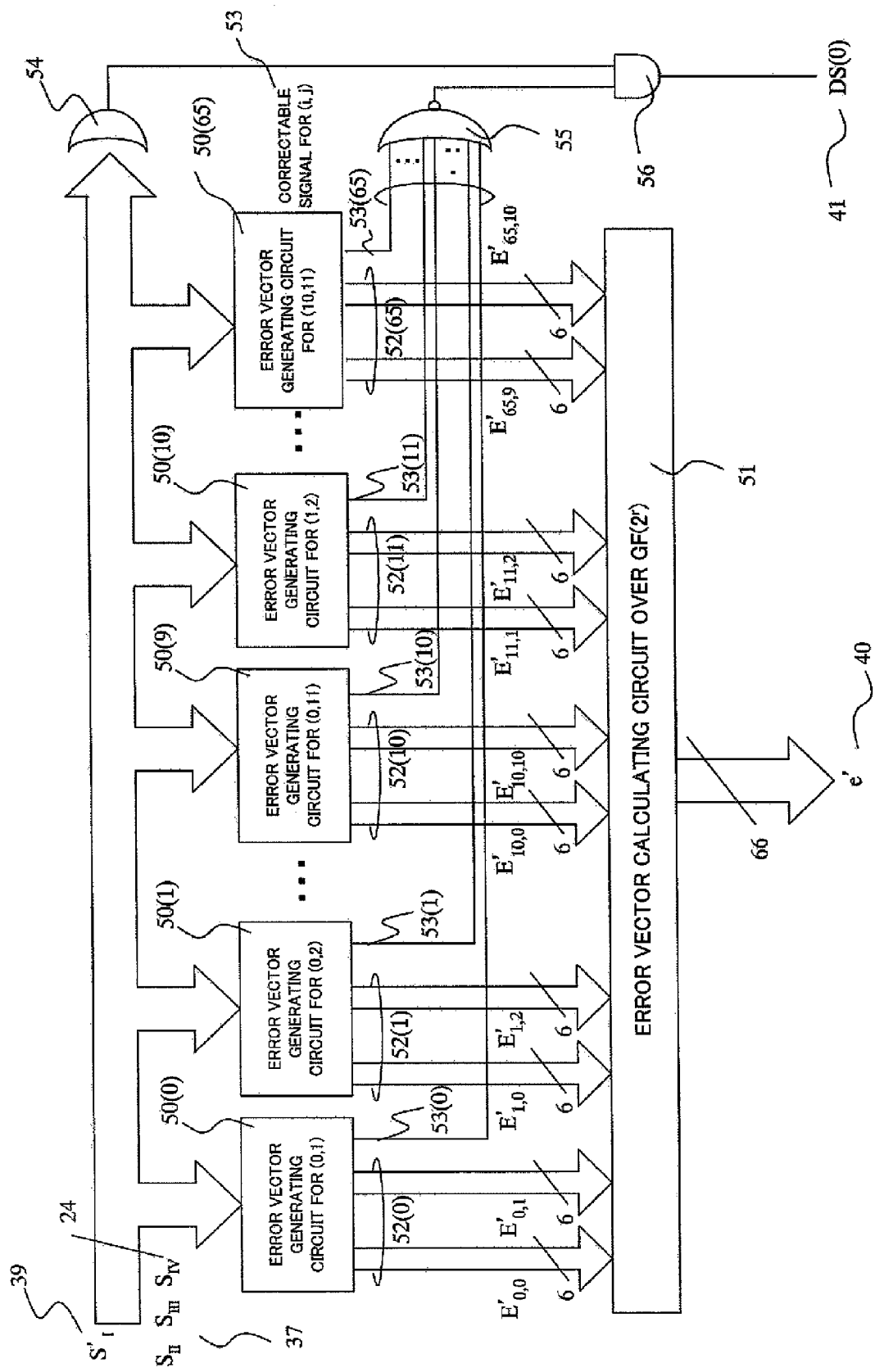
FIG. 12 is a block diagram illustrating a schematic configuration of a parallel decoding circuit over $GF(2^r)$ for the (90,64) $[4_{1/8}EC]_2$ code shown in FIG. 3.

As shown in FIG. 12, the parallel decoding circuit 8 over $GF(2^6)$ is composed of error vector generating circuits for (i,j) 50(0) . . . 50(65) (herein after, 50(m) and $0 \leq m \leq 65$) that are circuits which select 66 pieces $\binom{12}{2}$ of set of any 2 bytes in 12 bytes and generate respective errors in i-th and j-th 2 bytes (herein after, (i,j)), and of an error calculating circuit 51 over $GF(2^6)$ which outputs the bit-error pointer (e') 40 over $GF(2^6)$.

The error vector generating circuit 50(m) for (i,j) calculates $S' \cdot \tilde{H}_i^{\dagger T}$, $S' \cdot \tilde{H}_j^{\dagger T}$, $S' \cdot \tilde{B}_{(i,j)}^{\dagger T}$ for the byte positions i and j. In other words, the error vector generating circuits 50(0) to 50(65) for (i,j) calculate $S' \cdot \tilde{H}_i^{\dagger T}$, $S' \cdot \tilde{H}_j^{\dagger T}$, $S' \cdot \tilde{B}_{(i,j)}^{\dagger T}$ for the i-th byte and j-th byte ($0 \leq i \leq j \leq 11$) in 12 bytes of the code word, and output errors 52(m) to be $E'_{m,i}$, $E'_{m,j}$, $0 \leq m \leq 65$, $0 \leq i < j \leq 11$ (each are vectors of r bits), and correctable signals 53(m), $0 \leq m \leq 65$.

The error calculating circuit 51 over $GF(2^6)$ is a circuit that outputs the bit-error pointer (e') 40 over $GF(2^6)$. In other words, the error calculating circuit 51 over $GF(2^6)$ inputs the errors $E'_{m,i}$ and $E'_{m,j}$ that are the output of the error vector generating circuit 50(m) for (i,j) and outputs the bit-error pointer (e') 40 over $GF(2^6)$.

Here, the process of the parallel decoding circuit 8 over $GF(2^6)$ is explained more concretely. As shown in FIG. 12, first, S' of 24 bits (the product (S'$_I$) 39 of the upper q bits $S_I$36 on the syndrome (S) 33 and the transposed matrix $(H''^T)$ of matrix H", and the lower 3r bits $S_{II}S_{III}S_{IV}$37 on the syndrome (S) 33) is input into the error vector generating circuit 50(m) for (i,j).

Next, the error vector generating circuit 50(m) for (i,j) generates errors $E'_{m,i}$ and $E'_{m,j}$, and inputs the generated errors $E'_{m,i}$ and $E'_{m,j}$ into the error calculating circuit 51 over GF(26). The error calculating circuit 51 over $GF(2^6)$ outputs the bit-error pointer (e') 40 over $GF(2^6)$.

In addition, S' of 24 bits (the product (S'$_I$) 39 of the upper q bits $S_I$36 on the syndrome (S) 33 and the transposed matrix $(H''^T)$ of matrix H", and the lower 3r bits $S_{II}S_{III}S_{IV}$37 on the syndrome (S) 33) is input into a 24-bits-input OR gate circuit 54.

On the other hand, the correctable signals 53(m) generated by the error vector generating circuits 50(m) for (i,j) are input into a 66-inputs NOR gate circuit 55.

The two signals output from the 24-bits-input OR gate circuit 54 and the 66-inputs NOR gate circuit 55 respectively, are input into a 2-inputs AND gate circuit 56. The 2-inputs AND gate circuit 56 outputs an uncorrectable error detection signal (DS(0)) 41. These circuits detect errors when the syndrome is not 0 and all the correctable signals are 0.

Figure 13:
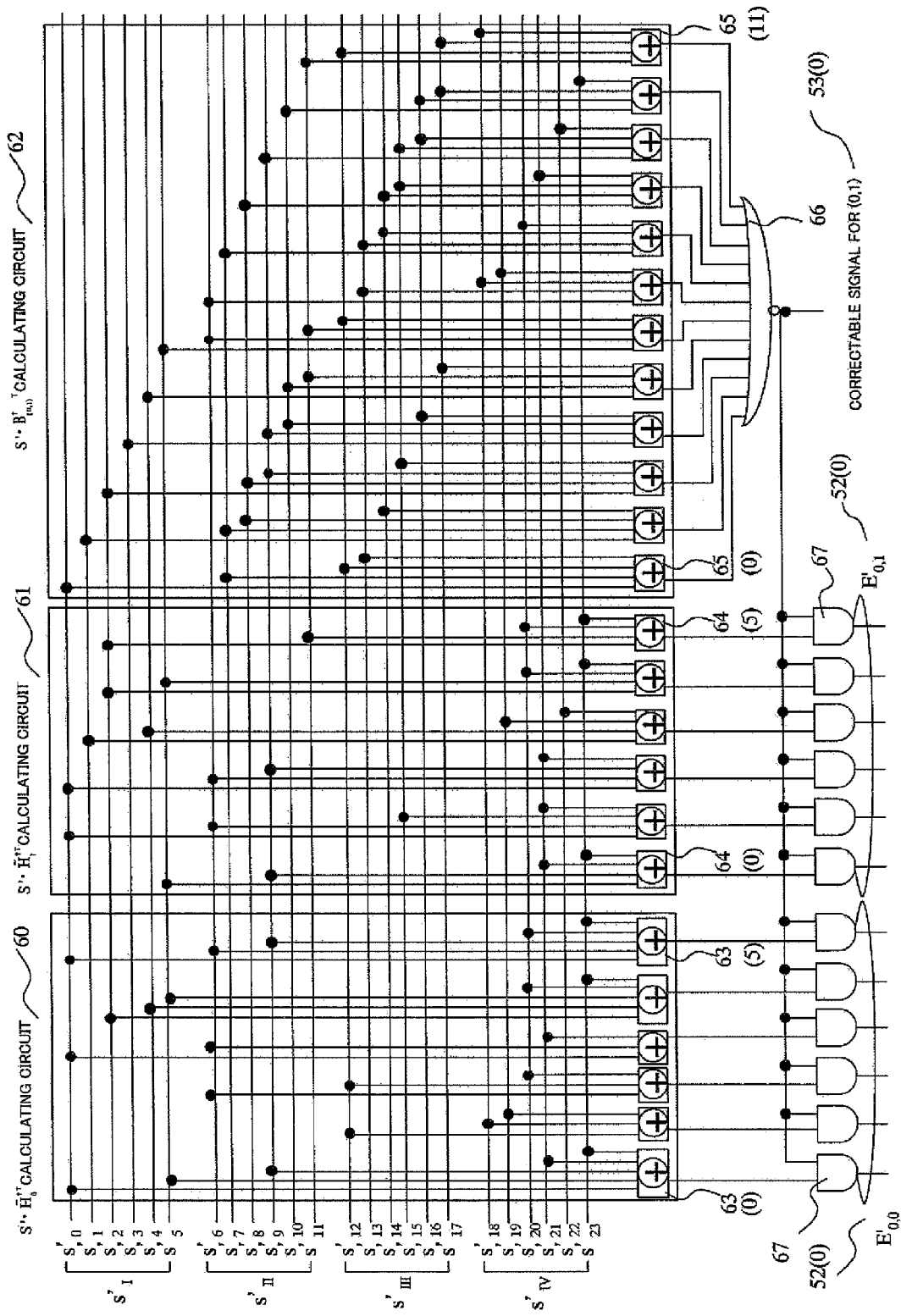
FIG. 13 is a circuit configuration diagram illustrating one example of an error vector generating circuit for (i,j) in the parallel decoding circuit over $GF(2^r)$ shown in FIG. 12.

Next, the constitutional example of the error vector generating circuit 50(m) for (i,j) is explained below concretely. As an example, the error vector generating circuit 50(0) for (0,1) is shown in FIG. 13. As shown in FIG. 13, the error vector generating circuit 50(m) for (i,j) comprises an $S' \cdot \tilde{H}_i^{\dagger T}$ calculating circuit 60, an $S' \cdot \tilde{H}_j^{\dagger T}$ calculating circuit 61 and an $S' \cdot \tilde{B}_{(i,j)}^{\dagger T}$ calculating circuit 62.

Where, $\tilde{H}$ represents a check matrix of the RS code over $GF(2^6)$ shown in the following Expression 45, and has a code length of 72 bits and a check bit length of 24 bits. γ is an element of $GF(2^6)$, and as shown in the following Expression 46, it is expressed by a binary 6×6 companion matrix defined by a generator polynominal: $g(x) = x^6 + x + 1$.

$$\tilde{H} = \begin{bmatrix} 1 & 1 & 1 & 1 & 1 & 1 & 1 & 1 & 1 & 1 & 1 & 1 \\ 1 & \gamma & \gamma^2 & \gamma^3 & \gamma^4 & \gamma^5 & \gamma^6 & \gamma^7 & \gamma^8 & \gamma^9 & \gamma^{10} & \gamma^{11} \\ 1 & \gamma^2 & \gamma^4 & \gamma^6 & \gamma^8 & \gamma^{10} & \gamma^{12} & \gamma^{14} & \gamma^{16} & \gamma^{18} & \gamma^{20} & \gamma^{22} \\ 1 & \gamma^3 & \gamma^6 & \gamma^9 & \gamma^{12} & \gamma^{15} & \gamma^{18} & \gamma^{21} & \gamma^{24} & \gamma^{27} & \gamma^{30} & \gamma^{33} \end{bmatrix}$$ [Expression 45]

$$\gamma = \begin{bmatrix} 0 & 0 & 0 & 0 & 0 & 1 \\ 1 & 0 & 0 & 0 & 0 & 1 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \end{bmatrix}$$ [Expression 46]

For example, in the error vector generating circuit 50 (0) for (0,1), $H_0$, and $H_1$ correspond to the 0-th and the first columns of the Expression 45, and they are 24×6 matrices shown in the following Expression 47.

$$\tilde{H}_0 = \begin{bmatrix} 1 \\ 1 \\ 1 \\ 1 \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix}$$ [Expression 47]

-continued $$\tilde{H}_1 = \begin{bmatrix} 1 \\ \gamma \\ \gamma^2 \\ \gamma^3 \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ \hline 0 & 0 & 0 & 0 & 0 & 1 \\ 1 & 0 & 0 & 0 & 0 & 1 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ \hline 0 & 0 & 0 & 0 & 1 & 0 \\ 0 & 0 & 0 & 0 & 1 & 1 \\ 1 & 0 & 0 & 0 & 0 & 1 \\ 0 & 1 & 0 & 0 & 0 & 0 \\ 0 & 0 & 1 & 0 & 0 & 0 \\ 0 & 0 & 0 & 1 & 0 & 0 \\ \hline 0 & 0 & 0 & 1 & 0 & 0 \\ 0 & 0 & 0 & 1 & 1 & 0 \\ 0 & 0 & 0 & 0 & 1 & 1 \\ 1 & 0 & 0 & 0 & 0 & 1 \\ 0 & 1 & 0 & 0 & 0 & 0 \\ 0 & 0 & 1 & 0 & 0 & 0 \end{bmatrix}$$

Next, a 24×12 matrix $\tilde{H}_{(0,1)} = [\tilde{H}_0 \ \tilde{H}_1]$ is constructed from $\tilde{H}_0$, $\tilde{H}_1$, and a 24×12 matrix $B_{(0,1)}$ is added to $\tilde{H}_{(0,1)}$, so that a 24×24 nonsingular matrix $A_{(0,1)} = [\tilde{H}_{(0,1)} \ B_{(0,1)}]$ shown in the following Expression 48 is constructed. Where, $B_{(0,1)}$ is a 24×12 matrix obtained so that $A_{(0,1)}$ becomes a nonsingular matrix, and is one example.

$$A_{(0,1)} = [\tilde{H}_0 \ \tilde{H}_1 \ B_{(0,1)}] =$$

[Expression 48]

$$\begin{bmatrix}
1 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 0 & 0 & 1 & 0 & 0 & 0 & 0 & 1 & 1 & 0 & 0 & 0 & 0 & 1 & 0 & 1 & 0 & 0 & 0 \\
0 & 0 & 1 & 0 & 0 & 0 & 0 & 0 & 1 & 0 & 0 & 0 & 1 & 0 & 1 & 0 & 0 & 0 & 0 & 1 & 1 & 0 & 0 & 0 \\
0 & 0 & 0 & 1 & 0 & 0 & 0 & 0 & 0 & 1 & 0 & 0 & 1 & 1 & 0 & 1 & 1 & 0 & 1 & 0 & 1 & 1 & 0 & 1 \\
0 & 0 & 0 & 0 & 1 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 1 & 0 & 0 & 0 & 0 & 0 & 1 & 1 & 0 & 1 & 0 & 0 & 1 & 0 & 1 & 1 & 0 & 0 & 0 \\
1 & 0 & 0 & 0 & 0 & 0 & 0 & 0 & 0 & 0 & 0 & 1 & 1 & 0 & 1 & 0 & 0 & 1 & 0 & 1 & 1 & 0 & 0 & 0 \\
0 & 1 & 0 & 0 & 0 & 0 & 1 & 0 & 0 & 0 & 0 & 1 & 0 & 0 & 1 & 0 & 0 & 1 & 1 & 1 & 1 & 0 & 0 & 0 \\
0 & 0 & 1 & 0 & 0 & 0 & 0 & 1 & 0 & 0 & 0 & 0 & 1 & 0 & 0 & 0 & 0 & 0 & 0 & 1 & 1 & 0 & 0 & 0 \\
0 & 0 & 0 & 1 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 1 & 0 & 0 & 0 & 0 & 1 & 0 & 0 & 0 & 1 & 1 & 0 & 0 & 1 & 1 & 1 & 0 & 1 & 1 & 1 \\
0 & 0 & 0 & 0 & 0 & 1 & 0 & 0 & 0 & 0 & 1 & 0 & 1 & 0 & 1 & 0 & 0 & 1 & 0 & 1 & 1 & 0 & 0 & 0 \\
1 & 0 & 0 & 0 & 0 & 0 & 0 & 0 & 0 & 0 & 1 & 0 & 1 & 0 & 1 & 0 & 0 & 0 & 0 & 1 & 1 & 0 & 0 & 0 \\
0 & 1 & 0 & 0 & 0 & 0 & 0 & 0 & 0 & 0 & 1 & 1 & 0 & 0 & 0 & 0 & 0 & 1 & 1 & 0 & 0 & 0 & 0 & 0 \\
0 & 0 & 1 & 0 & 0 & 0 & 1 & 0 & 0 & 0 & 0 & 1 & 0 & 0 & 1 & 0 & 0 & 1 & 0 & 0 & 1 & 0 & 0 & 0 \\
0 & 0 & 0 & 1 & 0 & 0 & 0 & 1 & 0 & 0 & 0 & 0 & 0 & 0 & 0 & 0 & 0 & 0 & 0 & 0 & 0 & 0 & 0 & 0 \\
0 & 0 & 0 & 0 & 1 & 0 & 0 & 0 & 1 & 0 & 0 & 0 & 1 & 0 & 1 & 0 & 1 & 1 & 0 & 1 & 1 & 0 & 1 & 0 \\
0 & 0 & 0 & 0 & 0 & 1 & 0 & 0 & 0 & 1 & 0 & 0 & 1 & 1 & 0 & 0 & 1 & 0 & 1 & 0 & 1 & 1 & 1 & 1 \\
1 & 0 & 0 & 0 & 0 & 0 & 0 & 0 & 0 & 1 & 0 & 0 & 1 & 1 & 0 & 0 & 1 & 1 & 1 & 0 & 1 & 1 & 1 & 0 \\
0 & 1 & 0 & 0 & 0 & 0 & 0 & 0 & 0 & 1 & 1 & 0 & 0 & 1 & 1 & 0 & 1 & 1 & 1 & 1 & 0 & 1 & 1 & 0 \\
0 & 0 & 1 & 0 & 0 & 0 & 0 & 0 & 0 & 0 & 1 & 1 & 0 & 0 & 0 & 0 & 0 & 1 & 0 & 0 & 0 & 0 & 0 & 0 \\
0 & 0 & 0 & 1 & 0 & 0 & 1 & 0 & 0 & 0 & 0 & 1 & 1 & 0 & 1 & 0 & 0 & 1 & 0 & 1 & 1 & 0 & 0 & 0 \\
0 & 0 & 0 & 0 & 1 & 0 & 0 & 1 & 0 & 0 & 0 & 0 & 1 & 0 & 1 & 1 & 0 & 1 & 1 & 1 & 1 & 1 & 0 \\
0 & 0 & 0 & 0 & 0 & 1 & 0 & 0 & 1 & 0 & 0 & 0 & 0 & 0 & 0 & 0 & 0 & 0 & 0 & 0 & 0 & 0 & 0 & 0
\end{bmatrix}$$

Next, when the inverse matrix $A_{(0,1)}^{-1}$ of $A_{(0,1)}$ is obtained, a relationship of the following Expression 49 holds. $\tilde{H}_0^\dagger, \tilde{H}_1^\dagger, B_{(0,1)}^\dagger$ become matrices shown in the following Expressions 50, 51 and 52, respectively.

$$A_{(0,1)}^{-1} = \begin{bmatrix} \tilde{H}_{(0,1)}^\dagger \\ B_{(0,1)}^\dagger \end{bmatrix} = \begin{bmatrix} \tilde{H}_0^\dagger \\ \tilde{H}_1^\dagger \\ B_{(0,1)}^\dagger \end{bmatrix}$$

[Expression 49]

$$\tilde{H}_0^\dagger = \begin{bmatrix} 1 & 0 & 0 & 0 & 0 & 1 & 0 & 0 & 0 & 1 & 0 & 0 & 0 & 0 & 0 & 0 & 0 & 0 & 0 & 0 & 1 & 0 & 1 \\ 0 & 0 & 0 & 0 & 0 & 0 & 0 & 0 & 0 & 0 & 0 & 1 & 0 & 0 & 0 & 0 & 0 & 1 & 1 & 0 & 0 & 0 & 0 \\ 0 & 0 & 0 & 0 & 0 & 0 & 1 & 0 & 0 & 0 & 0 & 0 & 1 & 0 & 0 & 0 & 0 & 0 & 0 & 0 & 1 & 0 & 0 & 0 \\ 1 & 0 & 0 & 0 & 0 & 0 & 1 & 0 & 0 & 0 & 0 & 0 & 0 & 0 & 0 & 0 & 0 & 0 & 0 & 0 & 0 & 1 & 0 & 0 \\ 0 & 0 & 1 & 0 & 1 & 1 & 0 & 0 & 0 & 0 & 0 & 0 & 0 & 0 & 0 & 0 & 0 & 0 & 0 & 0 & 1 & 0 & 0 & 1 \\ 1 & 0 & 0 & 0 & 0 & 0 & 1 & 0 & 0 & 1 & 0 & 0 & 0 & 0 & 0 & 0 & 0 & 0 & 0 & 0 & 1 & 0 & 0 & 1 \end{bmatrix}$$

[Expression 50]

$$\tilde{H}_1^\dagger = \begin{bmatrix} 0 & 0 & 0 & 0 & 0 & 1 & 0 & 0 & 0 & 1 & 0 & 0 & 0 & 0 & 0 & 0 & 0 & 0 & 0 & 0 & 1 & 0 & 1 \\ 1 & 0 & 0 & 0 & 0 & 0 & 1 & 0 & 0 & 0 & 0 & 0 & 0 & 0 & 1 & 0 & 0 & 0 & 0 & 0 & 1 & 0 & 0 \\ 1 & 0 & 0 & 0 & 0 & 0 & 1 & 0 & 0 & 1 & 0 & 0 & 0 & 0 & 0 & 0 & 0 & 0 & 0 & 0 & 0 & 1 & 0 & 0 \\ 0 & 1 & 0 & 0 & 1 & 0 & 0 & 0 & 0 & 0 & 0 & 0 & 0 & 0 & 0 & 0 & 0 & 0 & 1 & 0 & 0 & 1 & 0 \\ 0 & 0 & 1 & 0 & 0 & 1 & 0 & 0 & 0 & 0 & 0 & 0 & 0 & 0 & 0 & 0 & 0 & 0 & 0 & 1 & 0 & 0 & 1 \\ 0 & 0 & 1 & 0 & 0 & 0 & 0 & 0 & 0 & 0 & 1 & 0 & 0 & 0 & 0 & 0 & 0 & 0 & 0 & 1 & 0 & 0 & 1 \end{bmatrix}$$

[Expression 51]

$$\tilde{B}_{(0,1)}^\dagger = \begin{bmatrix} 1 & 0 & 0 & 0 & 0 & 0 & 1 & 0 & 0 & 0 & 0 & 1 & 1 & 0 & 0 & 0 & 0 & 0 & 0 & 0 & 0 & 0 \\ 0 & 1 & 0 & 0 & 0 & 0 & 0 & 1 & 1 & 0 & 0 & 0 & 0 & 1 & 0 & 0 & 0 & 0 & 0 & 0 & 0 & 0 \\ 0 & 0 & 1 & 0 & 0 & 0 & 0 & 0 & 1 & 1 & 0 & 0 & 0 & 0 & 1 & 0 & 0 & 0 & 0 & 0 & 0 & 0 \\ 0 & 0 & 0 & 1 & 0 & 0 & 0 & 0 & 0 & 1 & 1 & 0 & 0 & 0 & 0 & 1 & 0 & 0 & 0 & 0 & 0 & 0 \\ 0 & 0 & 0 & 0 & 1 & 0 & 0 & 0 & 0 & 0 & 1 & 1 & 0 & 0 & 0 & 0 & 1 & 0 & 0 & 0 & 0 & 0 \\ 0 & 0 & 0 & 0 & 0 & 1 & 1 & 0 & 0 & 0 & 1 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 1 & 0 & 0 & 0 & 0 & 1 & 1 & 0 & 0 & 0 & 0 \\ 0 & 0 & 0 & 0 & 0 & 0 & 0 & 1 & 0 & 0 & 0 & 0 & 1 & 1 & 0 & 0 & 0 & 0 & 1 & 0 & 0 & 0 \\ 0 & 0 & 0 & 0 & 0 & 0 & 0 & 0 & 1 & 0 & 0 & 0 & 0 & 1 & 1 & 0 & 0 & 0 & 0 & 1 & 0 & 0 \\ 0 & 0 & 0 & 0 & 0 & 0 & 0 & 0 & 0 & 1 & 0 & 0 & 0 & 0 & 1 & 1 & 0 & 0 & 0 & 0 & 1 & 0 \\ 0 & 0 & 0 & 0 & 0 & 0 & 0 & 0 & 0 & 0 & 1 & 0 & 0 & 0 & 0 & 1 & 1 & 0 & 0 & 0 & 0 & 1 \\ 0 & 0 & 0 & 0 & 0 & 0 & 0 & 0 & 0 & 0 & 0 & 1 & 1 & 0 & 0 & 0 & 1 & 1 & 0 & 0 & 0 & 0 \end{bmatrix}$$

[Expression 52]

In the $S' \cdot \tilde{H}_0^{\dagger T}$ calculating circuit 60, each column of $\tilde{H}_0^{\dagger T}$ corresponds to information to be input, and for example, the 0-th row of $\tilde{H}_0^{\dagger T}$ corresponds to $S'_0$ of input information. So, in order to generate each bit of $S' \cdot \tilde{H}_0^{\dagger T}$, the information of the syndrome S' corresponding to the bit having "1" may be added to each row direction of $\tilde{H}_0^\dagger$ over GF(2) (calculation of mod 2).

In other words, first, the $S' \cdot \tilde{H}_0^{\dagger T}$ calculating circuit 60 inputs syndrome information $(S'_p)$, $(p=0, 1, \ldots, 23)$ having bit "1" of each corresponding row of $\tilde{H}_0^{\dagger T}$ into 6 multi-input parity check circuits 63($u$), ($u=0, 1, \ldots, 5$), respectively. Next, the $S' \cdot \tilde{H}_0^{\dagger T}$ calculating circuit 60 carries out a calculation of Mod 2 for these syndrome information, and outputs $E'_{0,0}$ and $E'_{0,1}$ as the result of the calculation.

Concretely, for example, in order to generate the 0-th bit of $E'_{0,0}$, the sum modulo 2 (mod 2) may be obtained for the values of 5 bits $s'_0, s'_5, s'_9, s'_{21}$ and $S'_{23}$ corresponding to the locations where "1" exist on the 0-th row of $\tilde{H}_0^\dagger$ shown in the Expression 50 among the 24 bits syndromes $S'=S'_0, S'_1, \ldots$ and $S'_{23}$. The multi-input parity check circuit 63(0) of FIG. 13 inputs the 5 bits syndromes $s'_0, s'_5, s'_9, s'_{21}$ and $s'_{23}$. The multi-input parity check circuit 63(0) outputs the 0-th bit of $E'_{0,0}$ that is 52(0). The same is applied also to the other bits of $E'_{0,0}$.

As shown in FIG. 13, the $S' \cdot \tilde{H}_1^{\dagger T}$ calculating circuit 61 is composed of 6 multi-input parity check circuits 64($w$), ($w=0$, 1, …, 5), and the $S' \cdot \tilde{B}_{(0,1)}^{\dagger T}$ calculating circuit 62 is composed of 12 multi-input parity check circuits 65($z$), ($z=0, 1, \ldots, 11$). These calculating circuits can be constructed by the method similar to that of the $S' \cdot \tilde{H}_0^{\dagger T}$ calculating circuit 60.

Here, the process of the error vector generating circuit 50(0) for (0,1) is explained in more detail. As shown in FIG. 13, the 24 bits syndrome S' is input into the multi-input parity check circuits 63($u$), ($u=0, 1, \ldots, 5$), so that $E'_{0,0}$ is generated. The 24 bits syndrome S' is input into the multi-input parity check circuits 64($w$), ($w=0, 1, \ldots, 5$), so that $E'_{0,1}$ is generated.

The 24 bits syndrome S' is input into the multi-input parity check circuit 65($z$), ($z=0, 1, \ldots, 11$). The 12 bits signal output from the multi-input parity check circuits 65($z$), ($z=0, 1, \ldots, 11$) is input into the 12-input NOR gate circuits 65, and a correctable signal 53(0) for (0,1) is output. Since the pair (i,j) of bytes where $S' \cdot \tilde{B}_{(0,1)}^{\dagger T}=0$ is a pair of erroneous bytes, these circuits detect that $S' \cdot \tilde{B}_{(0,1)}^{\dagger T}=0$, and can correct errors in the pair (i,j) of bytes.

The correctable signal 53(0) for (0,1) and the output signals from the multi-input parity check circuits 63 and the multi-input parity check circuits 64 are input into 2-input AND gate circuits 67, and $E'_{0,0}$ and $E'_{0,1}$ are output. If the pair of bytes is a pair of erroneous bytes, these circuits output errors, otherwise these circuits output a pattern of 0.

Finally, the error vector generating circuit 50(0) for (0,1) outputs the errors $E'_{0,0}$ and $E'_{0,1}$ 52(0) and the correctable signal 53(0) for (0,1). The error vector generating circuit 50(0) for (0,1) is explained as an example, but the same is applied also to the other bytes (i,j).

The constitutional example of the error calculating circuit 51 over $GF(2^6)$ is explained below concretely. The error calculating circuit 51 over $GF(2^6)$ is shown in FIG. 14.

Figure 14:
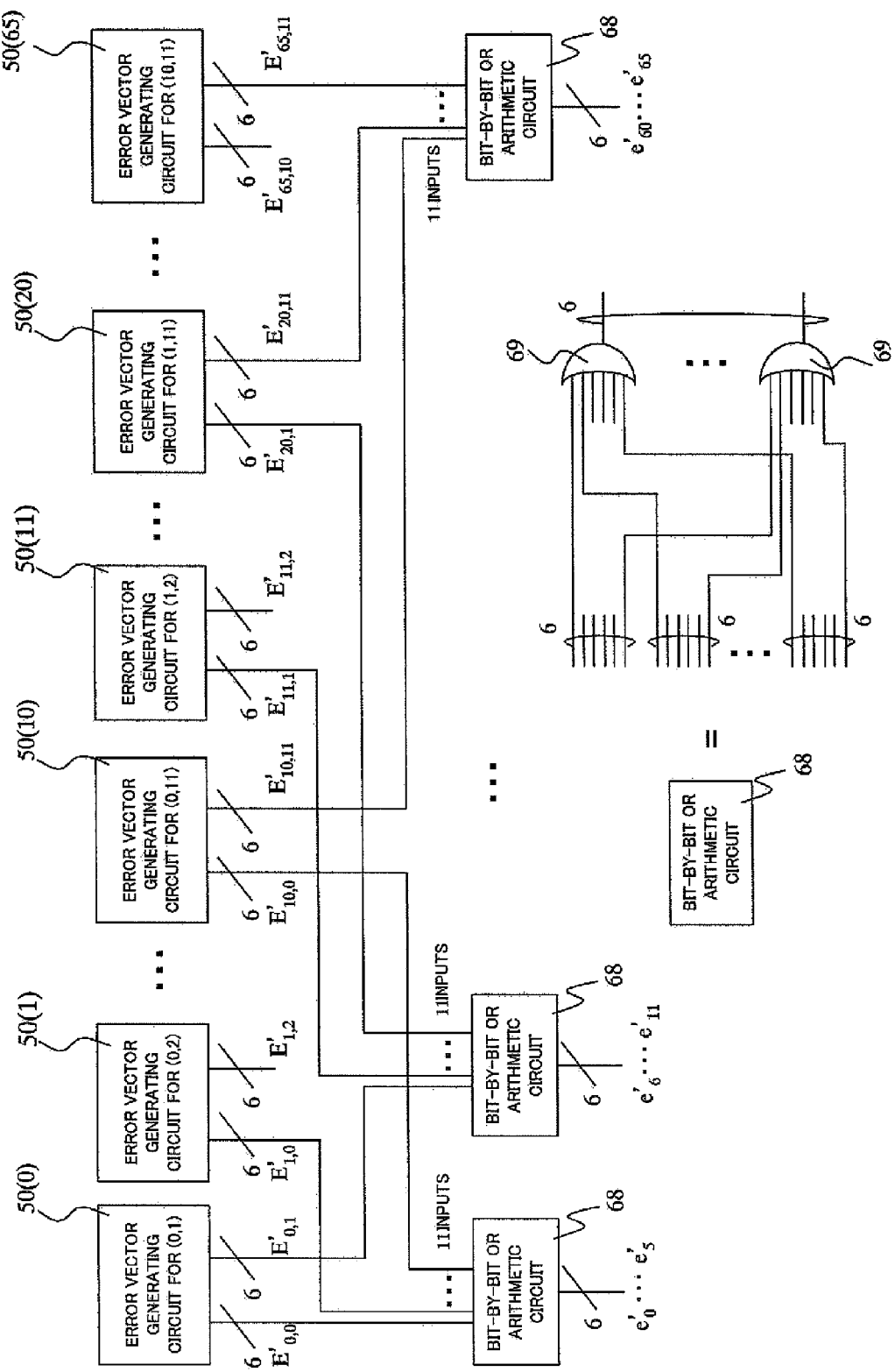
FIG. 14 is a configuration diagram illustrating an error vector calculating circuit over $GF(2^r)$ in the parallel decoding circuit over $GF(2^r)$ shown in FIG. 12.

As shown in FIG. 14, the error calculating circuit 51 over $GF(2^6)$ inputs all errors $E'_{m,i}$ corresponding to the i-th byte into bit-by-bit OR arithmetic circuit 68, and finally outputs the bit-error pointer (e') 40 over $GF(2^6)$. These circuits integrate the errors $E'_{m,i}$ from the pairs (i,j) of bytes correspond to the i-th bytes, and output the error $e_i'$ in i-th byte.

Concretely, for example, in order to output $e'_6$ of the bit-error pointer (e') 40 over $GF(2^6)$, the 0-th bit of $E'_{0,1}$, $E'_{11,1}$, ..., and $E'_{20,1}$ output from the error vector generating circuit 50(0) for (0,1), the error vector generating circuit 50(11) for (1,2), ... and the error vector generating circuit 50(20) for (1,11) are input into bit-by-bit OR arithmetic circuit 68, respectively. The bit-by-bit OR arithmetic circuit 68 integrates the 0-th bits of $E'_{0,1}$, $E'_{11,1}$, ... and $E'_{20,1}$ and outputs $e_6'$ by inputting 0-th bits of $E'_{0,1}$, $E'_{11,1}$, ... and $E'_{20,1}$ having 6 bits into 11-inputs OR circuits 69, respectively.

The $e'_6$ of the bit-error pointer (e') 40 over $GF(2^6)$ is explained as an example above, but the same is applied also to the other bit values $e'_0$, and $e'_{65}$.

<e> The Constitution of the Error Vector Generating Circuit 9 over $GF(2^8)$ The error vector generating circuit 9 over $GF(2^8)$ is explained below. The entire constitution of the error vector generating circuit 9 over $GF(2^8)$ is shown in FIG. 15.

Figure 15:
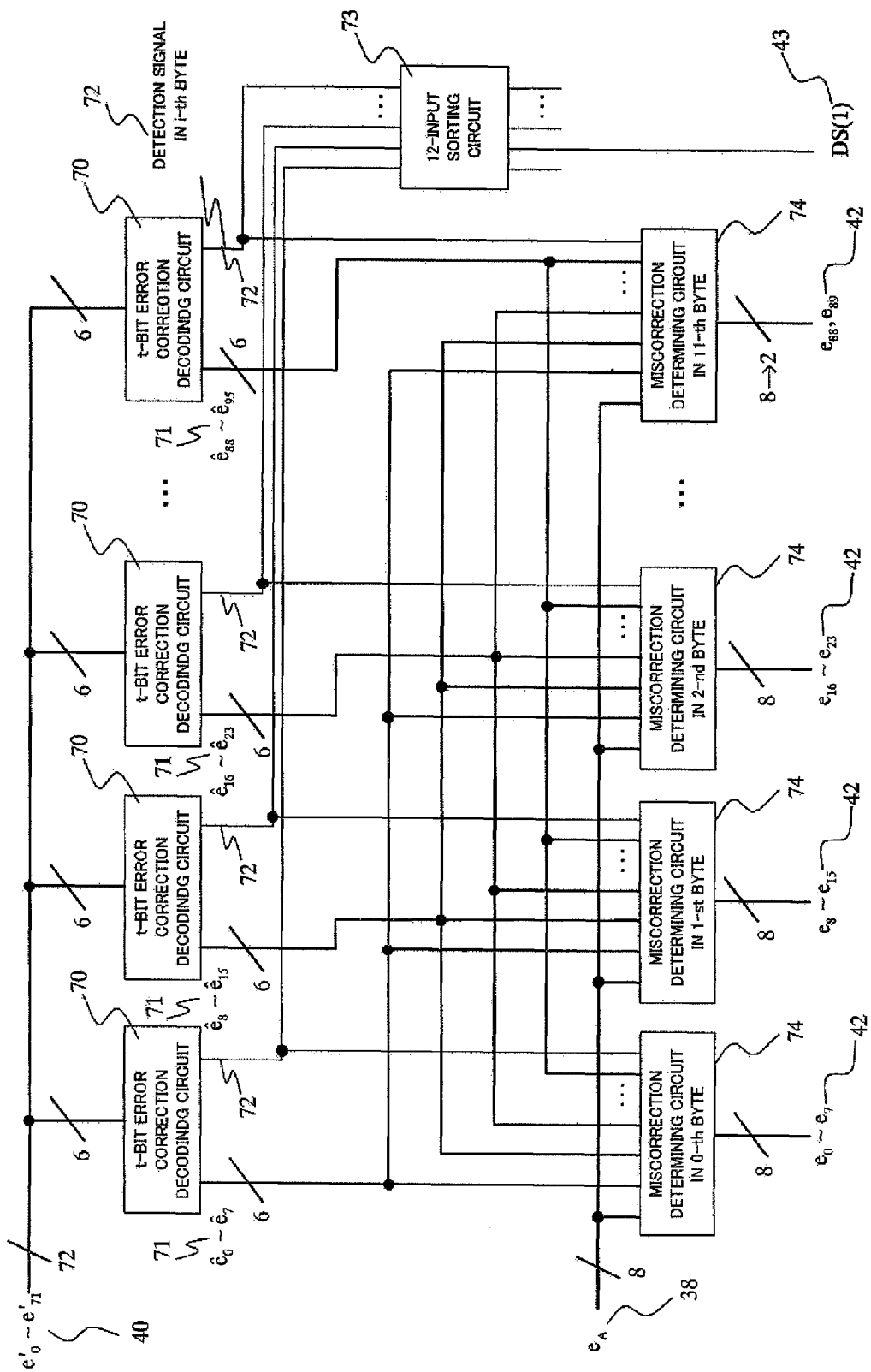
FIG. 15 is a block diagram illustrating a schematic configuration of an error vector generating circuit over $GF(2^b)$ for the (90,64) $[4_{1/8}EC]_2$ code shown in FIG. 3.

As shown in FIG. 15, the error vector generating circuit 9 over $GF(2^8)$ comprises t-bit error correction decoding circuits 70, a 12-inputs sorting circuit 73 and miscorrection determining circuits 74 in i-th byte. The error vector generating circuit 9 over GF(2) is a circuit that inputs the bit-error pointer (e') 40 over $GF(2^6)$ and the byte-by-byte sum of errors ($e_A$) 38, and outputs the bit-error pointer (e) 42 over $GF(2^8)$ and the uncorrectable error detection signal (DS(1)) 43.

The t-bit error correction decoding circuit 70 (in this example, 2-bit error correction decoding circuit) inputs 1 byte of the bit-error pointer (e') 40 over $GF(2^6)$, and outputs 1 byte of the bit-error pointer (ê) 71 produced by the decoder and a detection signal 72 in i-th byte as a signal for detecting an error exceeding the correction capability.

The 12-input sorting circuit 73 is a circuit that inputs detection signals 72 in i-th byte output from the t-bit error correction decoding circuits 70, counts the weights (the number of "1") of the 12 bits information to be input, and expresses 1 from upper bits of the outputs continuously only as for the number of the weights. For example, when there are six "1"s in 12 bits input information, all of the upper 6-bit outputs among the 12-bit outputs of the 12-input sorting circuit 73 output "1", and all of the residual 6-bit outputs of the 12-input sorting circuit 73 output "0".

Finally, the miscorrection determining circuit 74 in i-th byte inputs a bit-error pointer (ê) 71 produced by the decoder output from the t-bit error correction decoding circuits 70 of all bytes, the detection signal 72 in i-th byte and the byte-by-byte sum of errors ($e_A$) 38, and outputs 1 byte of the bit-error pointer (e) 42 over $GF(2^8)$.

The process of the error vector generating circuit 9 on $(2^8)$ is explained below in more detail. As shown in FIG. 15, the bit-error pointer (e') 40 over $GF(2^6)$ is divided into each 6 bits, and then is input into the 2-bit error correction decoding circuits 70, respectively.

The detection signal 72 in i-th byte output from the 2-bit error correction decoding circuit 70 is input into the 12-input sorting circuit 73. In the signal output from the 12-input sorting circuit 73, when the error is detected in the 2-bit error correction decoding circuits 70 of 2 or more bytes, the error is detected as an out-of-control-ability error (on the other hand, when the error is detected in the 2-bit error correction decoding circuit 70 of 1 byte, as detailed later, the error correction is carried out in the miscorrection determining circuits 73 in i-th byte.). In the signal output from the 12-input sorting circuit 73, therefore, the upper second bit signal is output as the uncorrectable error detection signal (DS(1)) 43.

The bit-error pointer (ê) 71 produced by the decoder output from the 2-bit error correction decoding circuits 70 of all bytes, the detection signals 72 in i-th byte, and the byte-by-byte sum of errors ($e_A$) 38 are input into the miscorrection determining circuits 74 in i-th byte, respectively.

The all miscorrection determining circuits 74 in i-th byte collect signals output from the detection signals 72 in i-th byte, and output bit-error pointers 42 over $GF(2^b)$ of 90 bits.

The constitutional example of the 2-bit error correction decoding circuits 70 is explained concretely below.

Figure 16:
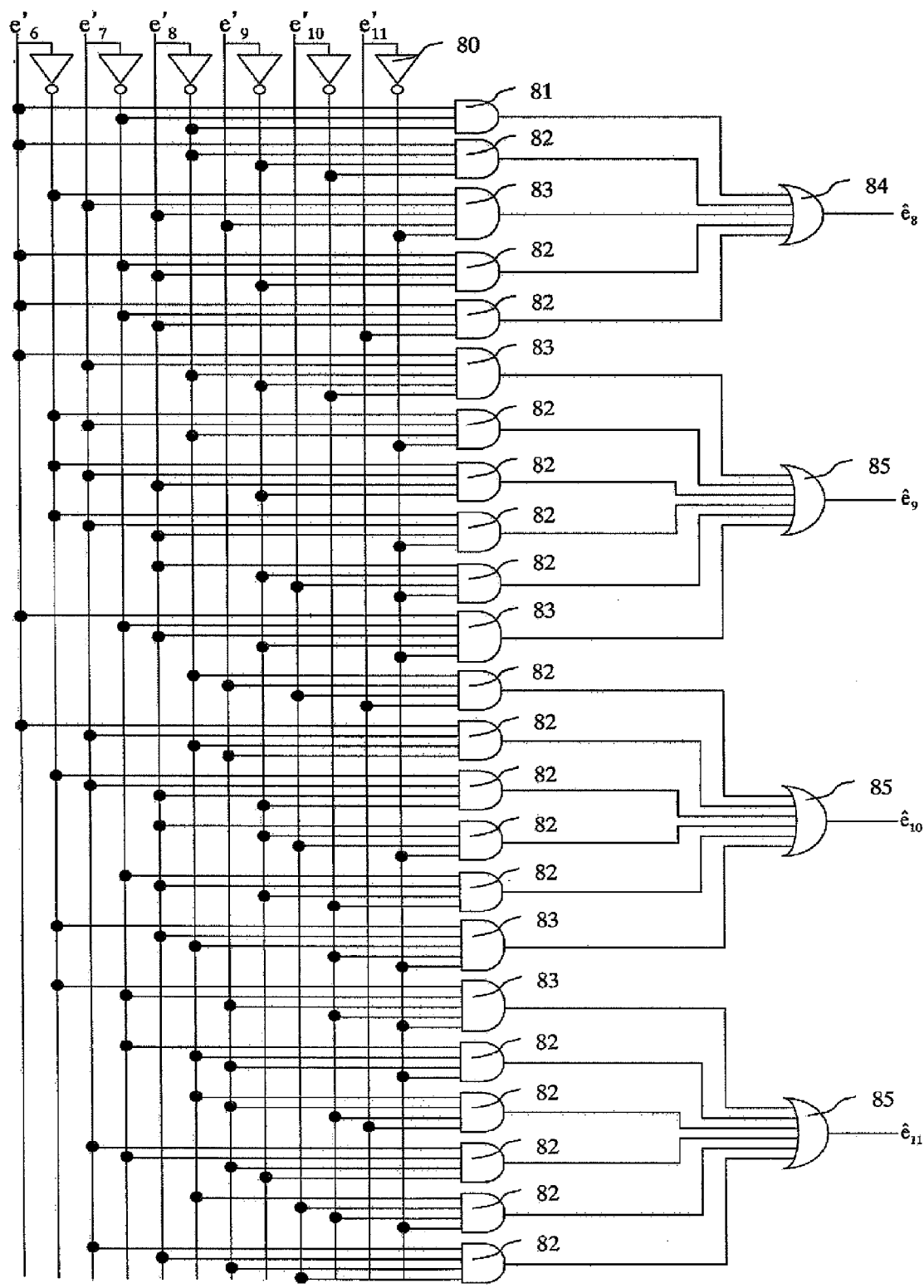
FIG. 16 is a configuration diagram illustrating a circuit for generating upper 4 bits of bit-error pointer (ê) 71 produced by the decoder from bit-error pointer over $GF(2^r)$ for the first byte as an example of a t-bit error correction decoding circuit in the error vector generating circuit over $GF(2^b)$ shown in FIG. 15.
Figure 17:
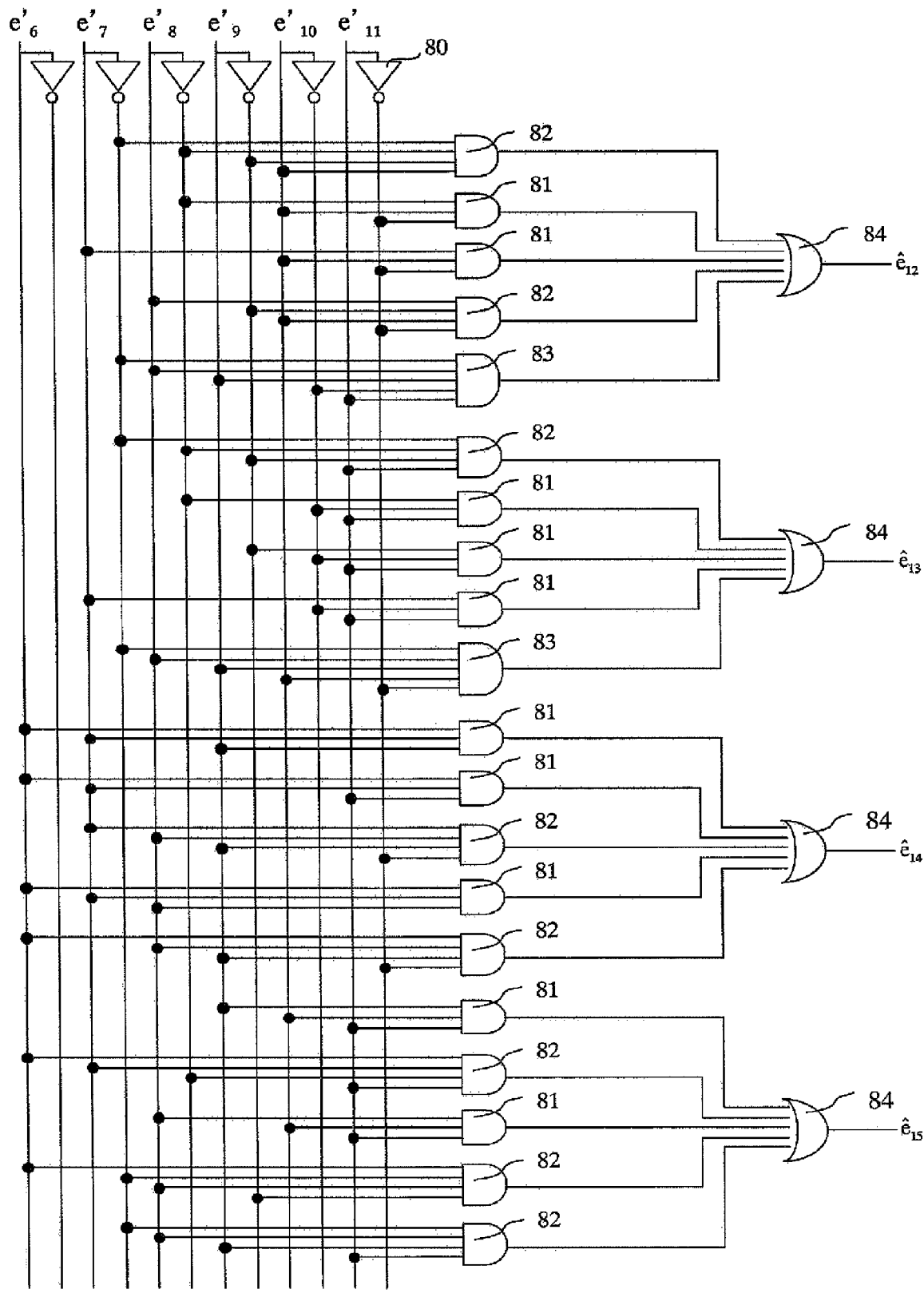
FIG. 17 is a configuration diagram illustrating a circuit for generating lower 4 bits of the bit-error pointer (ê) 71 produced by the decoder from the bit-error pointer over $GF(2^r)$ for the first byte as an example of the t-bit error correction decoding circuit in the error vector generating circuit over $GF(2^b)$ shown in FIG. 15.
Figure 18:
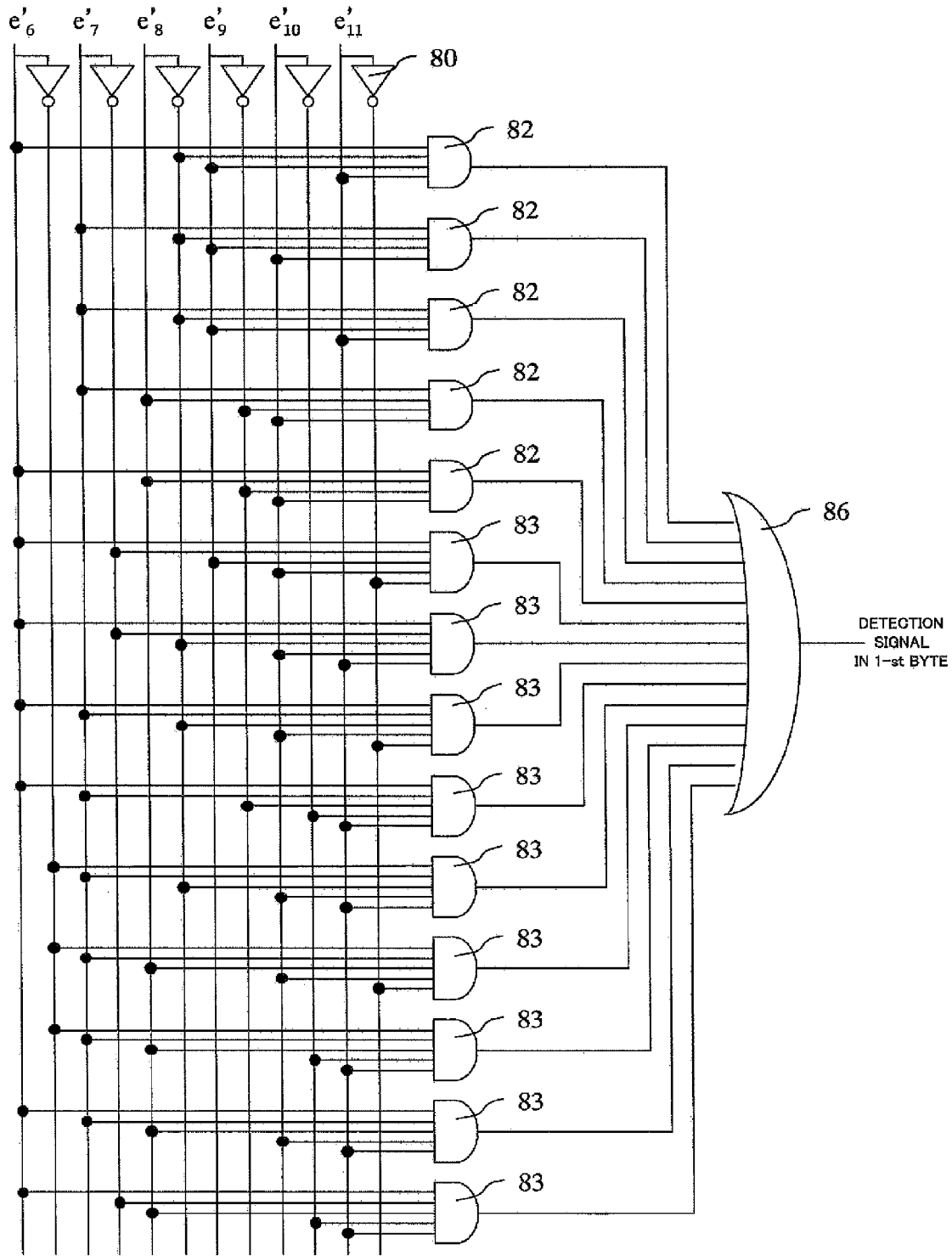
FIG. 18 is a configuration diagram illustrating a circuit for detecting an error exceeding correction capability on the first byte as an example of the t-bit error correction decoding circuit in the error vector generating circuit over $GF(2^b)$ shown in FIG. 15.

As an example, in the 2-bit error correction decoding circuit 70 for the first byte, a circuit which outputs upper 4 bits of the bit-error pointer (ê) 71 produced by the decoder for the first byte is shown in FIG. 16, a circuit which outputs lower 4 bits of the bit-error pointer (ê) 71 produced by the decoder for the first byte is shown in FIG. 17, and a circuit (namely, a detection signal output unit) which outputs the detection signal 72 in 1 byte for outputting "1" at the time of detecting an error exceeding the correction capability is shown in FIG. 18.

The 2-bit error correction decoding circuit 70 for the first byte is a circuit that inputs the first byte of the bit-error pointer (ê) 40 over $GF(2^6)$, and outputs the first byte of the bit-error pointer (ê) 71 produced by the decoder and the detection signal 72 in 1 byte.

In the above-mentioned 2-bit error correction decoding circuits 70, $ê_I \to e_I'$ is an injection with respect to the error $ê_I$ as results of decoding by means of H" and the error $e_I'$ over $GF(2^6)$. Therefore, the logic synthesis is carried out so that the circuit 70 can be realized by the combinatorial circuit.

Since H" is the matrix where any 4 columns are linearly independent, namely, it is a check matrix of the double-bit error correction code, in the $[4_{1/8}EC]_2$ code, when triple-bit error or quadruple-bit error occurred within 1 byte, the result decoded by H" is miscorrected or is detected as an out-of-control-ability error. When triple-bit error or quadruple-bit error is miscorrected within 1 byte, as detailed below, a determination of error correction is made so that a determination is made whether an error is miscorrected or not.

Concretely, for example, in FIG. 16, since $ê_I \cdot H''^T = e_I'$ on the first byte of information and H" is a matrix where any 4 columns shown in the Expression 24 are linearly independent, namely, since H" is a check matrix of the double-bit error correction code, the error $ê_I$ whose weight is 2 or less as a result of decoding by H" and the error $e_I'$ over $GF(2^6)$ are uniquely-determined.

Therefore, the error $ê_I = (ê_8 ê_9 ê_{10} ê_{11} ê_{12} ê_{13} ê_{14} ê_{15})$ whose weight is 2 or less as a result of decoding by H" and the error $e_I' = (e_6' e_7' e_8' e_9' e_{10}' e_{11}')$ over GF(26) establish a relationship shown in the following Table 1.

TABLE 1

| $ê_8 ê_9 ê_{10} ê_{11} ê_{12} ê_{13} ê_{14} ê_{15}$ | $e_6' e_7' e_8' e_9' e_{10}' e_{11}'$ |
|---|---|
| 0 0 0 0 0 0 0 0 | 0 0 0 0 0 0 |
| 0 1 0 0 0 0 0 0 | 0 1 0 0 0 0 |
| 0 0 0 1 0 0 0 0 | 0 0 0 1 0 0 |

TABLE 1-continued

| $\hat{e}_8\hat{e}_9\hat{e}_{10}\hat{e}_{11}\hat{e}_{12}\hat{e}_{13}\hat{e}_{14}\hat{e}_{15}$ | $e_6'e_7'e_8'e_9'e_{10}'e_{11}'$ |
|---|---|
| 00000100 | 0000 01 |
| 00000000 | 0011 11 |
| 10100000 | 1010 00 |
| 10001000 | 1000 10 |
| 10000010 | 0111 00 |
| 01100000 | 0110 00 |
| 01001000 | 0100 10 |
| 01000010 | 1011 00 |
| 00110000 | 0011 00 |
| 00100100 | 0010 01 |
| 00100001 | 0001 11 |
| 00010100 | 0001 01 |
| 00010000 | 0010 11 |
| 00001011 | 1111 10 |
| 00000110 | 1111 01 |
| 00000011 | 1100 11 |
| 10000000 | 1000 00 |
| 00100000 | 0010 00 |
| 00001000 | 0000 10 |
| 00000011 | 1111 00 |
| 11000000 | 1100 00 |
| 10010000 | 1001 00 |
| 10000100 | 1000 01 |
| 10000001 | 1011 01 |
| 01010100 | 0101 00 |
| 01000101 | 0100 01 |
| 01000001 | 0111 11 |
| 00101010 | 0010 10 |
| 00100011 | 1101 00 |
| 00011010 | 0001 10 |
| 00010011 | 1110 00 |
| 00001100 | 0000 11 |
| 00001001 | 0011 01 |
| 00000101 | 0011 10 |

Here, there are 37 patterns of the errors $e_I'$ over $GF(2^6)$, but $\hat{e}_I$ for the residual $2^6-37=27$ patterns are detected as out-of-correction-ability error (out-of-control-ability error), and the output of $\hat{e}_I$ is don't-care *.

For example, according to the corresponding relationship between the error $\hat{e}_I$ as the result of the decoding by the H" and the error $e_I'$ over $GF(2^6)$ which is shown in the Table 1, when $e_I'=(e_6'e_7'e_8'e_9'e_{10}'e_{11}')=(100000)$, (110000), (101000), (100100), (011100), (100010), (101111), (100001), the value $\hat{e}_8$ of the first bit of the first byte of information becomes 1.

In addition, in the corresponding relationship between $\hat{e}_I$ as the result of the decoding by H" and the error $e_I'$ over $GF(2^6)$ which is shown in the Table 1, the value $\hat{e}_8$ of the first bit of the first byte of information is don't-care * with respect to the residual 27 patterns of errors over $GF(2^6)$ $e_I'=(e_6'e_7'e_8'e_9'e_{10}'e_{11}')=(100110)$, (110110), (010110), (011110), (101110), (110010), (011010), (111010), (101010), (100011), (010011), (011011), (111011), (101011), (100111), (110111), (010111), (111111), (100101), (110101), (010101), (011101), (101101), (110001), (011001), (111001), (101001).

When these logic functions are simplified, the value $\hat{e}_8$ of the first bit of the first byte of information is expressed by a logical expression shown in the following Expression 53.

$$\hat{e}_8 = e_6'\overline{e}_7'\overline{e}_8' \vee e_6'\overline{e}_8'\overline{e}_9'\overline{e}_{10}' \vee \overline{e}_6'e_7'e_8'\overline{e}_9'\overline{e}_{11}' \vee e_6'\overline{e}_7'e_8'\overline{e}_9'\vee e_6'\overline{e}_7'e_8'e_{11}'$$ 
[Expression 53]

Where, $\overline{e}_x'$ is logical inverse of $e_x'$, $e_6'\overline{e}_7'\overline{e}_8'$ is $e_6' \wedge \overline{e}_7' \wedge \overline{e}_8'$, $\vee$ represents a logical sum and $\wedge$ represents a logical product.

Therefore, as shown in FIG. 16, first, the bit-error pointers 40 $e'_6, e'_7, e'_8, e'_9, e'_{10}$ and $e'_{11}$ over $GF(2^6)$ are input into NOT gate circuits 80, respectively, so that $\overline{e}_x'$ is generated. And then $e_6',\overline{e}_7',\overline{e}_8'$ is input into a 3-input AND gate circuit 81, $e_6',\overline{e}_8',\overline{e}_9',\overline{e}_{10}'$ is input into a 4-input AND gate circuit 82, $\overline{e}_6',e_7',e_8',\overline{e}_9',\overline{e}_{11}'$ is input into a 5-input AND gate circuit 83, $e_6',\overline{e}_7',e_8',\overline{e}_9'$ is input into a 4-input AND gate circuit 82, and $e_6',\overline{e}_7',e_8',e_{11}'$ is input into a 4-input AND gate circuit 82 respectively. Signals output from the respective AND gate circuits are input into a 5-input OR gate circuit 84, so that the value $\hat{e}_8$ of the first bit of the first byte of information is obtained.

As shown in FIGS. 16 and 17, the values $\hat{e}_9, \ldots$ and $\hat{e}_{15}$ of other bits are obtained similarly by the NOT gate circuit 80, the 3-input AND gate circuit 81, the 4-input AND gate circuit 82, the 5-input AND gate circuit 83, the 5-input OR gate circuit 84, and 6-input OR gate circuit 85.

The detection signal output unit of the t-bit error correction decoding circuit 70 (in this example, the 2-bit error correction decoding circuit) can be similarly constructed. The detection signal output unit detects the error $\hat{e}_I$ which is the result of decoding by H" and is not mapped from the error $e_I'$ over $GF(2^6)$ as the uncorrectable error. For example, the detection signal output unit of the 2-bit error correction decoding circuit 70 for the first byte is shown in FIG. 18.

Concretely, for example, in the first byte of information, in the corresponding relationship between the error $\hat{e}_I$ as the result of the decoding by H" shown in Table 1 and the error $e_I'$ over $GF(2^6)$, the value of the detection signal for the residual 27 patterns of the errors over $GF(2^6)$ $e_I'=(e_6'\ e_7'\ e_8'\ e_9'\ e_{10}'\ e_{11}')=(100110)$, (110110), (010110), (011110), (101110), (110010), (011010), (111010), (101010), (100011), (010011), (011011), (111011), (101011), (100111), (110111), (010111), (111111), (100101), (110101), (010101), (011101), (101101), (110001), (011001), (111001), (101001), is set to 1, so that errors are detected.

Therefore, when these logic functions are simplified, the value of the detection signal is expressed by a logical expression shown in the following Expression 54.

$$\begin{aligned}&e_6'e_8'e_9'e_{11}' \vee e_7'e_8'e_9'e_{10}' \vee e_7'e_8'e_9'e_{11}' \vee e_7'e_8'e_9'e_{10}' \\ &\vee e_6'e_8'e_9'e_{10}' \vee e_6'e_7'e_9'e_{10}'e_{11}' \vee e_6'e_7'e_8'e_9'e_{10}' \\ &\vee e_6'e_7'e_8'e_{10}'e_{11}' \vee e_6'e_7'e_9'e_{10}'e_{11}' \\ &\vee e_6'e_7'e_8'e_{10}'e_{11}' \vee e_6'e_7'e_8'e_{10}'e_{11}' \\ &\vee e_6'e_7'e_8'e_{10}'e_{11}' \vee e_6'e_7'e_8'e_{10}'e_{11}' \\ &\vee e_6'e_7'e_8'e_{10}'e_{11}\end{aligned}$$
[Expression 54]

Therefore, as shown in FIG. 18, first, the bit-error pointers 40 e'$_6$, e'$_7$, e'$_8$, e'$_9$, e'$_{10}$, e'$_{11}$ over GF($2^6$) are input into the NOT gate circuit 80, so that $\bar{e}_x$' is generated.

Then, e$_6$'$\bar{e}_8$'e$_9$'e$_{11}$', e$_7$'$\bar{e}_8$'e$_9$'e$_{10}$', e$_7$'$\bar{e}_8$'e$_9$'e$_{11}$', e$_7$'e$_8$'$\bar{e}_9$'e$_{10}$', e$_6$'e$_8$'$\bar{e}_9$'e$_{10}$', e$_6$'$\bar{e}_7$'e$_9$'e$_{10}$'$\bar{e}_{11}$', e$_6$'$\bar{e}_7$'e$_8$'e$_{10}$'$\bar{e}_{11}$', e$_6$'$\bar{e}_7$'e$_8$'e$_{10}$'e$_{11}$', e$_6$'$\bar{e}_7$'e$_8$'e$_{10}$'e$_{11}$', e$_6$'e$_7$'$\bar{e}_8$'$\bar{e}_{10}$'e$_{11}$', $\bar{e}_6$'e$_7$'$\bar{e}_8$'e$_{10}$'e$_{11}$', $\bar{e}_6$'e$_7$'e$_8$'$\bar{e}_{10}$'e$_{11}$', $\bar{e}_6$'e$_7$'e$_8$'$\bar{e}_{10}$'e$_{11}$', e$_6$'$\bar{e}_7$'e$_8$'$\bar{e}_{10}$'e$_{11}$', e$_6$'$\bar{e}_7$'e$_8$'$\bar{e}_{10}$'e$_{11}$' are input into the totally 14 4-input AND gates 82 and 5-input AND gates 83, respectively.

Finally, the signals output from the respective AND gate circuits are input into a 14-input OR circuit 86, and the detection signal 72 in 1 byte is output.

The t-bit error correction decoding circuit 70 in the first byte is explained in detail above as an example, but the same is applied also to the other bytes.

A constitutional example of the 12-input sorting circuit 73 is shown in FIG. 19.

As shown in FIG. 19, 12 bits input information is sorted, a 2-input and 2-output circuit which is constructed by a pair of the 2-input OR gate circuit 75 and the 2-input AND gate circuit 76, is treated as a cell, and the cell is connected in multi-tiered manner for 12 inputs. The sorting circuit is a circuit that generally outputs 1 to upper x-bit of n-bit when the number of 1 is x bits present in n-bit inputs, and outputs 0 from all the residual outputs. The general constitution of this circuit is described in Non-Patent Document 13.

As shown in FIG. 19, the 12-input sorting circuit 73 which is a 12-input and 12-output circuit, uses 39 cells (namely, 78 gates) to be capable of being realized by maximally 9-tiered cells (9-gate tier). For example, as the input information of 12 bits, in the case of the information whose weight is 6 such as (001011001011), the output of the 12-input sorting circuit 73 is (111111000000).

Figure 20:
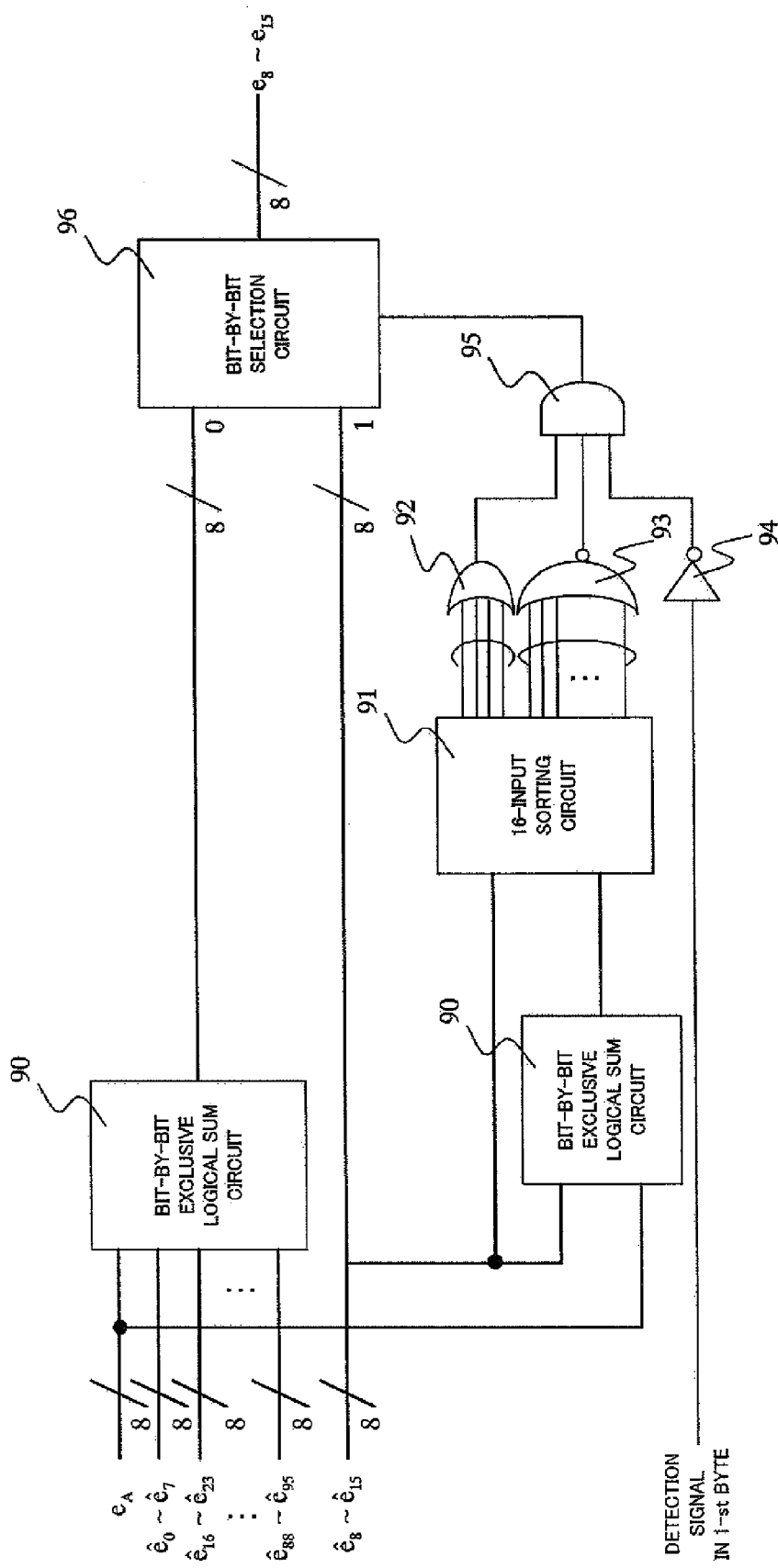
FIG. 20 is a circuit configuration diagram illustrating one example of a miscorrection determining circuit in i-th byte in the error vector generating circuit over $GF(2^b)$ shown in FIG. 15.

A constitutional example of the miscorrection determining circuit 74 in i-th byte is shown in FIG. 20.

For example, a constitutional example of the miscorrection determining circuit 74 in 1 byte concretely constructed for the first byte, is shown in FIG. 20. As shown in FIG. 20, the miscorrection determining circuit 74 in 1 byte comprises bit-by-bit exclusive logical sum circuit 90, 16-input sorting circuit 91, and bit-by-bit selection circuit 96.

The process of the miscorrection determining circuit 74 in 1 byte is explained in more detail. As shown in FIG. 20, the bit-error pointers of bytes produced by decoder other than the first byte (ê) 71 ê$_0$ . . . ê$_7$ê$_{16}$ . . . ê$_{95}$ and the byte-by-byte sum of errors (e$_A$) 38 are input into the bit-by-bit exclusive logical sum circuit 90. Further, the bit-error pointer of the first byte (ê) 71 ê$_8$ . . . ê$_{15}$ produced by the decoder, and the byte-by-byte sum of errors (e$_A$) 38 are input into the bit-by-bit exclusive logical sum circuit 90.

Next, the byte-by-byte sum of errors (e$_A$) 38 and the output from the bit-by-bit exclusive logical sum circuit 90 are input into the 16-input sorting circuit 91. A relationship shown in the following Expression 55 holds according to the relationship shown in the Expression 39.

$$w_M(\hat{e}_x+e_A)+w_M(\hat{e}_x) \leq \mu_1 \qquad \text{[Expression 55]}$$

Therefore, when the number of "1" is four or less in the output of the 16-input sorting circuit 91, the circuit 91 outputs 1. That is, in the output of the 16-input sorting circuit 91, upper 4 bits are input into the 4-input OR gate circuit 92, and lower 12 bits are input into the 12-input NOR gate circuit 93 respectively. The detection signal in 1 byte is input into a NOT gate circuit 94. Then, the output from the 4-input OR gate circuit 92, the output from the 12-input NOR gate circuit 93 and the output from the NOT gate circuit 94 are input into a 3-inputs AND gate circuit 95.

Finally, using the output from the 3-input AND gate circuit 95 as a control signal, the output from the bit-by-bit exclusive logical sum circuit 90 and the bit-error pointer of the first byte (ê) 71 ê$_8$ . . . ê$_{15}$ produced by the decoder are input into the bit-by-bit selection circuit 96, and the first byte (e$_8$ . . . e$_{15}$') of the bit-error pointer (e) 42 over GF($2^8$) is output from the bit-by-bit selection circuit 96. As a result, when errors are corrected definitely, $e_x = \hat{e}_x$ is output, and when errors are miscorrected or when errors are detected as out-of-control-ability errors, exclusive logical sum of the error pattern corrected definitely in the other bytes and e$_A$ is obtained, so that error patterns in bytes where errors are miscorrected can be restored.

Figure 21:
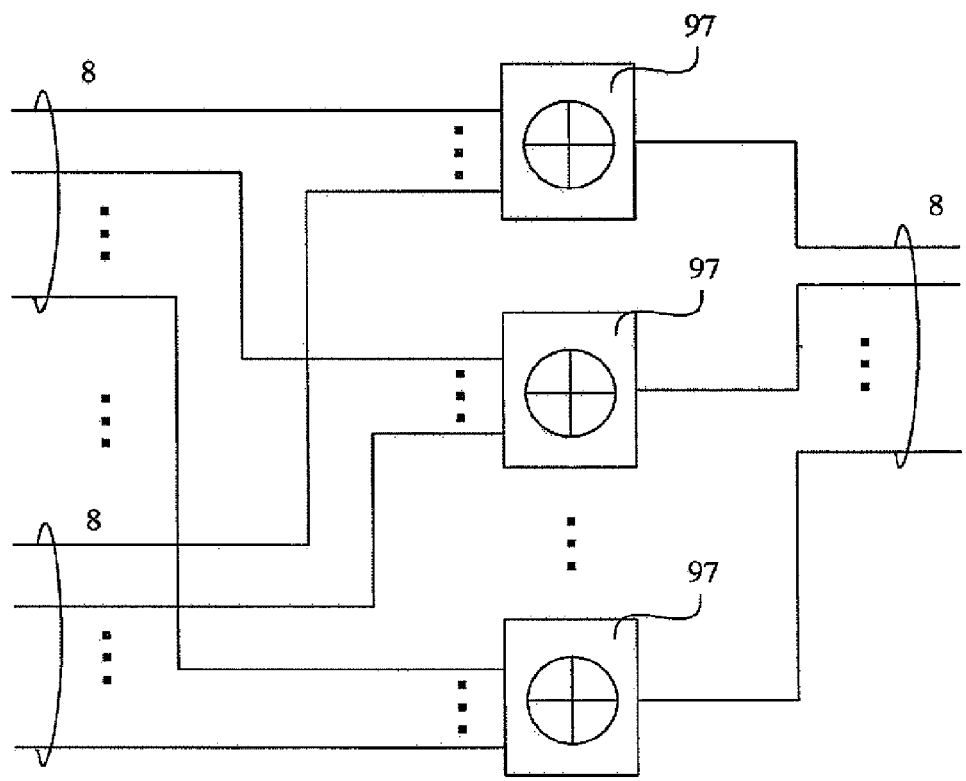
FIG. 21 is a configuration diagram illustrating a bit-by-bit exclusive logical sum circuit in the miscorrection determining circuit in i-th byte shown in FIG. 20.

A constitutional example of the bit-by-bit exclusive logical sum circuit 90 is shown in FIG. 21. As shown in FIG. 21, the bit-by-bit exclusive logical sum circuit 90 is a circuit that obtains exclusive logical sum of bits of two signals having 8 bits.

The process of the bit-by-bit exclusive logical sum circuit 90 is explained in more detail below. As shown in FIG. 21, 0-th bits of the 8-bit signals are input into multi-input exclusive logical sum circuits 97. The respective signals output from the multi-input parity check circuits 97 are collected to be output as 8-bit signal finally.

Figure 23:
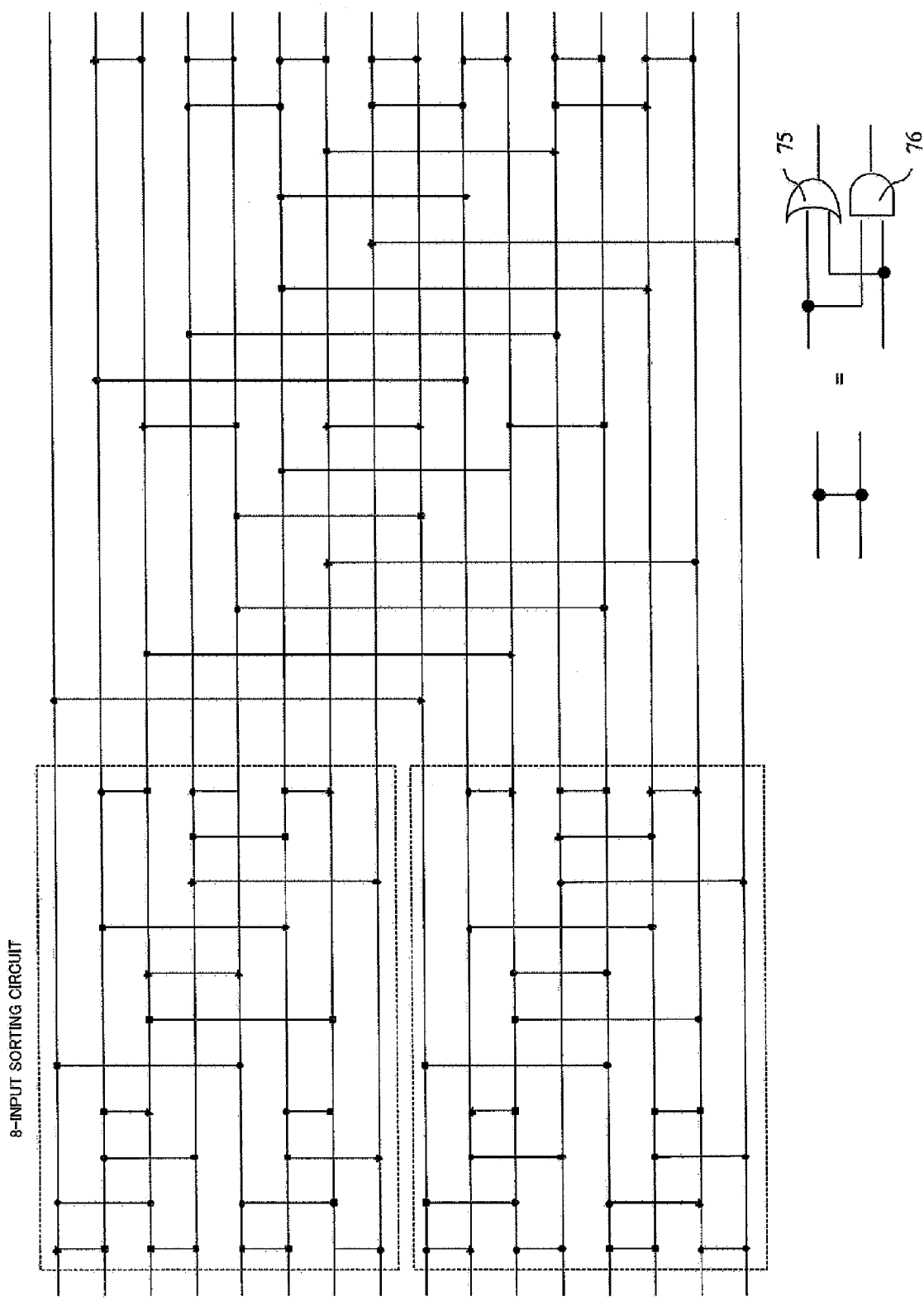
FIG. 23 is a configuration diagram illustrating a 16-inputs sorting circuit in the miscorrection determining circuit in i-th byte shown in FIG. 20.

A constitutional example of the 16-input sorting circuit 91 is shown in FIG. 23. As shown in FIG. 23, the 16-input sorting circuit 91 sorts 16 bits input information, a 2-input and 2-output circuit which is constructed by a pair of the 2-input OR gate circuit 75 and the 2-input AND gate circuit 76, is treated as a cell, and the cell is connected in multi-tiered manner for 16 inputs. The sorting circuit is a circuit that generally outputs 1 to upper x-bit of n-bit when the number of 1 is x bits present in n-bit inputs, and outputs 0 from all the residual outputs.

As shown in FIG. 23, the 16-input sorting circuit 91 which is a 16-input and 16-output circuit uses the 63 cells (namely, 126 gates) and can be realized by maximally 10-tiered cells (10-gate tiers).

Finally, a concrete constitutional example of the bit-by-bit selection circuit 96 is explained.

Figure 22:
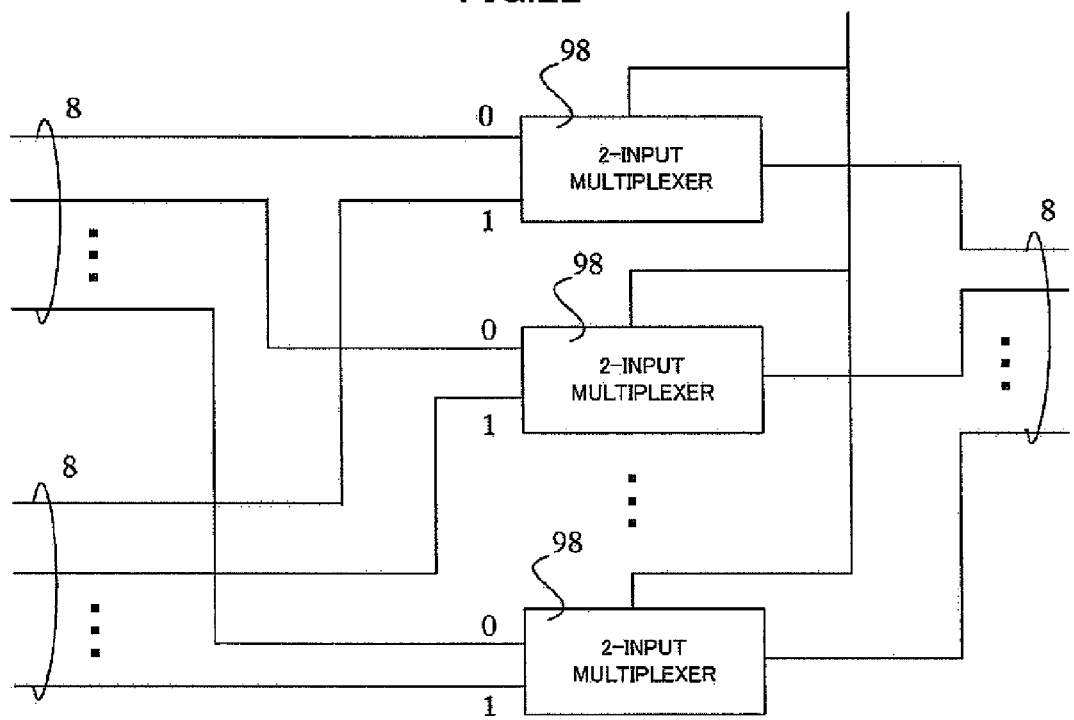
FIG. 22 is a configuration diagram illustrating a bit-by-bit selection circuit in the miscorrection determining circuit in i-th byte shown in FIG. 20.

As shown in FIG. 22, the bit-by-bit selection circuit 96 is a circuit that selects each bits of two signals having 8 bits according to the control signal (namely, the output of the 3-input AND gate circuit 95).

The process of the bit-by-bit selection circuit 96 is explained in more detail. As shown in FIG. 22, 0-th bits of the 8 bits signals are input into 2-input multiplexer 98. When the control signal is 0, the 2-input multiplexer 98 outputs an upper signal, and when the control signal is 1, the 2-input multiplexer 98 outputs a lower signal. Similarly, signals of bits other than 0-th bit are selected according to the control signal. The respective signals output from the 2-input multiplexer 98 are collected and output as the 8-bit signal finally.

The above explains the [$4_{1/8}$EC]$_2$ code having code parameters such as b=8, t=1, $\mu_1 = \mu_{2=4}$, $p_1 = p_{2=2}$ as an example, but it is clear that the above-mentioned circuit can be similarly constructed also for the codes having code parameters other than the above code parameters.

(f) Constitution of the Inverting Circuit 10

Finally, the constitution of the inverting circuit 10 is explained below.

Figure 24:
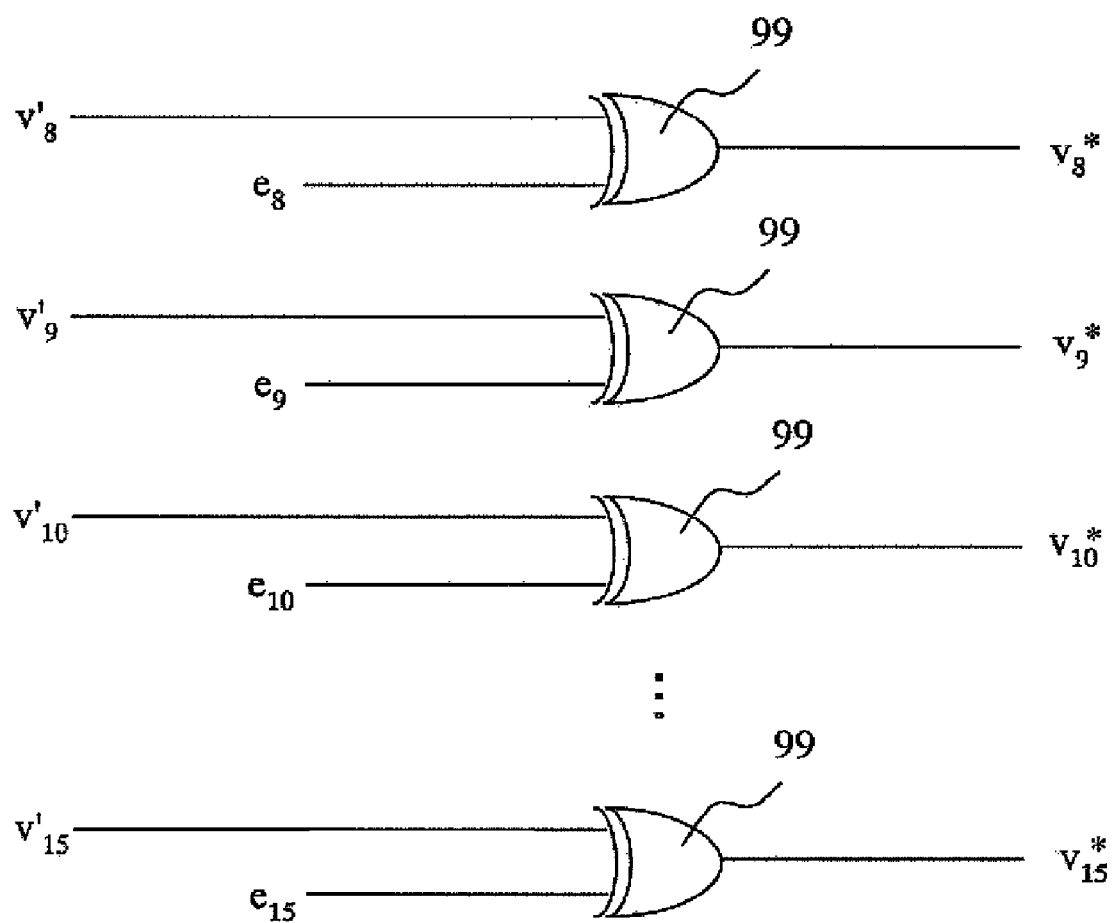
FIG. 24 is a configuration diagram illustrating an inverting circuit for 1 byte as one example of an inverting circuit for the (90,64) $[4_{1/8}EC]_2$ code shown in FIG. 3.

For example, the inverting circuit 10 concretely constructed for the first byte, is shown in FIG. 24. The inverting circuit 10 shown in FIG. 24 is a circuit that inverts the received bit value on the bit position where an error location is concretely indicated to correct the received word (V') 32. In FIG.

24, $v_8'$ to $v_{15}'$ are 8 bits corresponding to the first byte of the received word (V') 32, and $v_8^*$ to $v_{15}^*$ are the output bits after correction.

The inverting circuit 10 comprises a plurality of exclusive logical sum circuits. In the inverting circuit 10 in the first byte shown in FIG. 24, eight exclusive logical sum circuits 99 in total, obtain exclusive logical sum of corresponding bit error pointers $e_i$ (i=8, 9, . . . , 15) for the 8 bits input $v_8'$ to $v_{15}'$, and for example, when the bit error pointer is "1", the value of the input bit is inverted and corrected.

In order to correspond to each bytes respectively, for the received word (V') of N=90 bits, 90 exclusive logical sum circuits are necessary for the inverting circuit 10. Finally, the inverting circuit 10 obtains the corrected word D* of 64 bits shown in the following Expression 56 from the received word (V') of N=90 bits.

$$D^* = (v_0^* v_1^* \ldots v_{57}^* v_{58}^* v_{60}^* v_{64}^* v_{66}^* v_{72}^* v_{74}^*) \quad \text{[Expression 56]}$$

The above explains the concrete constitutions of the encoding circuit and the decoding circuit for the error control code for controlling multiple spotty-byte errors within a byte occurred in a limited number of bytes by exemplifying the $[4_{1/8}EC]_2$ code having code parameters such as b=8, t=1, $\mu_1 = \mu_2 = 4$, $p_1 = p_2 = 2$ shown in FIG. 3. In the parallel decoding circuit 8 over GF($2^r$), for example, when the sequential decoding that uses the Berlekamp-Massey method is carried out, the existing methods which obtain error position and error according to error locator polynomial expression and error evaluation polynomial expression, may be used. The means for realizing the methods may be hardware or software.

It is possible to construct the encoding circuit and the decoding circuit for the error control code for controlling multiple spotty-byte errors within a byte occurred in a limited number of bytes which has code parameters other than the above ones according to the following concept.

First, the encoding circuit should generate R bits check information by means of a binary parity check matrix, and can be constructed same as the above.

Further, with respect to decoding, as mentioned above, in the error e' over GF($2^r$) obtained by decoding the $p_1$ correction $p_2$ detection RS code, H" is decoded for each byte and the miscorrection determination is carried out, thereby it is possible to obtain the error over GF($2^b$) and similarly construct the decoding circuit.

It is possible to construct the encoding circuit and the decoding circuit for the lengthened error control code for controlling multiple spotty-byte errors within a byte occurred in a limited number of bytes which is expressed by the parity check matrix shown in the Expression 5 according to the following concept.

First, the encoding circuit should generate R bits check information by means of a binary parity check matrix, and can be constructed same as the above.

Further, with respect to decoding, decoding is possible same as the above by decoding the $p_1$ correction $p_2$ detection RS code over GF($2^{r'}$) by means of the parallel decoding method or the sequential decoding method using the Berlekamp-Massey method, and furthermore, converting the error over GF($2^{r'}$) into the error over GF($2^b$) similarly to the above example.

Therefore, it is clear that the decoding circuit can be constructed similarly by changing the parallel decoding circuit 8 over GF($2^r$) of the above example into a circuit which carries out parallel decoding over GF($2^{r'}$), and furthermore, changing r bits of the error vector generating circuit 9 over GF($2^b$) of the above example into r' bits.

It is possible to construct the encoding circuit and the decoding circuit for the error control code for controlling multiple spotty-byte errors within a byte occurred in a limited number of bytes with byte error detection function which is expressed by the parity check matrix shown in the Expressions 25 and 28 according to the following concept.

First, the encoding circuit should generate R bits check information by means of a binary parity check matrix, and can be constructed same as the above.

Further, with respect to decoding, as mentioned above, after the syndrome is calculated, since H" is such that plural columns whose number is larger than or equal to either smaller one of $\lfloor (\mu_1 + \mu_2)/2 \rfloor t$ and b are linearly independent, when $S_I \neq 0$ and $S_{II} = S_{III} = S_{IV} = 0$, a detection is carried out as the case where a byte error is occurred. In addition, in the error e' over GF($2^r$) obtained by decoding the $p_1$ correction $p_2$ detection RS code as mentioned above, when the number of erroneous bytes is 1 and the hamming weight of $S_I$ is larger than $\mu_1 t$, a detection is carried out as the case where a byte error is occurred, so that the decoding can be carried out similarly.

Therefore, when a syndrome other than $S_I$ is newly input into the H" multiplication circuit in the above example and $S_I \neq 0$ and the syndrome other than $S_I$ is 0, the decoding circuit outputs a detection signal. Further, $S_I$ is newly input into the error vector generating circuit over GF($2^b$), the error vector generating circuit over GF($2^b$) checks whether the number of erroneous bytes is 1 in the error e' over GF($2^r$) or not, and the sorting circuit checks whether the Hamming weight of $S_I$ is larger than $\mu_1 t$ or not, so that the decoding circuit can be clearly constructed similarly.

As described above, in the present invention, with respect to spotty-byte errors having errors up to t bits within a byte, a general code constitution of the error control code for controlling multiple spotty-byte errors within a byte occurred in a limited number of bytes with the capability for correcting $\mu_1$ spotty-byte errors occurred in $p_1$ bytes and detecting $\mu_2$ spotty-byte errors occurred in $p_2$ bytes, is given. Further, the concrete constitutions of the encoding circuit and the decoding circuit as the circuits which can realize correction and detection of error, are shown in the present invention, and the present invention also shows that the check information can be generated and errors can be concretely corrected and detected.

Further, when t=1, the error control code for controlling multiple spotty-byte errors within a byte occurred in a limited number of bytes according to the present invention, becomes a code for correcting and detecting random bit errors occurred in a limited number of bytes with the capability for controlling random bit errors occurred in a limited number of bytes.

Further, in the present invention, a general code constitution of the error control code for controlling multiple spotty-byte errors within a byte occurred in a limited number of bytes with the function of detecting single-byte error exceeding the correction capability, is given, and the concrete constitutions of the encoding circuit and the decoding circuit as the circuits which can correct and detect the errors are shown, so that the check information can be generated and the errors can be corrected and detected.

The above explanation refers to the applications of the present invention mainly to memory systems, but the present invention is not limited to them, and for example, the present invention can be applied to general information systems or the like which are composed of such circuits, module and device physically independent by byte and where the limited number of errors are likely occurred. Further, the present invention can be applied also to a circuit, a device or a system for communication and transmission such as an optical communication circuit and a bus line circuit.

It goes without saying that the object of the present invention is realized by that a storage medium in which program codes of software for realizing the functions of the apparatus for correcting and detecting multiple spotty-byte errors within a byte occurred in a limited number of bytes according to the embodiment, is supplied to a system or a device, and the computer (or CPU or MPU) of the system or the device reads and executes the program code stored in the storage medium.

In this case, the program code itself read from the storage medium realizes the function of the embodiment, and the storage medium which stores the program code therein and the program code compose the present invention. As the storage medium for supplying the program code, ROM, flexible disc, hard disc, optical disc, magneto-optical disc, CD-ROM, CD-R, magnetic tape, involatile memory card and the like can be used.

The program code read by the computer is executed so that the function in this embodiment is realized. Furthermore, OS or the like which operates on the computer executes a part or all the actual processes based on instructions of the program code, so that the function in this embodiment is realized by this process.

INDUSTRIAL APPLICABILITY

As described above, in the method and apparatus for correcting and detecting multiple spotty-byte errors within a byte occurred in a limited number of bytes according to the present invention, the transmitted word which is obtained by adding check information generated based on the parity check matrix expressing the code and the input information data to the input information data, generates a syndrome based on the parity check matrix for the received word which likely has errors occurred in the information transmission channel, and the errors in the received word are corrected and detected based on the syndrome. For this reason, the error control code for controlling multiple spotty-byte errors within a byte occurred in a limited number of bytes with the function of correcting and detecting an arbitrary number of multiple spotty-byte errors within a byte occurred in an arbitrary limited number of bytes (the tendency of errors is investigated and a designer can arbitrarily determine the number of the bytes and the number of the spotty-byte errors), can be realized for the spotty-byte errors as up to t-bit errors including single-bit error, double-bit error and triple-bit error within a byte.

As a result, it is possible to treat the constitution of the parity check matrix which is the code for detecting and correcting errors and processing procedure of the decoding in a unified manner, and have no necessity to correspond error occurrence situation, and thus the parity check matrix H and the decoding procedure can be treated in a unified manner by just arbitrarily setting t value, b value, $p_1$ value, $p_2$ value, $\mu_1$ value and 2 value in the code function of the present invention, thereby providing the code function which can flexibly correspond the error occurrence situation.

Furthermore, when the integer-bit length t shorter than the byte length as b bits is selected, the number of the check bits can be reduced more significantly than the conventional byte error control code (corresponding to t=b). As a result, the proportion of the check bit number to the code length is reduced, and thus the encoding rate can be not ably improved, thereby realizing data transmission with high efficiency and high reliability.

In other word, according to the method and apparatus for correcting and detecting multiple spotty-byte errors within a byte occurred in a limited number of bytes of the present invention which has a superior function of "controlling multiple spotty-byte errors within multiple bytes occurred in the limited number of bytes" that does not exist in the conventional encoding technique, the number of check bits is reduced and the encoding rate can be improved further than the conventional multiple bytes error control code by means of the Reed-Solomon code. Further, particularly, when t=1, the number of the check bits is reduced and the encoding rate can be improved further than the conventional multiple bits error control code by means of a BCH code. Furthermore, the code function that can flexibly correspond the bit error occurrence situation, can be provided.

THE LIST OF REFERENCES

Patent Document 1:
Japanese Patent Application Laid-Open No. 2004-7217
Patent Document 2:
Japanese Patent Application No. 2003-416978
Patent Document 3:
Japanese Patent Application No. 2004-239392
Patent Document 4:
Japanese Patent Application No. 2004-287810
Patent Document 5:
Japanese Patent Application Laid-Open No. 2002-374175
Non-patent Document 1:
"A General Class of Maximal Codes for Computer Applications" written by S. J. Hong and A M. Patel, IEEE Transactions on Computers, Vol. C-21, No. 12, pp. 1322-1331, 1972
Non-patent Document 2:
"Odd-Weight-Column b-Adjacent Error Correcting Codes" written by E. Fujiwara, Transactions of the IECE Japan, Vol. E61, No. 10, pp. 781-787, 1978
Non-patent Document 3:
"Single Byte Error correcting-Double Byte Error Detecting Codes for Memory Systems" written by S. Kaneda and E. Fujiwara, IEEE Transactions on Computers, Vol. C-31, No. 7, pp. 596-602, July
Non-patent Document 4:
"Fault-Tolerant Memory Design in the IBM Application System/400™" written by C. L. Chen and L. E. Grosbach, Proceedings of Annual International Symposium on Fault-Tolerant Computing, pp. 393-400, June 1991
Non-patent Document 5:
"A class of Odd-Weight-Column SEC-DED-$S_b$ED Codes for Memory System Applications" written by S. Kaneda, IEEE Transactions on Computers, Vol. C-33, No. 8, pp. 737-739, August 1984
Non-patent Document 6:
"Error Control Coding for Computer Systems" written by T. R. N. Rao and Eiji Fujiwara, Prentice-Hall, 1989
Non-patent Document 7:
"Single b-Bit Byte Error Correcting and Double Bit Error Detecting Codes for Memory Systems" written by E. Fujiwara and M. Hamada, IEICE Transactions on Fundamentals, Vol. E76-A, No. 9, pp. 1442-1448, September 1993
Non-patent Document 8:
"A Class of Error Control Codes for Byte Organized Memory Systems—$S_b$EC-($S_b$+S)ED Codes—" written by M. Hamada and E. Fujiwara, IEEE Transactions on Computers, Vol. 46, No. 1, pp. 105-109, January 1997

Non-patent Document 9:
"Random Double Bit Error Correcting—Single Byte Error Correcting (DEC-S$_b$EC) Codes for Memory Systems" written by G. Umanesan and E. Fujiwara, IEICE Transactions on Fundamentals, Vol. E85-A, No. 1, pp. 273-276, January 2002

Non-patent Document 10:
"A Class of Codes for Correcting Single Spotty Byte Errors" written by G. Umanesan and E. Fujiwara, IEICE Transactions on Fundamentals, Vol. E86-A, No. 3, pp. 704-714, March 2003

Non-patent Document 11:
"One Constitution Method for Error Correcting Codes to be Easily Decoded" written by Hideki Imai and Hiroshi Fujiya, IEICE Transaction, 1979

Non-patent Document 12:
"Reed-Solomon Codes and Their Applications" written by S. B. Wicker and V. K. Bhargava, IEEE Press, 1994

Non-patent Document 13:
"The minimal Test Set for Multioutput Threshold Circuits Implemented as Sorting Networks" written by S. J. Piestrak, IEEE Transactions on Computers), Vol. 42, No. 6, pp. 700-712, June

What is claimed is:

1. An apparatus for correcting and detecting multiple spotty-byte errors within a byte occurred in a limited number of bytes, comprising:

an encoding means for generating a transmitted word based on input information data; and a decoding means for inputting said transmitted word where errors occurred in an information transmission channel as a received word and correcting and detecting said errors, wherein said encoding means generates said transmission word by adding check information generated based on a parity check matrix expressing a spotty-byte error control code and said input information data to said input information data, said decoding means comprises a syndrome generating means for generating a syndrome of said received word based on said parity check matrix; and an error correction means for correcting and detecting said errors in said received word based on said syndrome generated by said syndrome generating means, when said input information data is composed of multiple bytes, where b bits (b is an integer that is 2 or more.) is called a byte, errors up to t bits ($1 \leq t \leq b$) within a byte is called a spotty-byte error, and errors in which a plurality of said spotty-byte errors occurred within a byte is called multiple spotty-byte errors within a byte, said spotty-byte error control code expressed by said parity check matrix corrects $\mu_1$ spotty-byte errors occurred in $p_1$ bytes and detects 2 spotty-byte errors occurred in $p_2$ bytes, said value t, said value b, said value $p_1$, said value $p_2$, said value $\mu_1$ and said value $\mu_2$ are arbitrarily set, where $p_1 \leq p_2$ and $\mu_1 \leq \mu_2$ hold.

2. An apparatus for correcting and detecting multiple spotty-byte errors within a byte occurred in a limited number of bytes according to claim 1, wherein said parity check matrix is the following matrix H having R rows and N columns which is used for a lengthened error control code for controlling multiple spotty-byte errors within a byte occurred in a limited number of bytes with a function for correcting $\mu_1$ spotty-byte errors occurred in $p_1$ bytes and detecting $\mu_2$ spotty-byte errors occurred in $p_2$ bytes (lengthened $[\mu_1 t/bEC]_{p_1}$-$[\mu_2 t/bED]_{p_2}$ code), $$H = \begin{bmatrix} H' & H' & \cdots & H' & \cdots & H' & H' & O_{q \times r'} \\ \gamma^0 H'' & \gamma^1 H'' & \cdots & \gamma^i H'' & \cdots & \gamma^{n-1} H'' & O_{r' \times b} & O_{r' \times r'} \\ \gamma^0 H'' & \gamma^2 H'' & \cdots & \gamma^{2i} H'' & \cdots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' & O_{r' \times b} & I_{r'} \end{bmatrix}$$

where $r' \geq r$, $R = q + (p_1 + p_2 - 1)r'$, $N = b(n+1) + r'$, $0 \leq i \leq n-1$ and $n = 2^{r'} - 1$ hold, $I_{r'}$ is an r' by r' identity matrix, O is a zero matrix, said matrix H' is a binary matrix of q rows and b columns ($q \leq b$) composed of a q-dimensional column vector $h_j'$ ($0 \leq j \leq b-1$) shown in $H' = [h_0', h_1', \ldots, h_{b-1}']$, plural columns whose number is larger than or equal to either smaller one of $(\mu_1 + \mu_2)t$ and b are linearly independent, if $(\mu_1 + \mu_2)t \geq b$, said matrix H' is a nonsingular matrix including an identity matrix, if $(\mu_1 + \mu_2)t < b$, said matrix H' is equal to a check matrix of a code having a minimum Hamming distance $(\mu_1 + \mu_2)t + 1$, namely, a parity check matrix of a (b,b−q) code with a function for detecting $(\mu_1 + \mu_2)t$ bits error, said matrix H'' is a binary matrix of r rows and b columns ($r \leq b$) composed of an r-dimensional column vector $h_j''$ ($0 \leq j \leq b-1$) shown in $H'' = [h_0'', h_1'', \ldots, h_{b-1}'']$, plural columns whose number is larger than or equal to either smaller one of $\lfloor (\mu_1 + \mu_2)/2 \rfloor t$ and b are linearly independent, $\lfloor x \rfloor$ represents a maximum integer which does not exceed x, if $\lfloor (\mu_1 + \mu_2)/2 \rfloor t \geq b$, said matrix H'' is a nonsingular matrix including an identity matrix, if $\lfloor (\mu_1 + \mu_2)/2 \rfloor t < b$, said matrix H'' is equal to a check matrix of a code having a minimum Hamming distance $\lfloor (\mu_1 + \mu_2)/2 \rfloor t + 1$, namely, a parity check matrix of a (b,b−r) code with a function for detecting $\lfloor (\mu_1 + \mu_2)/2 \rfloor t$ bits error, $\gamma$ is a primitive element of an r'-th degree extension field $GF(2^{r'})$ of GF(2), $\gamma^i H'' = [\gamma^i \Phi (h_0''), \gamma^i \Phi(h_1''), \ldots, \gamma^i \Phi(h_{b-1}'')]$ holds, $\Phi$ is an injective homomorphism from $GF(2^r)$ to $GF(2^{r'})$ under addition, namely, $\Phi: GF(2^r) \rightarrow GF(2^{r'})$.

3. An apparatus for correcting and detecting multiple spotty-byte errors within a byte occurred in a limited number of bytes according to claim 1, wherein said parity check matrix is the following matrix H having R rows and N columns which is used for an error control code for controlling multiple spotty-byte errors within a byte occurred in a limited number of bytes with a function for correcting $\mu_1$ spotty-byte errors occurred in $p_1$ bytes, and detecting $\mu_2$ spotty-byte errors occurred in $p_2$ bytes and single-byte error exceeding correction capability ($[\mu_1 t/bEC]_{p_1}$-$[\mu_2 t/bED]_{p_2}$-$S_b$ED code), $$H = \begin{bmatrix} I_b & I_b & \cdots & I_b & \cdots & I_b \\ \gamma^0 H'' & \gamma^1 H'' & \cdots & \gamma^i H'' & \cdots & \gamma^{n-1} H'' \\ \gamma^0 H'' & \gamma^2 H'' & \cdots & \gamma^{2i} H'' & \cdots & \gamma^{2(n-1)} H'' \\ \vdots & \vdots & \ddots & \vdots & \ddots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' \end{bmatrix}$$

where $R=b+(p_1+p_2-1)r$, $N=bn$, $0 \leq i \leq n-1$ and $n=2^r-1$ hold, $I_b$ is a b by b identity matrix, said matrix H" is a binary matrix of r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t + 1$, namely, a parity check matrix of a (b,b−r) code with a function for detecting $\lfloor (\mu_1+\mu_2)/2 \rfloor t$ bits error, γ is a primitive element of an r-th degree extension field $GF(2^r)$ of $GF(2)$, and $\gamma^i H'' = [\gamma^i h_0'', \gamma^i h_1'', \ldots, \gamma^i h_{b-1}'']$ holds.

4. An apparatus for correcting and detecting multiple spotty-byte errors within a byte occurred in a limited number of bytes according to claim 1, wherein
said parity check matrix is the following matrix H having R rows and N columns which is used for a lengthened error control code for controlling multiple spotty-byte errors within a byte occurred in a limited number of bytes with a function for correcting $\mu_1$ spotty-byte errors occurred in $p_1$ bytes, and detecting $\mu_2$ spotty-byte errors occurred in $p_2$ bytes and single-byte error exceeding correction capability (lengthened $[\mu_1 t/bEC]_{p_1}$-$[\mu_2 t/bED]_{p_2}$-$S_b ED$ code), $$H = \begin{bmatrix} I_b & I_b & \cdots & I_b & \cdots & I_b & I_b & O_{q \times r'} \\ \gamma^0 H'' & \gamma^1 H'' & \cdots & \gamma^i H'' & \cdots & \gamma^{n-1} H'' & O_{r' \times b} & O_{r' \times r'} \\ \gamma^0 H'' & \gamma^2 H'' & \cdots & \gamma^{2i} H'' & \cdots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' & O_{r' \times b} & I_{r'} \end{bmatrix}$$

where $r' \geq r$, $R=b+(p_1+p_2-1)r'$, $N=b(n+1)+r'$, $0 \leq i \leq n-1$ and $n=2^{r'}-1$ hold, $I_b$ is a b by b identity matrix, $I_{r'}$ is an r' by r' identity matrix, O is a zero matrix, said matrix H" is a binary matrix of r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of t and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t + 1$, namely, a parity check matrix of a (b,b−r) code with a function for detecting $\lfloor (\mu_1+\mu_2)/2 \rfloor t$ bits error, γ is a primitive element of an r'-th degree extension field $GF(2^{r'})$ of $GF(2)$, $\gamma^i H'' = [\gamma^i \Phi(h_0''), \gamma^i \Phi(h_1''), \ldots, \gamma^i \Phi(h_{b-1}'')]$ holds, Φ is an injective homomorphism from $GF(2^r)$ to $GF(2^{r'})$ under addition, namely, $\Phi: GF(2^r) \overset{3}{\rightarrow} GF(2^{r'})$.

5. An apparatus for correcting and detecting multiple spotty-byte errors within a byte occurred in a limited number of bytes according to claim 1, wherein
said parity check matrix is the following matrix H having R rows and N columns which is used for an error control code for controlling multiple spotty-byte errors within a byte occurred in a limited number of bytes with a function for correcting $\mu_1$ spotty-byte errors occurred in $p_1$ bytes and detecting $\mu_2$ spotty-byte errors occurred in $p_2$ bytes ($[\mu_1 t/bEC]_{p_1}$-$[\mu_2 t/bED]_{p_2}$ code), $$H = \begin{bmatrix} H' & H' & \cdots & H' & \cdots & H' \\ \gamma^0 H'' & \gamma^1 H'' & \cdots & \gamma^i H'' & \cdots & \gamma^{n-1} H'' \\ \gamma^0 H'' & \gamma^2 H'' & \cdots & \gamma^{2i} H'' & \cdots & \gamma^{2(n-1)} H'' \\ \vdots & \vdots & \ddots & \vdots & \ddots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' \end{bmatrix}$$

where $R=q+(p_1+p_2-1)r$, $N=bn$, $0 \leq i \leq n-1$ and $n=2^r-1$ hold, said matrix H' is a binary matrix of q rows and b columns ($q \leq b$) composed of a q-dimensional column vector $h_j'$ ($0 \leq j \leq b-1$) shown in $H'=[h_0', h_1', \ldots, h_{b-1}']$, plural columns whose number is larger than or equal to either smaller one of $(\mu_1+\mu_2)t$ and b are linearly independent, if $(\mu_1+\mu_2)t \geq b$, said matrix H' is a nonsingular matrix including an identity matrix, if $(\mu_1+\mu_2)t < b$, said matrix H' is equal to a check matrix of a code having a minimum Hamming distance $(\mu_1+\mu_2)t + 1$, namely, a parity check matrix of a (b,b−q) code with a function for detecting $(\mu_1+\mu_2)t$ bits error, said matrix H" is a binary matrix having r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t + 1$, namely, a parity check matrix of a (b,b−r) code with a function for detecting $\lfloor (\mu_1+\mu_2)/2 \rfloor t$ bits error, γ is a primitive element of an r-th degree extension field $GF(2^r)$ of $GF(2)$, and $\gamma^i H'' = [\gamma^i h_0'', \gamma^i h_1'', \ldots, \gamma^i h_{b-1}'']$ holds.

6. An apparatus for correcting and detecting multiple spotty-byte errors within a byte occurred in a limited number of bytes according to any one of claims 2 or 3 or 4 or 5, wherein
said error correction means generates a bit-error pointer for detecting which bit of said received word has an error based on said syndrome, and corrects said error in said received word by inverting bit value of said received word corresponding to error bits based on said generated bit-error pointer, and when detecting that bit error of said received word cannot be corrected, said error correction means outputs an uncorrectable error detection signal, said error correction means comprises
an H' decoding means;
an H" multiplication means;
a parallel decoding means over $GF(2^r)$;
an error vector generating means over $GF(2)$; and
an inverting means.

7. An apparatus for correcting and detecting multiple spotty-byte errors within a byte occurred in a limited number of bytes according to claim 6, wherein said H' decoding means generates a byte-by-byte sum of errors ($e_A$) based on upper q bits on said syndrome generated by said syndrome generating means, said H" multiplication means generates a product of said byte-by-byte sum of errors ($e_A$) and a transposed matrix of H" based on said byte-by-byte sum of errors ($e_A$) generated by said H' decoding means, said parallel decoding means over $GF(2^r)$ generates
a bit-error pointer over $GF(2^r)$ and a first uncorrectable error detection signal which is output when error correction is regarded as impossible in parallel decoding over $GF(2^r)$, based on said product of said byte-by-byte sum of errors ($e_A$) and a transposed matrix of H" which is generated by said H" multiplication means, and residual lower bits excluding said upper q bits on said syndrome generated by said syndrome generating means, said error vector generating means over $GF(2^b)$ generates
a bit-error pointer on ($2^b$) and a second uncorrectable error detection signal which is output when error correction is regarded as impossible, based on said byte-by-byte sum of errors ($e_A$) generated by said H' decoding means and said bit-error-pointer over $GF(2^r)$ generated by said parallel decoding means over $GF(2^r)$, said inverting means corrects said error in said received word by inverting bit value of said received word corresponding to said bit-error pointer over $GF(2^b)$ based on said bit-error pointer over $GF(2^b)$ generated by said error vector generating means over $GF(2^b)$.

8. An apparatus for correcting and detecting multiple spotty-byte errors within a byte occurred in a limited number of bytes according to claim 7, wherein said error correction means outputs a third uncorrectable error detection signal representing that an error exceeding correction capability is detected by obtaining logical OR of said first uncorrectable error detection signal generated by said parallel decoding means over $GF(2^r)$ and said second uncorrectable error detection signal generated by said error vector generating means over $GF(2^b)$.

9. An apparatus for correcting and detecting multiple spotty-byte errors within a byte occurred in a limited number of bytes according to claim 7, wherein said error vector generating means over $GF(2^b)$ comprises a plurality of t-bit error correction decoding means, a multi-input sorting means and a plurality of miscorrection determining means in i-th byte, said t-bit error correction decoding means outputs a detection signal in i-th byte and 1 byte of a bit-error pointer (ê) produced by the decoder from 1 byte of said bit-error pointer (e') over $GF(2^r)$, said multi-input sorting means outputs 1 from upper bits of outputs continuously only as for the number of weights of said plural detection signals in i-th byte which were input, said miscorrection determining means in i-th byte carries out a miscorrection determination and outputs 1 byte of said bit-error pointer (e) over $GF(2^b)$.

10. An apparatus for correcting and detecting multiple spotty-byte errors within a byte occurred in a limited number of bytes according to claim 7, wherein said error vector generating means over $GF(2^b)$ comprises a plurality of t-bit error correction decoding means, a multi-input sorting means and a plurality of miscorrection determining means in i-th byte, said t-bit error correction decoding means is a means which inputs predetermined 1 byte of said bit-error pointer (e') over $GF(2^r)$ and outputs 1 byte of a bit-error pointer (ê) produced by the decoder corresponding to said predetermined 1 byte to said miscorrection determining means in i-th byte, and outputs a detection signal in i-th byte that is a signal for detecting an error exceeding correction capability to said multi-input sorting means and said miscorrection determining means in i-th byte, said multi-input sorting means is a means which counts the number of weights (the number of "1") of said plural detection signals in i-th byte which were input and outputs 1 from upper bits of outputs continuously only as for the number of weights, said miscorrection determining means in i-th byte is a means which inputs said bit-error pointers (ê) produced by the decoder that were output from said t-bit error correction decoding means of all bytes, said detection signal in i-th byte and said byte-by-byte sum of errors ($e_A$), carries out a miscorrection determination and outputs 1 byte of said bit-error pointer (e) over $GF(2^b)$.

11. An apparatus for correcting and detecting multiple spotty-byte errors within a byte occurred in a limited number of bytes according to claim 9, wherein said error vector generating means over $GF(2^b)$
outputs an upper second bit signal of signals output from said multi-input sorting means as said second uncorrectable error detection signal, and collects signals output from said miscorrection determining means in i-th byte and outputs said bit-error-pointer over $GF(2^b)$ having the number of bits of code length.

12. An apparatus for correcting and detecting multiple spotty-byte errors within a byte occurred in a limited number of bytes according to claim 11, wherein said miscorrection determining means in i-th byte
carries out said miscorrection determination by the following miscorrection determination expression, $$w_M(\hat{e}_x + e_A) \leq \mu_1 - w_M(\hat{e}_x)$$

where $w_M(e)$ is defined by $$w_M(e) = \sum_{i=0}^{n-1} \left\lceil \frac{w_H(e_i)}{t} \right\rceil$$

and represents the number of spotty-byte errors, and $w_H(e_i)$ represents a Hamming weight over a Galois field GF(2) of a vector $e_i$, when said miscorrection determination expression holds, $e_x = \hat{e}_x$ and thus a determination is made that miscorrection is not carried out, and when said miscorrection determination expression does not hold, $e_x \neq \hat{e}_x$ and thus a determination is made that miscorrection is carried out.

13. An apparatus for correcting and detecting multiple spotty-byte errors within a byte occurred in a limited number of bytes according to claim 12, wherein with respect to said $[\mu_1 t/bEC]_{p_1}-[\mu_2 t/bED]_{p_2}-S_b ED$ code and said lengthened $[\mu_1 t/bEC]_{p_1}-[\mu_2 t/bED]_{p_2}-S_b ED$ code, said decoding means is constituted by that a syndrome other than $S_I$ is newly input into said H" multiplication means, and when $S_I \neq 0$ and said syndrome other than $S_I$ is 0, a detection signal is output, $S_I$ is newly input into said error vector generating means over $GF(2^b)$, said error vector generating means over $GF(2^b)$ checks whether the number of erroneous bytes is 1 in the error e' over $GF(2^r)$ or not, and said multi-input sorting means checks whether Hamming weight of $S_I$ is larger than $\mu_1 t$ or not.

14. A method for correcting and detecting multiple spotty-byte errors within a byte occurred in a limited number of bytes, comprising:

an encoding processing step of generating a transmitted word based on input information data; and a decoding processing step of inputting said transmitted word where errors occurred in an information transmission channel as a received word and correcting and detecting said errors, wherein in said encoding processing step, said transmitted word is generated by adding check information generated based on a parity check matrix expressing a spotty-byte error control code and said input information data to said input information data, said decoding processing step comprises a syndrome generating processing step of generating a syndrome of said received word based on said parity check matrix; and an error correction processing step of correcting and detecting said errors in said received word based on said syndrome generated by said syndrome generating processing step, when said input information data is composed of multiple bytes, where b bits (b is an integer that is 2 or more.) is called a byte, errors up to t bits ($1 \leq t \leq b$) within a byte is called a spotty-byte error, and errors in which a plurality of said spotty-byte errors occurred within a byte is called multiple spotty-byte errors within a byte, said spotty-byte error control code expressed by said parity check matrix corrects $\mu_1$ spotty-byte errors occurred in $p_1$ bytes and detects $\mu_2$ spotty-byte errors occurred in $p_2$ bytes, said value t, said value b, said value $p_1$, said value $p_2$, said value $\mu_1$ and said value $\mu_2$ are arbitrarily set, where $p_1 \leq p_2$ and $\mu_1 \leq \mu_2$ hold, said information transmission channel is any one of an information communication system, a memory system and a bus line circuit.

15. A method for correcting and detecting multiple spotty-byte errors within a byte occurred in a limited number of bytes according to claim 14, wherein said parity check matrix is the following matrix H having R rows and N columns which is used for an error control code for controlling multiple spotty-byte errors within a byte occurred in a limited number of bytes with a function for correcting $\mu_1$ spotty-byte errors occurred in $p_1$ bytes and detecting $\mu_2$ spotty-byte errors occurred in $p_2$ bytes ($[\mu_1 t/bEC]_{p_1}-[\mu_2 t/bED]_{p_2}$ code), $$H = \begin{bmatrix} H' & H' & \cdots & H' & \cdots & H' \\ \gamma^0 H'' & \gamma^1 H'' & \cdots & \gamma^i H'' & \cdots & \gamma^{n-1} H'' \\ \gamma^0 H'' & \gamma^2 H'' & \cdots & \gamma^{2i} H'' & \cdots & \gamma^{2(n-1)} H'' \\ \vdots & \vdots & \ddots & \vdots & \ddots & \vdots \\ \gamma^0 H'' & \gamma^{p_1+p_2-1} H'' & \cdots & \gamma^{(p_1+p_2-1)i} H'' & \cdots & \gamma^{(p_1+p_2-1)(n-1)} H'' \end{bmatrix}$$

where $R=q+(p_1+p_2-1)r$, $N=bn$, $0 \leq i \leq n-1$ and $n=2^r-1$ hold, said matrix H' is a binary matrix of q rows and b columns ($q \leq b$) composed of a q-dimensional column vector $h_j'$ ($0 \leq j \leq b-1$) shown in $H'=[h_0', h_1', \ldots, h_{b-1}']$, plural columns whose number is larger than or equal to either smaller one of $(\mu_1+\mu_2)t$ and b are linearly independent, if $(\mu_1+\mu_2)t \geq b$, said matrix H' is a nonsingular matrix including an identity matrix, if $(\mu_1+\mu_2)t<b$, said matrix H' is equal to a check matrix of a code having a minimum Hamming distance $(\mu_1+\mu_2)t+1$, namely, a parity check matrix of a (b,b−q) code with a function for detecting $(\mu_1+\mu_2)t$ bits error, said matrix H" is a binary matrix having r rows and b columns ($r \leq b$) composed of an r-dimensional column vector $h_j''$ ($0 \leq j \leq b-1$) shown in $H''=[h_0'', h_1'', \ldots, h_{b-1}'']$, plural columns whose number is larger than or equal to either smaller one of $\lfloor(\mu_1+\mu_2)/2\rfloor t$ and b are linearly independent, $\lfloor x \rfloor$ represents a maximum integer which does not exceed x, if $\lfloor(\mu_1+\mu_2)/2\rfloor t \geq b$, said matrix H" is a nonsingular matrix including an identity matrix, if $\lfloor(\mu_1+\mu_2)/2\rfloor t<b$, said matrix H" is equal to a check matrix of a code having a minimum Hamming distance $\lfloor(\mu_1+\mu_2)/2\rfloor t+1$, namely, a parity check matrix of a (b,b−r) code with a function for detecting $\lfloor(\mu_1+\mu_2)/2\rfloor t$ bits error, $\gamma$ is a primitive element of an r-th degree extension field $GF(2^r)$ of GF(2), and $\gamma^i H''=[\gamma^i H_0'', \gamma^i H_1'', \ldots, \gamma^i H_{b-1}'']$ holds.

16. A method for correcting and detecting multiple spotty-byte errors within a byte occurred in a limited number of bytes according to claim 14, wherein said parity check matrix is the following matrix H having R rows and N columns which is used for a lengthened error control code for controlling multiple spotty-byte errors within a byte occurred in a limited number of bytes with a function for correcting $\mu_1$ spotty-byte errors occurred in $p_1$ bytes and detecting $\mu_2$ spotty-byte errors occurred in $p_2$ bytes (lengthened $[\mu_1 t/bEC]_{p_1}-[\mu_2 t/bED]_{p_2}$ code), $$H = \begin{bmatrix} H' & H' & \ldots & H' & \ldots & H' & H' & O_{q \times r'} \\ \gamma^0 H'' & \gamma^1 H'' & \ldots & \gamma^i H'' & \ldots & \gamma^{n-1} H'' & O_{r' \times b} & O_{r' \times r'} \\ \gamma^0 H'' & \gamma^2 H'' & \ldots & \gamma^{2i} H'' & \ldots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' & O_{r' \times b} & I_{r'} \end{bmatrix}$$

where $r' \geq r$, $R = q + (p_1+p_2-1)r'$, $N = b(n+1)+r'$, $0 \leq i \leq n-1$ and $n = 2^{r'}-1$ hold, $I_{r'}$ is an r' by r' identity matrix, O is a zero matrix, said matrix H' is a binary matrix of q rows and b columns ($q \leq b$) composed of a q-dimensional column vector $h_j'$ ($0 \leq j \leq b-1$) shown in $H' = [h_0', h_1', \ldots, h_{b-1}']$, plural columns whose number is larger than or equal to either smaller one of $(\mu_1+\mu_2)t$ and b are linearly independent, if $(\mu_1+\mu_2)t \geq b$, said matrix H' is a nonsingular matrix including an identity matrix, if $(\mu_1+\mu_2)t < b$, said matrix H' is equal to a check matrix of a code having a minimum Hamming distance $(\mu_1+\mu_2)t+1$, namely, a parity check matrix of a (b,b−q) code with a function for detecting $(\mu_1+\mu_2)t$ bits error, said matrix H" is a binary matrix of r rows and b columns ($r \leq b$) composed of an r-dimensional column vector $h_j''$ ($0 \leq j \leq b-1$) shown in $H'' = [h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t+1$, namely, a parity check matrix of a (b,b−r) code with a function for detecting $\lfloor (\mu_1+\mu_2)/2 \rfloor t$ bits error, γ is a primitive element of an r'-th degree extension field $GF(2^{r'})$ of GF(2), $\gamma^i H'' = [\gamma^i \Phi(h_0''), \gamma^i \Phi(h_1''), \ldots, \gamma^i \Phi(h_{b-1}'')]$ holds, Φ is an injective homomorphism from $GF(2^r)$ to $GF(2^{r'})$ under addition, namely, $\Phi : GF(2^r) \overset{3}{\vee} GF(2^{r'})$.

17. A method for correcting and detecting multiple spotty-byte errors within a byte occurred in a limited number of bytes according to claim 14, wherein said parity check matrix is the following matrix H having R rows and N columns which is used for an error control code for controlling multiple spotty-byte errors within a byte occurred in a limited number of bytes with a function for correcting $\mu_1$ spotty-byte errors occurred in $p_1$ bytes, and detecting $\mu_2$ spotty-byte errors occurred in $p_2$ bytes and single-byte error exceeding correction capability ($[\mu_1 t/bEC]_{p_1} - [\mu_2 t/bED]_{p_2} - S_b ED$ code), $$H = \begin{bmatrix} I_b & I_b & \ldots & I_b & \ldots & I_b \\ \gamma^0 H'' & \gamma^1 H'' & \ldots & \gamma^i H'' & \ldots & \gamma^{n-1} H'' \\ \gamma^0 H'' & \gamma^2 H'' & \ldots & \gamma^{2i} H'' & \ldots & \gamma^{2(n-1)} H'' \\ \vdots & \vdots & \ddots & \vdots & \ddots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' \end{bmatrix}$$

where $R = b + (p_1+p_2-1)r$, $N = bn$, $0 \leq i \leq n-1$ and $n = 2^r - 1$ hold, $I_b$ is a b by b identity matrix, said matrix H" is a binary matrix of r rows and b columns ($r \leq b$) composed of an r-dimensional column vector $h_j''$ ($0 \leq j \leq b-1$) shown in $H'' = [h_0'', h_1'', \ldots, h_{b-1}'']$, plural columns whose number is larger than or equal to either smaller one of $\lfloor (\mu_1+\mu_2)/2 \rfloor t$ and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t+1$, namely, a parity check matrix of a (b,b−r) code with a function for detecting $\lfloor (\mu_1+\mu_2)/2 \rfloor t$ bits error, γ is a primitive element of an r-th degree extension field $GF(2^r)$ of GF(2), and $\gamma^i H'' = [\gamma^i h_0'', \gamma^i h_1'', \ldots, \gamma^i h_{b-1}'']$ holds.

18. A method for correcting and detecting multiple spotty-byte errors within a byte occurred in a limited number of bytes according to claim 14, wherein said parity check matrix is the following matrix H having R rows and N columns which is used for a lengthened error control code for controlling multiple spotty-byte errors within a byte occurred in a limited number of bytes with a function for correcting $\mu_1$ spotty-byte errors occurred in $p_1$ bytes, and detecting $\mu_2$ spotty-byte errors occurred in $p_2$ bytes and single-byte error exceeding correction capability (lengthened $[\mu_1 t/bEC]_{p_1} - [\mu_2 t/bED]_{p_2} - S_b ED$ code), $$H = \begin{bmatrix} I_b & I_b & \ldots & I_b & \ldots & I_b & I_b & O_{q \times r'} \\ \gamma^0 H'' & \gamma^1 H'' & \ldots & \gamma^i H'' & \ldots & \gamma^{n-1} H'' & O_{r' \times b} & O_{r' \times r'} \\ \gamma^0 H'' & \gamma^2 H'' & \ldots & \gamma^{2i} H'' & \ldots & \gamma^{2(n-1)} H'' & O_{r' \times b} & O_{r' \times r'} \\ \vdots & \vdots & \ddots & \vdots & \ddots & \vdots & \vdots & \vdots \\ \gamma^0 H'' & \gamma^{p_1+p_2-1} H'' & \ldots & \gamma^{(p_1+p_2-1)i} H'' & \ldots & \gamma^{(p_1+p_2-1)(n-1)} H'' & O_{r' \times b} & I_{r'} \end{bmatrix}$$

where $r' \geq r$, $R = b+(p_1+p_2-1)r'$, $N = b(n+1)+r'$, $0 \leq i \leq n-1$ and $n = 2r'-1$ hold, $I_b$ is a b by b identity matrix, $I_{r'}$ is an $r'$ by $r'$ identity matrix, O is a zero matrix, said matrix H" is a binary matrix of r rows and b columns ($r \leq b$) composed of an r-dimensional column vector $h_j"$ ($0 \leq j \leq b-1$) shown in $H" = [h_0", h_1", \ldots, h_{b-1}"]$, plural columns whose number is larger than or equal to either smaller one of t and b are linearly independent, $\lfloor x \rfloor$ represents a maximum integer which does not exceed x, if $\lfloor (\mu_1+\mu_2)/2 \rfloor t \geq b$, said matrix H" is a nonsingular matrix including an identity matrix, if $\lfloor (\mu_1+\mu_2)/2 \rfloor t < b$, said matrix H" is equal to a check matrix of a code having a minimum Hamming distance $\lfloor (\mu_1+\mu_2)/2 \rfloor t+1$, namely, a parity check matrix of a (b,b−r) code with a function for detecting $\lfloor (\mu_1+\mu_2)/2 \rfloor t$ bits error, $\gamma$ is a primitive element of an $r'$-th degree extension field $GF(2^{r'})$ of $GF(2)$, $\gamma^i H" = [\gamma^i \Phi(h_0"), \gamma^i \Phi(h_1"), \ldots, \gamma^i \Phi(h_{b-1}")]$ holds, $\Phi$ is an injective homomorphism from $GF(2^r)$ to $GF(2^{r'})$ under addition, namely, $\Phi: GF(2^r) \rightarrow GF(2^{r'})$.

\* \* \* \* \*